(12) United States Patent
Mori et al.

(10) Patent No.: US 10,829,641 B2
(45) Date of Patent: Nov. 10, 2020

(54) COLORING COMPOSITION, FILM, COLOR FILTER, PATTERN FORMING METHOD, METHOD FOR MANUFACTURING COLOR FILTER, SOLID IMAGE PICKUP ELEMENT, AND INFRARED SENSOR

(71) Applicant: FUJIFILM Corporation, Tokyo (JP)

(72) Inventors: Masahiro Mori, Haibara-gun (JP);
Kazuya Oota, Haibara-gun (JP);
Kazuto Shimada, Haibara-gun (JP);
Kyohei Arayama, Haibara-gun (JP);
Takuya Tsuruta, Haibara-gun (JP);
Hirotaka Takishita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/802,828

(22) Filed: Nov. 3, 2017

(65) Prior Publication Data
US 2018/0057690 A1    Mar. 1, 2018

Related U.S. Application Data

(63) Continuation of application No. PCT/JP2016/064562, filed on May 17, 2016.

(30) Foreign Application Priority Data

May 22, 2015  (JP) .................................. 2015-104487
Sep. 10, 2015  (JP) .................................. 2015-178269
Jan. 20, 2016  (JP) .................................. 2016-008717

(51) Int. Cl.
*G02B 5/20*    (2006.01)
*G03F 7/031*   (2006.01)
(Continued)

(52) U.S. Cl.
CPC .............. *C09B 57/007* (2013.01); *C09B 3/14* (2013.01); *C09B 23/00* (2013.01); *C09B 23/164* (2013.01);
(Continued)

(58) Field of Classification Search
CPC ........ G03F 7/0007; G03F 7/004; G03F 7/027; G03F 7/028; G03F 7/031; G03F 7/2002; G02B 5/208; G02B 5/223; H01L 27/14
(Continued)

(56) References Cited

U.S. PATENT DOCUMENTS 2,418,605 A     4/1947  Shepherd, Jr. et al.
5,368,991 A  *  11/1994 Uchikawa ............ G03F 7/0007
                                                    430/288.1
(Continued)

FOREIGN PATENT DOCUMENTS

CN    101233208 A    7/2008
CN    101688935 A    3/2010
(Continued)

OTHER PUBLICATIONS

Computer-generated translation of 2008-091535 (Apr. 2008) (Year: 2008).*
(Continued)

*Primary Examiner* — John A McPherson
(74) *Attorney, Agent, or Firm* — Birch, Stewart, Kolasch & Birch, LLP.

(57) ABSTRACT

Provided is a coloring composition with which a film capable of allowing transmission of infrared light in a state where noise generated from visible light is small can be formed. In addition, also provided are a film, a color filter, a pattern forming method, a method for manufacturing a color filter, a solid image pickup element, and an infrared sensor in which the coloring composition is used. The
(Continued)

coloring composition includes a coloring material that shields light in a visible range; and an infrared absorber. It is preferable that the coloring material that shields light in the visible range includes two or more chromatic colorants and that a combination of the two or more chromatic colorants forms black. Alternatively, it is preferable that the coloring material that shields light in the visible range includes an organic black colorant. It is preferable that the organic black colorant is at least one selected from the group consisting of a perylene compound and a bisbenzofuranone compound.

22 Claims, 1 Drawing Sheet

(51) Int. Cl.
C09B 57/00 (2006.01)
G02B 5/22 (2006.01)
C09B 3/14 (2006.01)
H01L 27/14 (2006.01)
C09B 47/04 (2006.01)
C09B 23/00 (2006.01)
G03F 7/004 (2006.01)
C09B 23/16 (2006.01)
G03F 7/00 (2006.01)
G03F 7/16 (2006.01)
G03F 7/20 (2006.01)
G03F 7/26 (2006.01)

(52) U.S. Cl.
CPC ............. *C09B 47/04* (2013.01); *C09B 57/00* (2013.01); *G02B 5/20* (2013.01); *G02B 5/208* (2013.01); *G02B 5/22* (2013.01); *G03F 7/004* (2013.01); *G03F 7/0007* (2013.01); *G03F 7/031* (2013.01); *G03F 7/16* (2013.01); *G03F 7/2002* (2013.01); *G03F 7/26* (2013.01); *H01L 27/14* (2013.01)

(58) Field of Classification Search
USPC .............................................. 430/7; 257/440
See application file for complete search history.

(56) References Cited

U.S. PATENT DOCUMENTS

| | | | |
|---|---|---|---|
| 10,578,966 B2 | 3/2020 | Takishita et al. | |
| 2003/0083201 A1 | 5/2003 | Kobayashi | |
| 2005/0254132 A1* | 11/2005 | Ali | G03B 21/625 359/619 |
| 2007/0045517 A1 | 3/2007 | Fukuyoshi et al. | |
| 2007/0109548 A1* | 5/2007 | Uchida | H01L 27/14621 356/456 |
| 2008/0091033 A1 | 4/2008 | Fujita et al. | |
| 2010/0234232 A1 | 9/2010 | Dairiki et al. | |
| 2010/0243970 A1 | 9/2010 | Toshimitsu et al. | |
| 2011/0012075 A1 | 1/2011 | Nii et al. | |
| 2011/0070407 A1 | 3/2011 | Kato et al. | |
| 2011/0195235 A1* | 8/2011 | Kato | C09B 57/004 428/195.1 |
| 2011/0294051 A1 | 12/2011 | Sultemeyer et al. | |
| 2014/0120473 A1 | 5/2014 | Aoyagi | |
| 2015/0260885 A1 | 9/2015 | Takishita et al. | |
| 2015/0293282 A1 | 10/2015 | Takishita et al. | |
| 2017/0010528 A1 | 1/2017 | Takishita et al. | |
| 2017/0137444 A1 | 5/2017 | Sasaki et al. | |
| 2018/0014543 A1 | 1/2018 | Kai et al. | |
| 2018/0179306 A1* | 6/2018 | Tone | C08F 20/28 |

FOREIGN PATENT DOCUMENTS

| | | |
|---|---|---|
| CN | 101855009 A | 10/2010 |
| CN | 101983200 A | 3/2011 |
| CN | 103597040 A | 2/2014 |
| CN | 107205396 A | 9/2017 |
| CN | 107533170 A | 1/2018 |
| EP | 2182396 A1 | 5/2010 |
| EP | 2272849 A1 | 1/2011 |
| EP | 3299422 A1 | 3/2018 |
| JP | 60-69602 A | 4/1985 |
| JP | 61-5203 A | 1/1986 |
| JP | 6-222211 A | 8/1994 |
| JP | 2000314807 A | 11/2000 |
| JP | 2003-60176 A | 2/2003 |
| JP | 2003-222719 A | 8/2003 |
| JP | 2006-343631 A | 12/2006 |
| JP | 2008009238 A | 1/2008 |
| JP | 2008-091535 A * | 4/2008 |
| JP | 2009-69822 A | 4/2009 |
| JP | 2009-263614 A | 11/2009 |
| JP | 2010-002704 * | 1/2010 |
| JP | 2010-90313 A | 4/2010 |
| JP | 2011-068731 A | 4/2011 |
| JP | 2013-77009 A | 4/2013 |
| JP | 2014-47302 A | 3/2014 |
| JP | 2014-130338 A | 7/2014 |
| KR | 10-2010-0066197 A | 6/2010 |
| TW | 201520689 A1 | 6/2015 |
| WO | WO 2006/003807 A1 | 1/2006 |
| WO | WO 2006/064731 A1 | 6/2006 |
| WO | WO 2012/091083 A1 | 7/2012 |
| WO | WO 2014/084147 A1 | 6/2014 |
| WO | WO 2014/103628 A1 | 7/2014 |
| WO | WO 2015/046178 A1 | 4/2015 |
| WO | WO 2015/166779 A1 | 11/2015 |
| WO | WO 2016/031810 A1 | 3/2016 |

OTHER PUBLICATIONS

Computer-generated translation of JP 2010-002704 (Jan. 2010). (Year: 2010).*
Korean Office Action, dated Feb. 18, 2019, for corresponding Korean Application No. 10-2017-7033458, with an English machine translation.
Japanese Office Action for Japanese Application No. 2017-520637, dated Sep. 18, 2018, with machine translation.
International Preliminary Report on Patentability and Written Opinion of the International Searching Authority (forms PCT/IB/373 and PCT/ISA/237), dated Nov. 28, 2017, for corresponding International Application No. PCT/JP2016/064562, with an English translation of the Written Opinion.
International Search Report (form PCT/ISA/210), dated Jul. 26, 2016, for corresponding International Application No. PCT/JP2016/064562, with an English translation.
Chinese Office Action and Search Report dated Nov. 19, 2018, for Chinese Application No. 201680028898.0, with English translation of the Chinese Office Action.
Extended European Search Report for Application No. 16799868.1, dated Jun. 22, 2018.
Han et al., "Thermal properties of carbon black aqueous nanofluids for solar absorption," Nanoscale Research Letters, vol. 6, Dec. 1, 2011, pp. 1-7.
Korean Office Action, dated Aug. 29, 2019, for Korean Application No. 10-2017-7033458, with an English translation.
Chinese Office Action and Search Report, dated Jul. 1, 2019, for Chinese Application No. 201680028898.0, with an English translation.
Chinese Office Action dated Jan. 10, 2020, for corresponding Chinese Patent Application No. 201680028898.0, with English translation.
Korean Office Action dated Dec. 30, 2019, for corresponding Korean Patent Application No. 10-2017-7033458, with English translation.

(56) References Cited

OTHER PUBLICATIONS

Taiwanese Office Action and Search Report, dated Nov. 6, 2019, for Taiwanese Application No. 105114639, with a partial English translation.
European Office Action, dated Apr. 16, 2020, for European Application No. 16799868.1.
Göl et al., "A first archetype of boron dipyrromethene-phthalocyanine pentad dye: design, synthesis, and photophysical and photochemical properties", Dalton Trans., 2014, vol. 43, pp. 7561-7569 (9 pages).
Taiwanese Office Action and Search Report, dated Mar. 30, 2020, for Taiwanese Application No. 105114639, with an English translation.
Advisory Action dated Sep. 10, 2018 in related U.S. Appl. No. 15/271,302.
Communication dated Jul. 11, 2017, issued by the Japanese Patent Office in counterpart Application No. 2016-515912.
Communication dated Jul. 24, 2017, from the Singapore Patent Office in counterpart Application No. 11201608040V.
English Translation of International Preliminary Report on Patentability and Written Opinion, dated Nov. 1, 2016, in International Application No. PCT/JP2015/061129, 10 pages in English.
Final Office Action dated Mar. 29, 2019 in related U.S. Appl. No. 15/271,302.
Final Office Action dated May 25, 2018 in related U.S. Appl. No. 15/271,302.
International Search Report for PCT/JP2015/061129 dated Jun. 16, 2015.
Non-Final Office Action dated Nov. 24, 2017 in related U.S. Appl. No. 15/271,302.
Non-Final Office Action dated Nov. 30, 2018 in related U.S. Appl. No. 15/271,302.
Notice of Allowance dated Sep. 25, 2019 in related U.S. Appl. No. 15/271,302.
Office Action dated Dec. 22, 2018, from the Taiwanese Intellectual Property Office in counterpart Taiwanese Application No. 104112299.
Office Action dated Feb. 9, 2018 from the Intellectual Property Office of Singapore in counterpart Singaporean Application No. 11201608040V.
Office Action dated May 16, 2018 from the Korean Intellectual Property Office in counterpart Korean Application No. 10-2016-7026657.
Office Action dated Nov. 28, 2018 from the Korean Intellectual Property Office in counterpart Korean Application No. 10-2016-7026657.
Office Action dated Oct. 10, 2019 in U.S. Appl. No. 15/802,828.
Restriction Requirement dated Aug. 14, 2017 in related U.S. Appl. No. 15/271,302.
Written Opinion for PCT/JP2015/061129 dated Jun. 16, 2015.
Chinese Office Action for corresponding Chinese Application No. 201680028898.0, dated May 6, 2020, with English translation.

\* cited by examiner

COLORING COMPOSITION, FILM, COLOR FILTER, PATTERN FORMING METHOD, METHOD FOR MANUFACTURING COLOR FILTER, SOLID IMAGE PICKUP ELEMENT, AND INFRARED SENSOR

CROSS-REFERENCE TO RELATED APPLICATIONS

This application is a Continuation of PCT International Application No. PCT/JP2016/064562 filed on May 17, 2016, which claims priority under 35 U.S.C § 119(a) to Japanese Patent Application No. 2015-104487 filed on May 22, 2015, Japanese Patent Application No. 2015-178269 filed on Sep. 10, 2015, and Japanese Patent Application No. 2016-008717 filed on Jan. 20, 2016. Each of the above application(s) is hereby expressly incorporated by reference, in its entirety, into the present application.

BACKGROUND OF THE INVENTION

1. Field of the Invention

The present invention relates to a coloring composition. In particular, the present invention relates to a coloring composition which is preferably used for manufacturing a color filter. Further, the present invention relates to a film, a color filter, a solid image pickup element, and an infrared sensor in which the coloring composition is used. In addition, the present invention relates to a pattern forming method and a method for manufacturing a color filter in which the coloring composition is used.

2. Description of the Related Art

A solid image pickup element is used as an optical sensor in various applications.

For example, infrared light is less likely to be scattered than visible light due to its longer wavelength and can be used in, for example, distance measurement or three-dimensional measurement. In addition, infrared light is invisible to humans or animals. Therefore, even in a case where an object is irradiated with infrared light using an infrared light source at night, the object cannot recognize the infrared light. Thus, infrared light can be used for imaging a nocturnal wild animal or imaging an object without provoking the object for security reasons. This way, an optical sensor (infrared sensor) that detects infrared light can be used in various applications, and the development of a film that can be used in an infrared sensor is desired.

JP2013-77009A discloses a coloring composition that includes pigments including at least one of an azo yellow pigment or an isoindoline yellow pigment and a dioxazine violet pigment.

JP2009-69822A discloses a light-shielding photosensitive resin composition including an alkali-soluble resin, a photopolymerization initiator, an ethylenically unsaturated compound, and a light-shielding component, in which organic pigments account for 95% or higher of the light-shielding component, and a combination of organic pigments selected from three or more groups among the following groups (a) to (f) is used as the organic pigments such that a standard deviation of a light transmittance of the composition in a wavelength range of 400 nm to 700 nm is 0.1% or lower.

(a) A red pigment selected from Pigment Red 177, 209, 224, and 254

(b) A blue pigment that is Pigment Blue 15:6

(c) A green pigment selected from Pigment Green 7 and 36

(d) A yellow pigment selected from Pigment Yellow 83, 138, 139, 150, and 180

(e) A violet pigment that is Pigment Violet 23

(f) An orange pigment selected from Pigment Orange 38 and 71

JP2014-130338A describes a composition in which, in a case where a film having a thickness of 1 μm is formed using the composition, a maximum value of a light transmittance of the film in a thickness direction in a wavelength range of 400 to 750 nm is 20% or lower, and a minimum value of a light transmittance of the film in the thickness direction in a wavelength range of 900 to 1300 nm is 90% or higher. In JP2014-130338A, pigments including a red pigment, a yellow pigment, a blue pigment, and a violet pigment are used.

JP2009-263614A describes a near infrared absorbing compound which has an absorption in the near infrared range and has excellent invisibility in a wavelength range of 400 to 700 nm without having an absorption in the wavelength range.

SUMMARY OF THE INVENTION

Recently, the development of an optical sensor or the like in which infrared light having a longer wavelength, for example, infrared light having a wavelength of 900 nm or longer is used as a light source has been considered.

However, it was found that, in a case where films which have been known until now such as the films described in JP2013-77009A, JP2009-69822A, and JP2014-130338A are applied to an optical sensor or the like in which infrared light having a wavelength of 900 nm or longer is used as a light source, noise is likely to be generated from visible light.

On the other hand, JP2009-263614A neither discloses nor implies a film capable of allowing transmission of infrared light in a state where noise generated from visible light is small.

Accordingly, an object of the present invention is to provide a coloring composition with which a film capable of allowing transmission of infrared light in a state where noise generated from visible light is small can be formed. In addition, another object of the present invention is to provide a film, a color filter, a pattern forming method, a method for manufacturing a color filter, a solid image pickup element, and an infrared sensor in which the coloring composition is used.

As a result of detailed investigation, the present inventors found that the above-described objects can be achieved by using a coloring composition including a coloring material that shields light in the visible range and an infrared absorber, thereby completing the present invention. That is, the present invention is as follows.

<1> A coloring composition comprising:
a coloring material that shields light in a visible range; and
an infrared absorber.

<2> The coloring composition according to <1>,
in which the coloring material that shields light in the visible range includes two or more chromatic colorants, and
a combination of the two or more chromatic colorants forms black.

<3> The coloring composition according to <1>,
in which the coloring material that shields light in the visible range includes an organic black colorant.

<4> The coloring composition according to <3>,
in which the organic black colorant is at least one selected from the group consisting of a perylene compound and a bisbenzofuranone compound.
<5> The coloring composition according to <4>, further comprising:
a chromatic colorant.
<6> The coloring composition according to <2> or <5>,
in which the chromatic colorant is selected from the group consisting of a red colorant, a green colorant, a blue colorant, a yellow colorant, a violet colorant, and an orange colorant.
<7> The coloring composition according to any one of <1> to <6>,
in which the infrared absorber is at least one selected from the group consisting of a pyrrolopyrrole compound, a phthalocyanine compound, a naphthalocyanine compound, and a polymethine compound.
<8> The coloring composition according to <7>,
wherein the pyrrolopyrrole compound is a pigment.
<9> The coloring composition according to <7> or <8>,
in which the pyrrolopyrrole compound is represented by the following Formula (1),

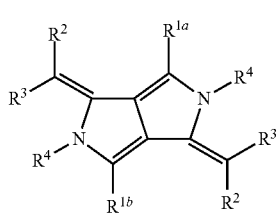

(1)

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.
<10> The coloring composition according to any one of <1> to <9>, further comprising:
a polymerizable compound.
<11> The coloring composition according to <10>, further comprising:
a photopolymerization initiator.
<12> The coloring composition according to any one of <1> to <11> which is used for manufacturing a color filter.
<13> A film which is formed by curing the coloring composition according to any one of <1> to <12>.
<14> A color filter comprising:
the film according to <13>.
<15> A pattern forming method comprising:
a step of forming a coloring composition layer on a support using the coloring composition according to any one of <1> to <12>;
a step of exposing the coloring composition layer in a pattern shape; and
a step of forming a colored pattern by removing a non-exposed portion by development.

<16> A method for manufacturing a color filter comprising:
the pattern forming method according to <15>.
<17> A solid image pickup element comprising:
the color filter according to <14>.
<18> An infrared sensor comprising:
the color filter according to <14>.
According to the present invention, a coloring composition can be provided with which a film capable of allowing transmission of infrared light in a state where noise generated from visible light is small can be formed. In addition, a film, a color filter, a pattern forming method, a method for manufacturing a color filter, a solid image pickup element, and an infrared sensor in which the coloring composition is used can be provided.

DESCRIPTION OF THE PREFERRED EMBODIMENTS

Figure 1:
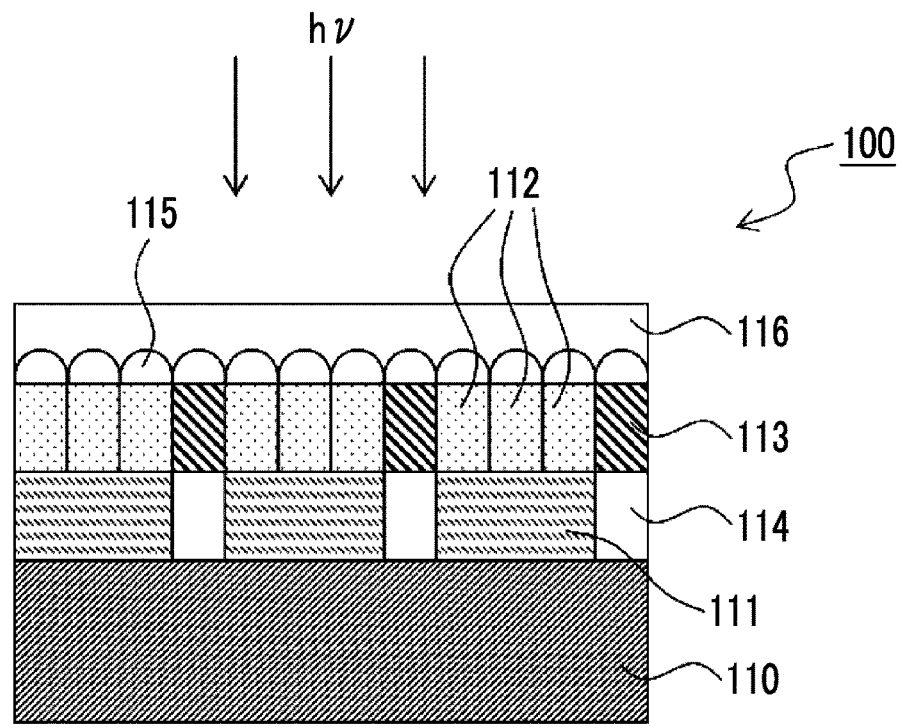
FIG. 1 is a schematic cross-sectional view showing a configuration of an embodiment of an infrared sensor according to the present invention.

In this specification, a total solid content denotes the total mass of components of a total composition of a coloring composition excluding a solvent. In addition, a solid content denotes a solid content at 25° C.
In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).
In this specification, "radiation" denotes, for example, a bright light spectrum of a mercury lamp, a far ultraviolet ray represented by excimer laser, an extreme ultraviolet ray (EUV ray), an X-ray, or an electron beam. In addition, in the present invention, "light" denotes an actinic ray or radiation.
In this specification, unless specified otherwise, "exposure" denotes not only exposure using a mercury lamp, a far ultraviolet ray represented by excimer laser, an X-ray, an EUV ray, or the like but also drawing using a corpuscular beam such as an electron beam or an ion beam.
In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.
In this specification, in a chemical formula, Me represents a methyl group, Et represents an ethyl group, Pr represents a propyl group, Bu represents a butyl group, and Ph represents a phenyl group.
In this specification, the term "step" denotes not only an individual step but also a step which is not clearly distinguishable from another step as long as an effect expected from the step can be achieved.
In this specification, a weight-average molecular weight and a number average molecular weight are defined as values in terms of polystyrene obtained by gel permeation chromatography (GPC). In this specification, an weight-average molecular weight (Mw) and a number average molecular weight (Mn) can be obtained by using HLC-8220

(manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

A pigment described in the present invention denotes an insoluble colorant compound which is not likely to dissolve in a solvent. Typically, a pigment denotes a colorant compound which is present in a state of being dispersed as particles in a composition. As the solvent described herein, for example, an arbitrary solvent can be used, and examples thereof are described in "Solvent" described below. It is preferable that the pigment used in the present invention has a solubility of 0.1 g/100 g Solvent or lower at 25° C., for example, both in propylene glycol monomethyl ether acetate and in water.

<Coloring Composition>

A coloring composition according to the present invention includes a coloring material that shields light in the visible range and an infrared absorber.

The coloring composition according to the present invention can also be referred to as an infrared light transmitting composition because it allows transmission of infrared light (preferably light having a wavelength of 900 nm or higher).

Hereinafter, each of components which can form the coloring composition according to the present invention will be described.

<<Infrared Absorber>>

The coloring composition according to the present invention includes an infrared absorber.

In the present invention, the infrared absorber denotes a compound having an absorption maximum in an infrared wavelength range (preferably a wavelength range of 800 to 1300 nm).

The infrared absorber is preferably a compound having an absorption maximum in a wavelength range of 800 to 900 nm.

As the infrared absorber, a pigment or a dye may be used, and a pigment is preferable because the coloring composition, with which a film having excellent heat resistance can be formed, is likely to be obtained. It is preferable that an average particle size (r) of the pigment satisfies preferably 20 nm≤r≤300 nm, more preferably 25 nm≤r≤250 nm, and still more preferably 30 nm≤r≤200 nm. In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

Examples of the infrared absorber include a pyrrolopyrrole compound, a copper compound, a cyanine compound, a phthalocyanine compound, an iminium compound, a thiol complex compound, a transition metal oxide compound, a squarylium compound, a naphthalocyanine compound, a quaterrylene compound, a dithiol metal complex compound, and a croconium compound.

As the phthalocyanine compound, the naphthalocyanine compound, the iminium compound, the cyanine compound, the squarylium compound, or the croconium compound, for example, one of the compounds described in paragraphs "0010" to "0081" of JP2010-111750A may be used, the content of which are incorporated in this specification. In addition the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

In the present invention, as the infrared absorber, a compound described in paragraphs "0004" to "0016" of JP1995-164729A (JP-H7-164729A), a compound described in paragraphs "0027" to "0062" of JP2002-146254A, or near infrared ray absorbing particles described in paragraphs "0034" to "0067" of JP2011-164583A which are formed of crystallites of an oxide including Cu and/or P and have a number average aggregated particle size of 5 to 200 nm may be used, the content of which is incorporated herein by reference. In addition, for example, FD-25 (manufactured by Yamada Chemical Co., Ltd.) or IRA842 (naphthalocyanine compound, manufactured by Exiton, Inc.) may be used.

In the present invention, it is preferable that the infrared absorber is at least one selected from the group consisting of a pyrrolopyrrole compound, a phthalocyanine compound, a naphthalocyanine compound, and a polymethine compound.

Examples of the polymethine compound depending on the kind of an atomic group to be bonded include a cyanine compound a merocyanine compound, a squarylium compound, a croconium compound, and an oxonol compound. Among these, a cyanine compound, a squarylium compound, or an oxonol compound is preferable, and a cyanine compound or a squarylium compound is more preferable.

In the present invention, the infrared absorber may be a pigment or a dye.

<<<Pyrrolopyrrole Compound>>>

As the pyrrolopyrrole compound, a pigment or a dye may be used, and a pigment is preferable because the coloring composition, with which a film having excellent heat resistance can be formed, is likely to be obtained.

As the pyrrolopyrrole compound, a compound represented by the following Formula (1) is preferable. By using the compound represented by the following Formula (1), excellent spectral characteristics can be obtained further, a film having excellent heat resistance can be formed.

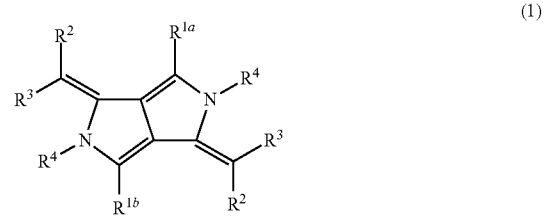

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

The alkyl group represented by $R^{1a}$ or $R^{1b}$ in Formula (1) is an alkyl group having preferably 1 to 30 carbon atoms, more preferably 1 to 20 carbon atoms, and still more preferably 1 to 10 carbon atoms, and examples thereof include methyl, ethyl, iso-propyl, tert-butyl, n-octyl, n-decyl, n-hexadecyl, cyclopropyl, cyclopentyl, and cyclohexyl. The alkyl group may have a substituent or may be unsubstituted. Examples of the substituent include a substituent T described below and a group represented by Formula A described below.

The aryl group represented by $R^{1a}$ or $R^{1b}$ is an alkyl group having preferably 6 to 30 carbon atoms, more preferably 6 to 20 carbon atoms, and still more preferably 6 to 12 carbon atoms, and examples thereof include phenyl, o-methylphenyl, p-methylphenyl, biphenyl, naphthyl, anthranil, and phenanthryl. The aryl group may have a substituent or may be unsubstituted. Examples of the substituent include a substituent T described below and a group represented by Formula A described below.

It is preferable that the heteroaryl group represented by $R^{1a}$ or $R^{1b}$ is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. Specific examples of the heteroaryl group include imidazolyl, pyridyl, quinolyl, furyl, thienyl, benzoxazolyl, benzimidazolyl, benzothiazolyl, naphthothiazolyl, m-carbazolyl, and azepinyl. The heteroaryl group may have a substituent or may be unsubstituted. Examples of the substituent include a substituent T described below and a group represented by Formula A described below.

It is preferable that the group represented by $R^{1a}$ or $R^{1b}$ is an aryl group which has an alkoxy group having a branched alkyl group. The number of carbon atoms in the branched alkyl group is preferably 3 to 30 and more preferably 3 to 20.

In Formula (1), $R^{1a}$ and $R^{1b}$ may be the same as or different from each other.

$R^2$ and $R^3$ each independently represent a hydrogen atom or a substituent. $R^2$ and $R^3$ may be bonded to each other to form a ring. It is preferable that at least one of $R^2$ or $R^3$ represents an electron-withdrawing group. It is preferable that $R^2$ and $R^3$ each independently represent a cyano group or a heteroaryl group.

Examples of the substituent include substituents described in paragraphs "0020" to "0022" of 2009-263614A. The content is incorporated herein by reference.

Examples of the substituent include the following substituent T.

(Substituent T)

Examples of the substituent T include an alkyl group (preferably having 1 to 30 carbon atoms; for example, a methyl group, an ethyl group, or a cyclohexyl group), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms; for example, a phenyl group, a p-methylphenyl group, a biphenyl group, or a naphthyl group), an amino group (preferably an amino group having 0 to 30 carbon atoms), an alkoxy group (preferably an alkoxy group having 1 to 30 carbon atoms; for example, a methoxy group or a 2-ethylhexyloxy group), an aryloxy group (preferably an aryloxy group having 6 to 30 carbon atoms; for example, a phenyloxy group, an 1-naphthyloxy group, or 2-naphthyloxy group), a heteroaryloxy group (preferably a heteroaryloxy group having 1 to 30 carbon atoms; for example, a pyridyloxy group), an acyl group (preferably having an acyl group 2 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfonylamino group (preferably a sulfonylamino group having 1 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably a heteroarylthio group having 1 to 30 carbon atoms), an alkylsulfinyl group (preferably an alkylsulfinyl group having 1 to 30 carbon atoms), an arylsulfinyl group (preferably an arylsulfinyl group having 6 to 30 carbon atoms), an alkylureido group (preferably an alkylureido group having 1 to 30 carbon atoms), an arylureido group (preferably an alkylureido group having 6 to 30 carbon atoms), a phosphoric amide group (preferably a phosphoric amide group having 1 to 30 carbon atoms), a hydroxy group, a mercapto group, a halogen atom (for example, a fluorine atom, a chlorine atom, a bromine atom, or an iodine atom), a cyano group, a sulfo group, a carboxy group, a nitro group, a hydroxamic acid group, a sulfino group, a hydrazino group, an imino group, and a heteroaryl group.

In a case where the above-described groups can be further substituted, the groups may further have a substituent. Examples of the substituent include the groups exemplified as the substituent T and a group represented by the following Formula A.

$$-L^1-X^1 \quad\quad A:$$

In Formula A, $L^1$ represents a single bond or a divalent linking group, and $X^1$ represents a (meth)acryloyloxy group, an epoxy group, an oxetanyl group, an isocyanate group, a hydroxy group, an amino group, a carboxy group, a thiol group, an alkoxysilyl group, a methylol group, a vinyl group, a (meth)acrylamide group, a sulfo group, a styryl group, or a maleimide group.

In a case where $L^1$ represents a divalent linking group, it is preferable that $L^1$ represents an alkylene group having 2 to 20 carbon atoms, an arylene group having 6 to 18 carbon atoms, a heteroarylene group having 3 to 18 carbon atoms, —O—, —S—, —C(=O)—, or a group of a combination of the above-described groups.

It is more preferable that $X^1$ represents one or more groups selected from the group consisting of a (meth)acryloyloxy group, a vinyl group, an epoxy group, and an oxetanyl group, and it is still more preferable that $X^1$ represents a (meth)acryloyloxy group.

It is preferable that at least one of $R^2$ or $R^3$ represents an electron-withdrawing group. A substituent having a positive Hammett sigma para value (σp value) functions as an electron-withdrawing group.

In the present invention, a substituent having a Hammett σp value of 0.2 or higher can be used as an example of the electron-withdrawing group. The σp value is preferably 0.25 or higher, more preferably 0.3 or higher, and still more preferably 0.35 or higher. The upper limit is not particularly limited and is preferably 0.80 or lower.

Specific examples of the substituent having a Hammett σp value of 0.2 or higher include a cyano group (σp value=0.66), a carboxy group (—COOH; σp value=0.45), an alkoxycarbonyl group (—COOMe: 0.45), an aryloxycarbonyl group (for example, —COOPh; σp value=0.44), a carbamoyl group (for example, —CONH$_2$; σp value=0.36), an alkylcarbonyl group (for example, —COMe; σp value=0.50), an arylcarbonyl group (for example, —COPh; σp value=0.43), an alkylsulfonyl group (for example, —SO$_2$Me; σp value=0.72), and an arylsulfonyl group (for example, —SO$_2$Ph; σp value=0.68). In particular, a cyano group is preferable. Here, Me represents a methyl group, and Ph represents a phenyl group.

The details of the Hammett substituent constant σ value can be found in paragraphs "0017" and "0018" of JP2011-68731A, the content of which is incorporated herein by reference.

In a case where $R^2$ and $R^3$ are bonded to each other to form a ring, it is preferable that the formed ring is a 5- to 7-membered (preferably 5- or 6-membered) ring which is typically used as an acid nucleus in a merocyanine colorant. Specific examples include a structure described in paragraph "0026" of JP2009-263614A, and the content of which is incorporated herein by reference.

The σp values of $R^2$ and $R^3$ which form the ring cannot be defined. However, in this present invention, assuming that each of $R^2$ and $R^3$ is substituted with a partial ring structure, the σp values of $R^2$ and $R^3$ which form the ring are defined. For example, in a case where $R^2$ and $R^3$ form a 1,3-indanedione ring, each of $R^2$ and $R^3$ is substituted with a benzoyl group.

It is preferable that the ring which is formed by $R^2$ and $R^3$ being bonded to each other is a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus. It is more preferable that the ring which is formed by $R^2$ and $R^3$ being bonded to each other is a 1,3-dicarbonyl nucleus, a 2,4,6-triketohexahydropyrimidine nucleus (including a thioketone form), a 3,5-pyrazolidinedione nucleus, a benzothiophen-3-one nucleus, or an indanone nucleus.

It is more preferable that $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. The heteroaryl group is preferably a quinoline group, a benzothiazole group, or a naphthothiazol group, and is more preferably a benzothiazole group. The heteroaryl group may have a substituent or may be unsubstituted. Examples of the substituent include the above-described substituent T and the above-described group represented by Formula A.

In Formula (1), two $R^2$'s may be the same as or different from each other, and two $R^3$'s may be the same as or different from each other.

In a case where $R^4$ represents an alkyl group, an aryl group, or a heteroaryl group, the alkyl group, the aryl group, and the heteroaryl group represented by $R^4$ have the same definitions and the same preferable ranges as those described regarding $R^{1a}$ and $R^{1b}$.

In a case where $R^4$ represents —$BR^{4A}R^{4B}$, $R^{4A}$ and $R^{4B}$ each independently represent a hydrogen atom or a substituent and may be bonded to each other to form a ring. Examples of the substituent represented by $R^{4A}$ and $R^{4B}$ include the above-described substituent T. In particular, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by —$BR^{4A}R^{4B}$ include difluoroboron, diphenylboron, dibutylboron, dinaphthylboron, and catecholboron. In particular, diphenylboron is preferable.

In a case where $R^4$ represents a metal atom, examples of the metal atom include magnesium, aluminum, calcium, barium, zinc, tin, vanadium, iron, cobalt, nickel, copper, palladium, iridium, platinum. In particular, aluminum, zinc, vanadium, iron, copper, palladium, iridium, or platinum is preferable.

$R^4$ may form a covalent bond or a coordinate bond with at least one selected from the group consisting of $R^{1a}$, $R^{1b}$, and $R^3$. In particular, it is preferable that $R^4$ and $R^3$ form a coordinate bond.

It is preferable that $R^4$ represents a hydrogen atom or a group (in particular, diphenylboron) represented by —$BR^{4A}R^{4B}$.

In Formula (1), two $R^4$'s may be the same as or different from each other.

It is preferable that the compound represented by Formula (1) is a compound represented by the following Formula (2), (3), or (4).

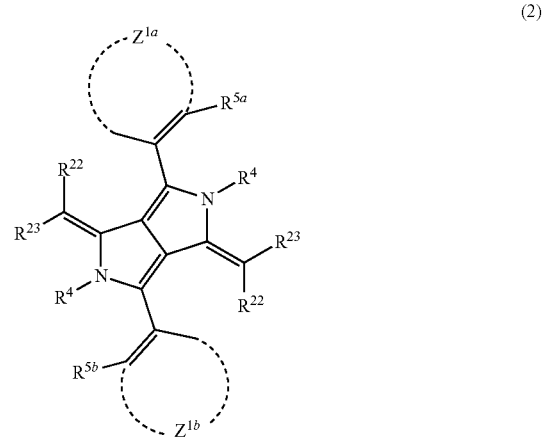

(2)

In Formula (2), $Z^{1a}$ and $Z^{1b}$ each independently represent an atomic group which forms an aryl ring or a heteroaryl ring. $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 2 to 20 carbon atoms, a carboxy group, a carbamoyl group having 1 to 20 carbon atoms, a halogen atom, or a cyano group, and $R^{5a}$ or $R^{5b}$ may be bonded to $Z^{1a}$ or $Z^{1b}$ to form a fused ring. $R^{22}$ and $R^{23}$ each independently represent a cyano group, an acyl group having 2 to 6 carbon atoms, an alkoxycarbonyl group having 2 to 6 carbon atoms, an alkylsulfinyl group having 1 to 10 carbon atoms, an arylsulfinyl group having 6 to 10 carbon atoms, or a nitrogen-containing heteroaryl group having 3 to 20 carbon atoms. $R^{22}$ and $R^{23}$ may be bonded to each other to form a cyclic acid nucleus. $R^4$ represents a hydrogen atom, an alkyl group having 1 to 20 carbon atoms, an aryl group having 6 to 20 carbon atoms, a heteroaryl group having 4 to 20 carbon atoms, —$BR^{4A}R^{4B}$, or a metal atom, and may form a covalent bond or a coordinate bond with $R^{23}$. $R^{4A}$ and $R^{4B}$ each independently represent a hydrogen atom, a halogen atom, an alkyl group having 1 to 10 carbon atoms, an alkoxy group having 1 to 10 carbon atoms, an aryl group having 6 to 20 carbon atoms, or a heteroaryl group having 4 to 20 carbon atoms.

In Formula (2), $Z^{1a}$ and $Z^{1b}$ each independently represent an atomic group which forms an aryl ring or a heteroaryl ring. The formed aryl ring and the formed heteroaryl ring have the same definitions and the same preferable ranges as those of the aryl group and the heteroaryl group described as the substituent of $R^2$ and $R^3$ in Formula (1). It is preferable that $Z^{1a}$ and $Z^{1b}$ are the same as each other.

$R^{5a}$ and $R^{5b}$ have the same definitions and the same preferable ranges as those of the examples described regarding $R^2$ and $R^3$ in Formula (1). It is preferable that $R^{5a}$ and $R^{5b}$ are the same as each other.

$R^{5a}$ or $R^{5b}$ may be bonded to $Z^{1a}$ or $Z^{1b}$ to form a fused ring, and examples of the fused ring include a naphthyl ring and a quinoline ring. By introducing the group represented by $R^{5a}$ or $R^{5b}$ into the aryl ring or the heteroaryl ring which is formed by $Z^{1a}$ or $Z^{1b}$, invisibility can be significantly improved.

$R^{22}$ and $R^{23}$ have the same definitions and the same preferable ranges as those of the examples described regarding $R^2$ and $R^3$ in Formula (1).

$R^4$ has the same definition and the same preferable range as $R^4$ in Formula (1). $R^4$ may form a covalent bond or a coordinate bond with $R^{23}$.

The compound represented by Formula (2) may further have a substituent, and this substituent has the same definition and the same preferable range as those of the substituent of $R^2$ and $R^3$.

In a preferable combination in Formula (2), $Z^{1a}$ and $Z^{1b}$ each independently form a benzene ring or a pyridine ring, $R^{5a}$ and $R^{5b}$ each independently represent an alkyl group, an alkoxy group, a halogen atom, or a cyano group, $R^{22}$ and $R^{23}$ each independently represent a heteroaryl group, a cyano group, an acyl group, an alkoxycarbonyl group, or a cyclic acid nucleus which is formed by $R^{22}$ and $R^{23}$ being bonded to each other, and $R^4$ represents a hydrogen atom, —$BR^{4A}R^{4B}$, a transition metal atom, magnesium, aluminum, calcium, barium, zinc, or tin. In a more preferable combination, both $Z^{1a}$ and $Z^{1b}$ form a benzene ring, both $R^{5a}$ and $R^{5b}$ represent an alkyl group, a halogen atom, or a cyano group, $R^{22}$ and $R^{23}$ each independently represent a combination of a nitrogen-containing heteroaryl group with a cyano group or an alkoxycarbonyl group or are bonded to each other to form a cyclic acid nucleus, and $R^4$ represents a hydrogen atom, —$BR^{4A}R^{4B}$, aluminum, zinc, vanadium, iron, copper, palladium, iridium, or platinum.

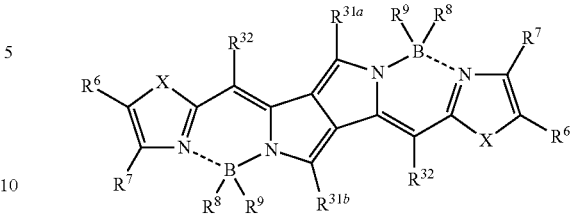

(3)

In Formula (3), $R^{31a}$ and $R^{31b}$ each independently represent an alkyl group having 1 to 20 carbon atoms, an aryl group having 6 to 20 carbon atoms, or a heteroaryl group having 3 to 20 carbon atoms. $R^{32}$ represents a cyano group, an acyl group having 2 to 6 carbon atoms, an alkoxycarbonyl group having 2 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms. $R^6$ and $R^7$ may be bonded to each other to form a fused ring, and the formed ring is preferably an alicyclic ring having 5 to 10 carbon atoms, an aryl ring having 6 to 10 carbon atoms, or a heteroaryl ring having 3 to 10 carbon atoms. $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms. X represents an oxygen atom, a sulfur atom, —NR—, or —CRR'—, and R and R' represent a hydrogen atom, an alkyl group having 1 to 10 carbon atoms, or an aryl group having 6 to 10 carbon atoms.

In Formula (3), $R^{31a}$ and $R^{31b}$ have the same definitions and the same preferable ranges as those of the examples described regarding $R^{31a}$ and $R^{1b}$ in Formula (1). It is preferable that $R^{31a}$ and $R^{31b}$ are the same as each other.

$R^{32}$ has the same definition and the same preferable range as those of the example of $R^2$ in Formula (1).

$R^6$ and $R^7$ have the same definition and the same preferable range as those of the examples of the substituent of $R^2$ and $R^3$ in Formula (1). In addition, $R^6$ and $R^7$ may be bonded to each other to form a ring, and the formed ring is an alicyclic ring having 5 to 10 carbon atoms, an aryl ring having 6 to 10 carbon atoms, or a heteroaryl ring having 3 to 10 carbon atoms, and preferable examples thereof include a benzene ring, a naphthalene ring, and a pyridine ring. In a case where $R^6$ and $R^7$ represent a boron complex obtained by introducing a substituted 5-membered nitrogen-containing heteroaryl ring, an infrared absorbing colorant having high fastness and high invisibility at the same time can be realized.

$R^8$ and $R^9$ have the same definitions and the same preferable ranges as those of the examples of the substituent of $R^2$ and $R^3$ in Formula (1).

X represents an oxygen atom, a sulfur atom, —NR—, or —CRR'—. R and R' each independently represent a hydrogen atom, an alkyl group having 1 to 10 carbon atoms, or an aryl group having 6 to 10 carbon atoms, and preferably represents a hydrogen atom, an alkyl group having 1 to 6 carbon atoms, or a phenyl group.

In a preferable combination in Formula (3), $R^{31a}$ and $R^{31b}$ each independently represent an alkyl group having 1 to 10 carbon atoms, a benzene ring, or a pyridine ring, $R^{32}$ represents a cyano group or an alkoxycarbonyl group, $R^6$ and $R^7$ are bonded to each other to form a benzene ring, a pyridine ring, a pyrazine ring, or a pyrimidine ring, $R^8$ and $R^9$ each independently represent an alkyl group having 1 to 6 carbon atoms, a phenyl group, or a naphthyl group, X represents an oxygen atom, a sulfur atom, —NR—, or —CRR'—, and R and R' each independently represent a hydrogen atom, an alkyl group having 1 to 6 carbon atoms, or a phenyl group. In a more preferable combination, both $R^{31a}$ and $R^{31b}$ represent an alkyl group having 1 to 10 carbon atoms or a benzene ring, $R^{32}$ represents a cyano group, $R^6$ and $R^7$ are bonded to each other to form a benzene ring or a pyridine ring, $R^8$ and $R^9$ each independently represent an alkyl group having 1 to 6 carbon atoms, a phenyl group, or a naphthyl group, and X represents an oxygen atom or a sulfur atom.

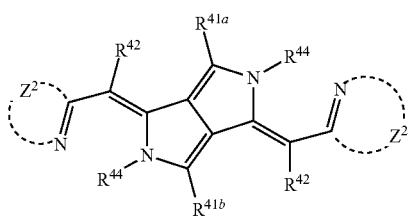

(4)

In Formula (4), $R^{41a}$ and $R^{41b}$ represent groups which are different from each other and represent an alkyl group having 1 to 20 carbon atoms, an aryl group having 6 to 20 carbon atoms, or a heteroaryl group having 3 to 20 carbon atoms. $R^{42}$ represents a cyano group, an acyl group having 2 to 6 carbon atoms, an alkoxycarbonyl group having 2 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $Z^2$ represents an atomic group which forms a nitrogen-containing 5- or 6-membered heterocycle with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof. $R^{44}$ represents a hydrogen atom, an alkyl group having 1 to 20 carbon atoms, an aryl group having 6 to 20 carbon atoms, a heteroaryl group having 4 to 20 carbon atoms, —$BR^{44A}R^{44B}$, or a metal atom, $R^{44}$ may form a covalent bond or a coordinate bond with a nitrogen-containing heterocycle formed by $Z^2$, and $R^{44A}$ and $R^{44B}$ each independently represent a hydrogen atom, a halogen atom, an alkyl group having 1 to 10 carbon atoms, an aryl group having 6 to 20 carbon atoms, or a heteroaryl group having 4 to 20 carbon atoms.

In Formula (4), $R^{41a}$ and $R^{41b}$ have the same definitions and the same preferable ranges as those of the examples described regarding $R^{1a}$ and $R^{1b}$ in Formula (1). In this case, $R^{41a}$ and $R^{41b}$ represent groups which are different from each other.

$R^{42}$ has the same definition and the same preferable range as $R^2$ in Formula (1).

$Z^2$ represents an atomic group which forms a nitrogen-containing 5- or 6-membered heterocycle with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof.

$R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituent such as a halogen atom, an alkyl group having 1 to 10 carbon atoms, an aryl group having 6 to 20 carbon atoms, —$BR^{44A}R^{44B}$, or a metal atom, $R^{44}$ may form a covalent bond or a coordinate bond with a nitrogen-containing heterocycle formed by $Z^2$, and $R^{44A}$ and $R^{44B}$ each independently represent a hydrogen atom, a halogen atom, an alkyl group having 1 to 10 carbon atoms, an aryl group having 6 to 20 carbon atoms, or a heteroaryl group having 4 to 20 carbon atoms.

By introducing the groups represented by the $R^{41a}$ and $R^{41b}$ which are different from each other and introducing the nitrogen-containing 5- or 6-membered heterocycle which is formed by $Z^2$ and —C=N—, high fastness, high invisibility, excellent dispersibility, and high solubility in an organic solvent can be imparted.

In a preferable combination in Formula (4), $R^{41a}$ and $R^{41b}$ each independently represent an alkyl group having 1 to 10 carbon atoms, a benzene ring, or a pyridine ring, $R^{42}$ represents a cyano group, an alkyl or arylsulfinyl group having 1 to 10 carbon atoms, or an alkoxycarbonyl group, $Z^2$ and —C=N— form a thiazole ring, an oxazole ring, an imidazole ring, a thiadiazole ring, a triazole ring, a pyridine ring, a pyrimidine ring, a pyrazine ring, or a benzo fused ring or a naphtho fused ring thereof, $R^{44}$ represents a hydrogen atom, —$BR^{44A}R^{44B}$, a transition metal atom, magnesium, aluminum, calcium, barium, zinc, or tin. In a particularly preferable combination, $R^{41a}$ and $R^{41b}$ each independently represent an alkyl group having 1 to 10 carbon atoms or a benzene ring, $R^{42}$ represents a cyano group, $Z^2$ and —C=N— form a thiazole ring, an oxazole ring, an imidazole ring, a triazole ring, a pyridine ring, a pyrimidine ring, or a benzo fused ring or a naphtho fused ring thereof, and $R^{44}$ represents a hydrogen atom, —$BR^{44A}R^{44B}$ (wherein $R^{44A}$ and $R^{44B}$ each independently represent an alkyl group having 1 to 10 carbon atoms, a benzene ring, a pyridine ring, or a thiophene ring), aluminum, zinc, vanadium, iron, copper, palladium, iridium, or platinum.

As the pyrrolopyrrole compound, a compound represented by the following Formula (5) is more preferable.

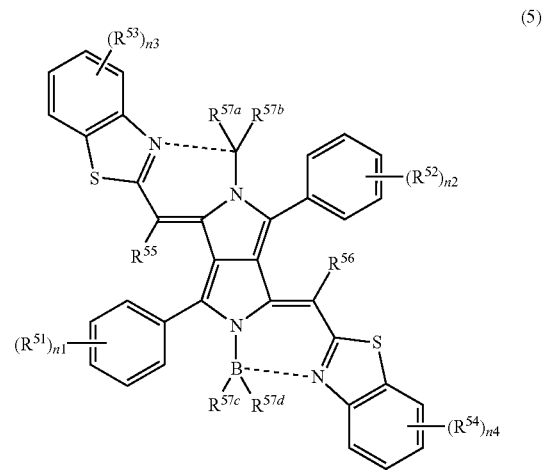

(5)

In Formula (5), $R^{51}$ to $R^{54}$ each independently represent a substituent.

$R^{55}$ and $R^{56}$ each independently represent a cyano group, an acyl group having 2 to 6 carbon atoms, an alkoxycarbonyl group having 2 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms.

n1 and n2 each independently represent an integer of 0 to 5.

n3 and n4 each independently represent an integer of 0 to 4.

Examples of the substituent represented by $R^{51}$ and $R^{52}$ include the substituents described above regarding the substituent T.

$R^{51}$ and $R^{52}$ each independently represent preferably an alkyl group, an aryl group, an alkoxy group, an aryloxy group, a heteroaryloxy group, a halogen atom, or a cyano group, more preferably an alkoxy group or an aryloxy group, and still more preferably an alkoxy group.

The number of carbon atoms in the alkyl group is preferably 1 to 30 and more preferably 1 to 20. The alkyl group may be linear, branched, or cyclic and is preferably linear or branched.

The number of carbon atoms in the aryl group or the aryloxy group is preferably 6 to 30 and more preferably 6 to 20.

The number of carbon atoms in the alkoxy group is preferably 1 to 30 and more preferably 1 to 20. The alkoxy group is preferably linear or branched and more preferably branched.

A heteroaryl ring included in the heteroaryloxy group is preferably a 5- or 6-membered ring. In addition, the heteroaryl ring is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl ring is preferably 1 to 3 and more preferably 1 or 2. Examples of the heteroatom include a nitrogen atom, an oxygen atom, and a sulfur atom.

Examples of the substituent represented by $R^{53}$ and $R^{54}$ include the substituents described above regarding the substituent T.

$R^{53}$ and $R^{54}$ each independently represent preferably an alkyl group, an aryl group, an alkoxy group, an aryloxy group, a heteroaryloxy group, a halogen atom, or a cyano group.

$R^{55}$ and $R^{56}$ each independently represent preferably a cyano group, an acyl group having 2 to 6 carbon atoms, an alkoxycarbonyl group having 2 to 6 carbon atoms, an alkylsulfinyl group having 1 to 10 carbon atoms, an arylsulfinyl group having 6 to 10 carbon atoms, a nitrogen-containing heteroaryl group having 3 to 10 carbon atoms, or a cyano group.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms, preferably an alkyl group having 1 to 10 carbon atoms or an aryl group having 6 to 20 carbon atoms, more preferably an aryl group having 6 to 20 carbon atoms, and still more preferably a phenyl group.

n1 and n2 each independently represent an integer of 0 to 5, preferably 0 to 3, more preferably 0 to 2, and still more preferably 1. In a more preferable combination, n1 and n2 represent 1, and $R^{51}$ and $R^{52}$ represent an alkoxy group.

n3 and n4 each independently represent an integer of 0 to 4 and preferably 0 to 2.

Specific examples of the compound represented by Formula (1) include the following compounds. In addition, other specific examples of the compound represented by Formula (1) include compounds described in paragraphs "0049" to "0058" of JP2009-263614A.

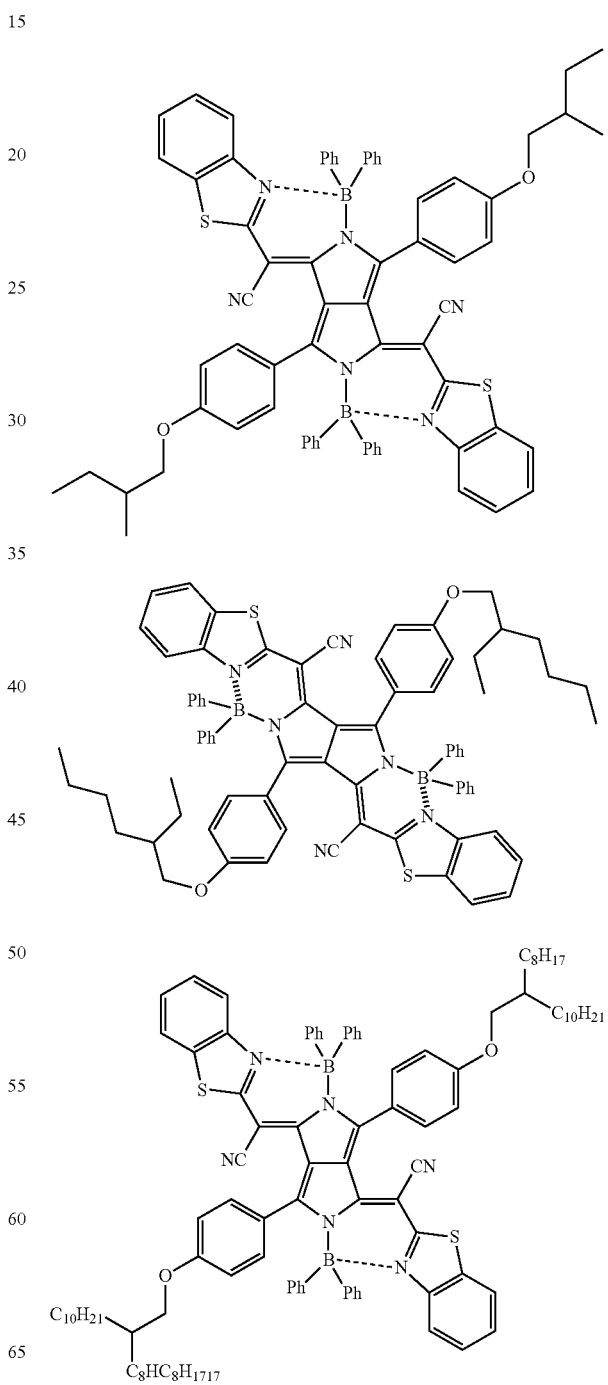

-continued

<chemical structure>
C8H17, R
C8H16, R
Ph, Ph
B
N
S
NC
N
CN
B
Ph Ph
O C8H16
R
R C8H17

R = H or ⸝S—CH2—C(=O)—O—CH2CH2—O—C(=O)—C(CH3)=CH2

Adjacent R's are different from each other
</chemical structure>

<<<Phthalocyanine Compound>>>

It is preferable that the phthalocyanine compound is oxotitanyl phthalocyanine or vanadium phthalocyanine.

It is preferable that the oxotitanyl phthalocyanine is a compound represented by the following Formula (PC).

(PC)

<chemical structure of oxotitanyl phthalocyanine with O=Ti center and substituents $X^1$ to $X^{16}$>

In the formula, $X^1$ to $X^{16}$ each independently represent a hydrogen atom or a halogen atom.

The number of halogen atoms among $X^1$ to $X^{16}$ is preferably 0 to 16, more preferably 0 to 4, still more preferably 0 or 1, and even still more preferably 0.

The oxotitanyl phthalocyanine may be an α type, a β type, or an Y type and is preferably an α type from the viewpoint of spectra characteristics.

It is preferable that the vanadium phthalocyanine is a compound represented by the following Formula (PC-1).

(PC-1)

<chemical structure of vanadium phthalocyanine with O=V center and substituents $X^1$ to $X^{16}$>

In the formula, $X^1$ to $X^{16}$ each independently represent a hydrogen atom or a halogen atom.

The number of halogen atoms among $X^1$ to $X^{16}$ is preferably 0 to 16, more preferably 0 to 4, still more preferably 0 or 1, and even still more preferably 0.

<<<Naphthalocyanine Compound>>>

It is preferable that the naphthalocyanine compound is oxovanadyl naphthalocyanine.

It is preferable that the oxovanadyl naphthalocyanine is a compound represented by the following Formula (NPC).

(NPC)

<chemical structure of oxovanadyl naphthalocyanine with O=V center and substituents $X^1$ to $X^{24}$>

In the formula, $X^1$ to $X^{24}$ each independently represent a hydrogen atom or a halogen atom.

The number of halogen atoms among $X^1$ to $X^{24}$ is preferably 0 to 24, more preferably 0 to 4, still more preferably 0 or 1, and even still more preferably 0.

<<<Squarylium Compound>>>

It is preferable that the squarylium compound is a compound represented by the following Formula (SQ).

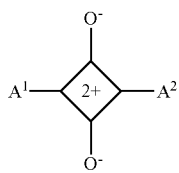

(SQ)

In Formula (SQ), $A^1$ and $A^2$ each independently represent an aryl group, a heterocyclic group, or a group represented by the following Formula (sq1).

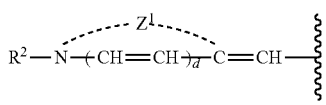

(sq1)

In Formula (sq1), $Z^1$ represents a non-metal atomic group which forms a nitrogen-containing heterocycle, $R^2$ represents an alkyl group, an alkenyl group, or an aralkyl group, d represents 0 or 1, and a wave line represents a direct bond to Formula (SQ).

In Formula (SQ), $A^1$ and $A^2$ each independently represent an aryl group, a heterocyclic group, or a group represented by the following Formula (sq1), and preferably a group represented by Formula (sq1).

The number of carbon atoms in the aryl group represented by $A^1$ and $A^2$ is preferably 6 to 48, more preferably 6 to 24, and still more preferably 6 to 12. Specific examples include a phenyl group and a naphthyl group. In a case where the aryl group has a substituent, the number of carbon atoms in the aryl group denotes the number of carbon atoms excluding the number of carbon atoms in the substituent.

It is preferable that the heterocyclic group represented by $A^1$ and $A^2$ is a 5- or 6-membered ring. In addition, the heterocyclic group is preferably a monocycle or a fused ring, more preferably a monocycle or a fused ring composed of 2 to 8 rings, still more preferably a monocycle or a fused ring composed of 2 to 4 rings, and even still more preferably a monocycle or a fused ring composed of 2 or 3 rings. Examples of a heteroatom included in the heterocyclic group include a nitrogen atom, an oxygen atom, and a sulfur atom. Among these, a nitrogen atom or a sulfur atom is preferable. The number of heteroatoms is preferably 1 to 3 and more preferably 1 or 2. Specific examples include a heterocyclic group derived from a monocycle or a polycyclic aromatic ring such as a 5- or 6-membered ring containing at least one of a nitrogen atom, an oxygen atom, or a sulfur atom.

The aryl group and the heterocyclic group may have a substituent. Examples of the substituent include a halogen atom, a hydroxy group, a cyano group, a nitro group, an alkyl group, an alkenyl group, an alkynyl group, an aryl group, a heteroaryl group, an aralkyl group, an alkoxy group, an aryloxy group, a heteroaryloxy group, an alkylthio group, an arylthio group, a heteroarylthio group, —$NR^{a1}R^{a2}$, —$COR^{a3}$, —$COOR^{a4}$, —$OCOR^{a5}$, —$NHCOR^{a6}$, —$CONR^{a7}R^{a8}$, —$NHCONR^{a9}R^{a10}$, —$NHCOOR^{a11}$, —$SO_2R^{a12}$, —$SO_2OR^{a13}$, —$NHSO_2R^{a14}$, and —$SO_2NR^{a15}R^{a16}$. $R^{a1}$ to $R^{a16}$ each independently represent a hydrogen atom, an alkyl group, an alkenyl group, an alkynyl group, an aryl group, or a heteroaryl group.

Examples of the halogen atom include a fluorine atom, a chlorine atom, a bromine atom, and an iodine atom.

The number of carbon atoms in the alkyl group, the alkoxy group, and the arylthio group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

Examples of the aryl group included in the aryloxy group and the arylthio group are as described above, and preferable ranges thereof are also the same.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12.

Examples of the heteroaryl group included in the heteroaryloxy group and the heteroarylthio group are as described above, and preferable ranges thereof are also the same.

A substituent which may be included in the aryl group and the heterocyclic group is preferably a halogen atom, an alkyl group, a hydroxy group, —$NR^{a1}R^{a2}$, or —$NHCOR^{a6}$.

In a case where the aryl group and the heterocyclic group have two or more substituents, the substituents may be the same as or different from each other.

Next, the group represented by Formula (sq1) which is represented by $A^1$ and $A^2$ will be described.

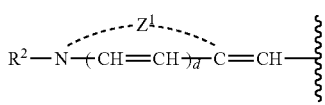

(sq1)

In Formula (sq1), $Z^1$ represents a non-metal atomic group which forms a nitrogen-containing heterocycle, $R^2$ represents an alkyl group, an alkenyl group, or an aralkyl group, d represents 0 or 1, and a wave line represents a direct bond to Formula (SQ).

In Formula (sq1), $R^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and even still more preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (sq1), the nitrogen-containing heterocycle formed by Z1 is preferably a 5- or 6-membered ring. In addition, the nitrogen-containing heterocycle is preferably a monocycle or a fused ring, more preferably a monocycle or a fused ring composed of 2 to 8 rings, still more preferably a monocycle or a fused ring composed of 2 to 4 rings, and even still more preferably a fused ring composed of 2 or 3 rings. In addition to a nitrogen atom, the nitrogen-containing heterocycle may include a sulfur atom. In addition, the nitrogen-containing heterocycle may have a substituent. Examples of the substituent include the substituents which may be included in the aryl group or the heterocyclic group described above, and preferable ranges thereof are also the same. For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

It is preferable that the group represented by Formula (sq1) is a group represented by the following Formula (sq2) or (sq3).

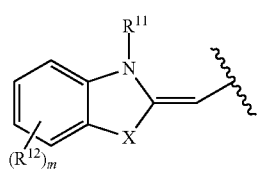

(sq2)

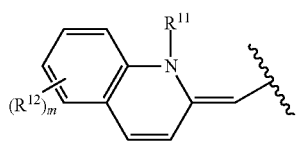

(sq3)

In Formulae (sq2) and (sq3), $R^{11}$ represents an alkyl group, an alkenyl group, or an aralkyl group, $R^{12}$ represents a substituent, in a case where m represents 2 or more, $R^{12}$'s may be linked to each other to form a ring, X represents a nitrogen atom or $CR^{13}R^{14}$, $R^{13}$ and $R^{14}$ each independently represent a hydrogen atom or a substituent, m represents an integer of 0 to 4, and a wave line represents a direct bond to Formula (SQ).

$R^{11}$ in Formulae (sq2) and (sq3) has the same definition and the same preferable range as $R^2$ in Formula (sq1).

$R^{12}$ in Formulae (sq2) and (sq3) represents a substituent. Examples of the substituent include the substituents which may be included in the aryl group or the heterocyclic group described above. For example, a halogen atom, an alkyl group, a hydroxy group, $-NR^{a1}R^{a2}$, or $-NHCOR^{a6}$ is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

In a case where m represents 2 or more, $R^{12}$'s may be linked to each other to form a ring. Examples of the ring include an alicyclic ring (a nonaromatic hydrocarbon ring), an aromatic ring, and a heterocycle. The ring may be a monocycle or a polycycle. In a case where substituents are linked to each other to form a ring, a linking group may be a divalent linking group selected from the group consisting of $-CO-$, $-O-$, $-NH-$, a divalent aliphatic group, a divalent aromatic group, and a combination thereof. For example, it is preferable that $R^{12}$'s may be linked to each other to form a benzene ring.

In Formula (sq2), X represents a nitrogen atom or $CR^{13}R^{14}$, and $R^{13}$ and $R^{14}$ each independently represent a hydrogen atom or a substituent. Examples of the substituent include the substituents which may be included in the aryl group or the heterocyclic group described above. For example, the substituent is an alkyl group. The number of carbon atoms in the alkyl group is preferably 1 to 20, more preferably 1 to 10, still more preferably 1 to 5, even still more preferably 1 to 3, and most preferably 1. The alkyl group is preferably linear or branched and more preferably linear.

m represents an integer of 0 to 4 and preferably 0 to 2.

It is preferable that the squarylium compound is a compound represented by the following Formula (SQ-1).

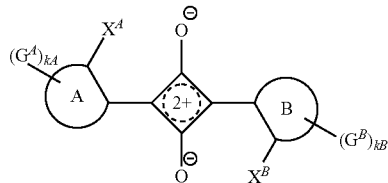

Formula (SQ-1)

In Formula (SQ-1), a ring A and a ring B each independently represent an aromatic ring or a heteroaromatic ring.

$X^A$ and $X^B$ each independently represent a substituent.

$G^A$ and $G^B$ each independently represent a substituent.

kA represents an integer of 0 to nA, and kB represents an integer of 0 to nB.

nA represents an integer representing the maximum number of $G^A$'s which may be substituted in the ring A, and nB represents an integer representing the maximum number of $G^B$'s which may be substituted in the ring B.

$X^A$ and $G^A$, or $X^B$ and $G^B$ may be bonded to each other, and in a case where a plurality of $G^A$'s and a plurality of $G^B$'s are present, $G^A$'s and $G^B$'s may be bonded to each other to form rings, respectively.

$G^A$ and $G^B$ each independently represent a substituent. Examples of the substituent include the substituents which may be included in the aryl group or the heterocyclic group described above.

$X^A$ and $X^B$ each independently represent a substituent. As the substituent, a group having active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, —OH, —SH, or —NR$^{X1}$R$^{X2}$ is still more preferable, and —NR$^{X1}$R$^{X2}$ is even still more preferable.

R$^{X1}$ and R$^{X2}$ each independently represent a hydrogen atom or a substituent. Examples of the substituent include an alkyl group, an alkenyl group, an alkynyl group, an aryl group, and a heteroaryl group. The details of the alkyl group, the alkenyl group, the alkynyl group, the aryl group, and the heteroaryl group are the same as the ranges described regarding the substituents which may be included in the aryl group or the heterocyclic group.

The ring A and the ring B each independently represent an aromatic ring or a heteroaromatic ring. The aromatic ring and the heteroaromatic ring may be a monocycle or a fused ring. Specific examples of the aromatic ring and the heteroaromatic ring include a benzene ring, a naphthalene ring, a pentalene ring, an indene ring, an azulene ring, a heptalene ring, an indecene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable. The aromatic ring may be unsubstituted or may have a substituent. Examples of the substituent include the substituents which may be included in the aryl group or the heterocyclic group described above.

X$^A$ and G$^A$, or X$^B$ and X$^B$ may be bonded to each other to form a ring. In addition, in a case where a plurality of G$^A$'s are present, G$^A$'s may be bonded to each other to form a ring. In addition, in a case where a plurality of G$^B$'s are present, G$^B$'s may be bonded to each other to form a ring.

It is preferable that the ring is a 5- or 6-membered ring. The ring may be a monocycle or a polycycle.

In a case where X$^A$ and G$^A$, X$^B$ and G$^B$, G$^A$'s, or G$^B$'s are bonded to each other to form a ring, the groups may be directly bonded to each other, or may be bonded to each other through a divalent linking group selected from the group consisting of an alkylene group, —CO—, —O—, —NH—, —BR—, and a combination thereof to form a ring. It is preferable that X$^A$ and G$^A$, X$^B$ and G$^B$, G$^A$'s, or G$^B$'s are bonded to each other through —BR— to form a ring.

R represents a hydrogen atom or a substituent. Examples of the substituent include the substituents described regarding G$^A$ and G$^B$.

kA represents an integer of 0 to nA, kB represents an integer of 0 to nB, nA represents an integer representing the maximum number of G$^A$'s which may be substituted in the ring A, and nB represents an integer representing the maximum number of G$^B$'s which may be substituted in the ring B.

kA and kB each independently represent preferably an integer of 0 to 4, more preferably 0 to 2, and still more preferably 0 or 1.

Specific examples of the squarylium compound are as follows. Other examples of the squarylium compound include a compound described in paragraphs "0044" to "0049" of JP2011-208101A and a compound described in paragraphs "0072" to "0079" of JP2015-40895A, the content of which is incorporated herein by reference.

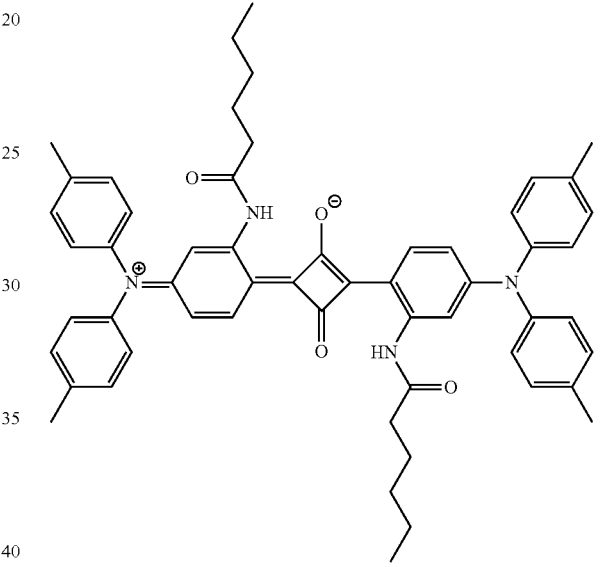

Q-1

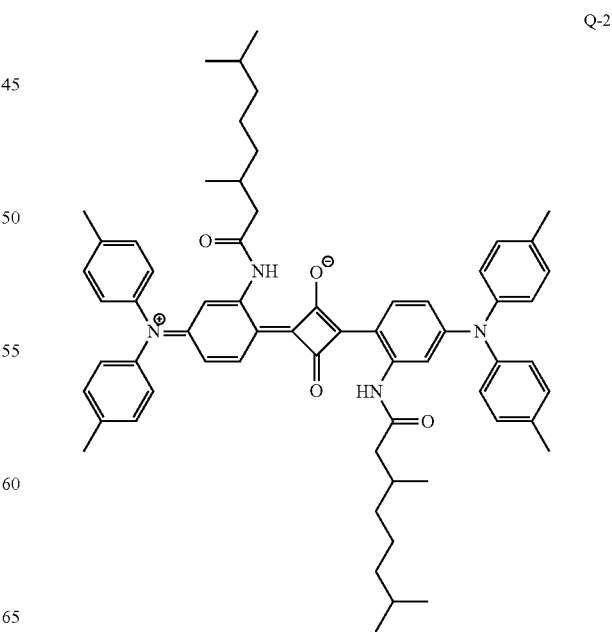

Q-2

Q-3
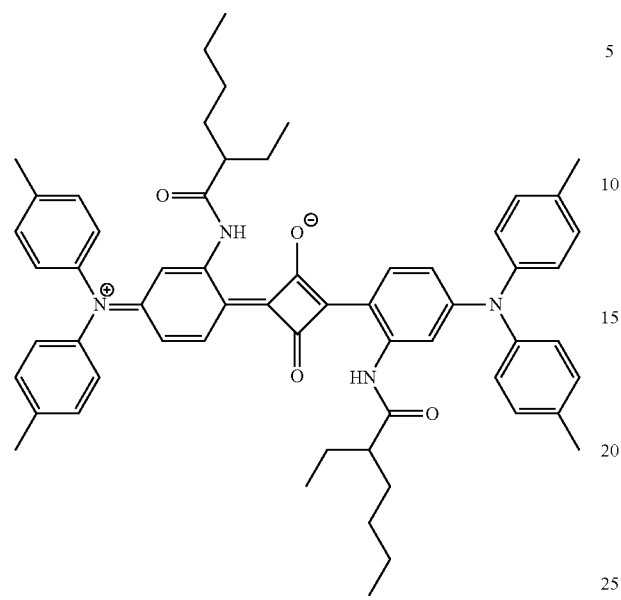
Q-6
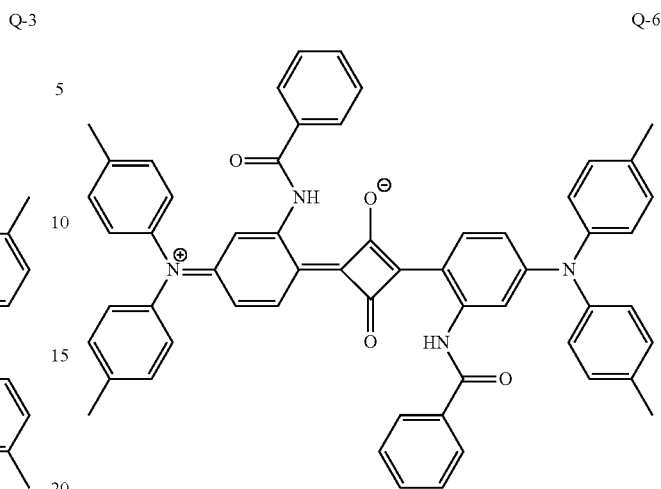
Q-4
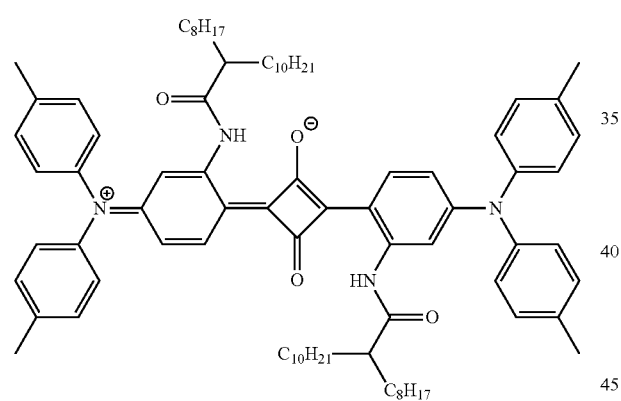
Q-5
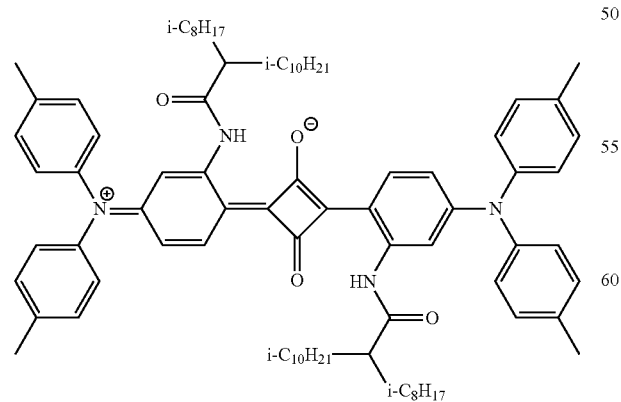
Q-7

-continued
Q-8
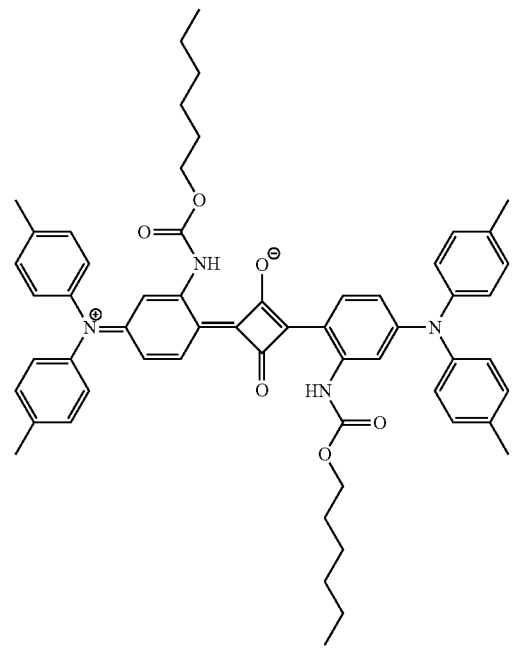
Q-9
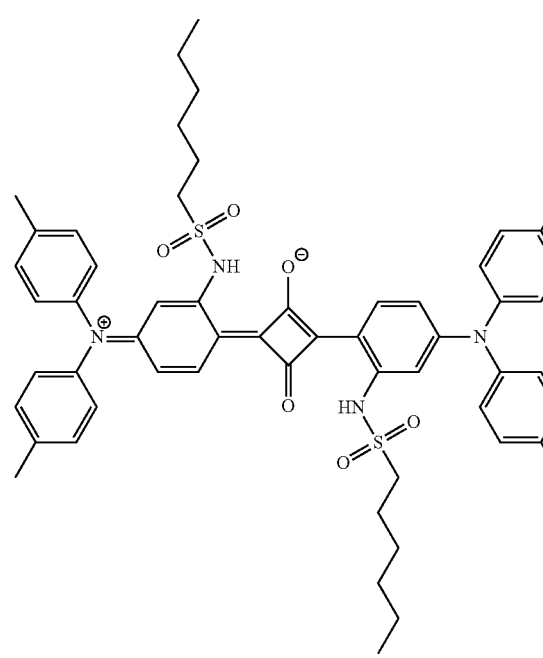
Q-11
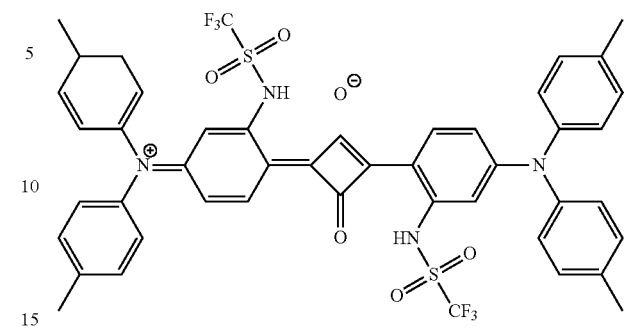
Q-12
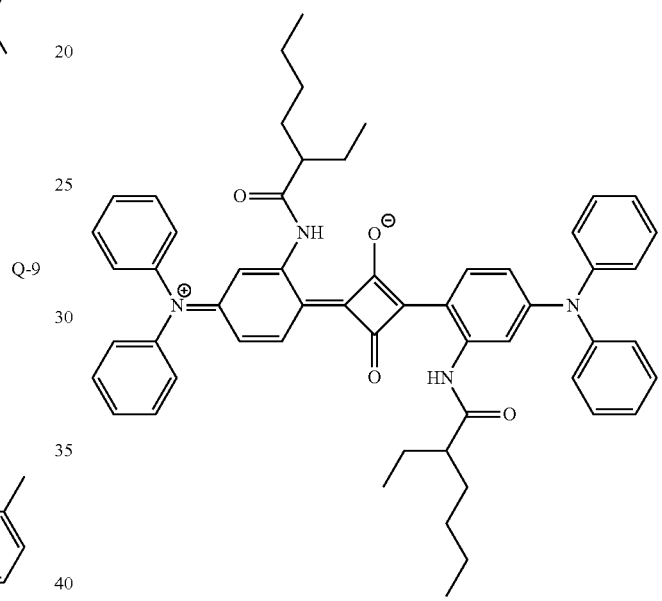
Q-13
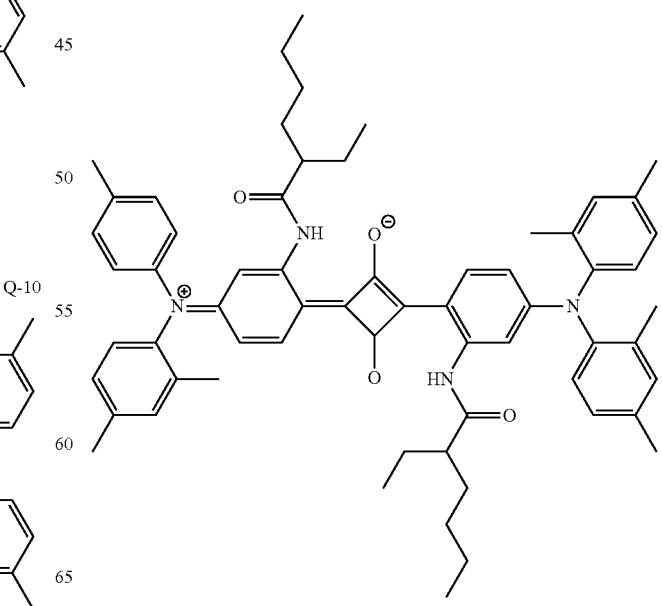

Q-14
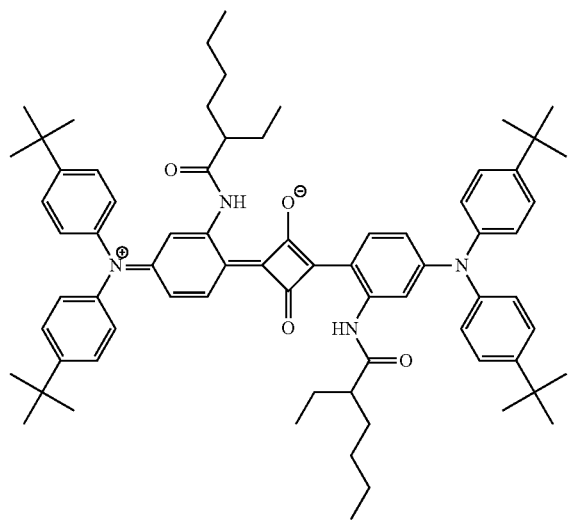
Q-17
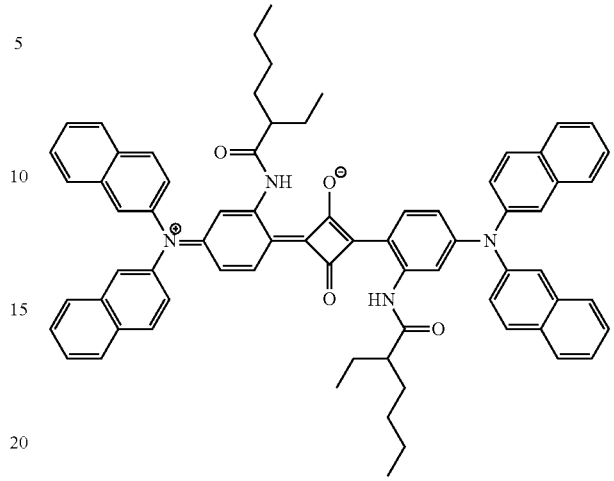
Q-15
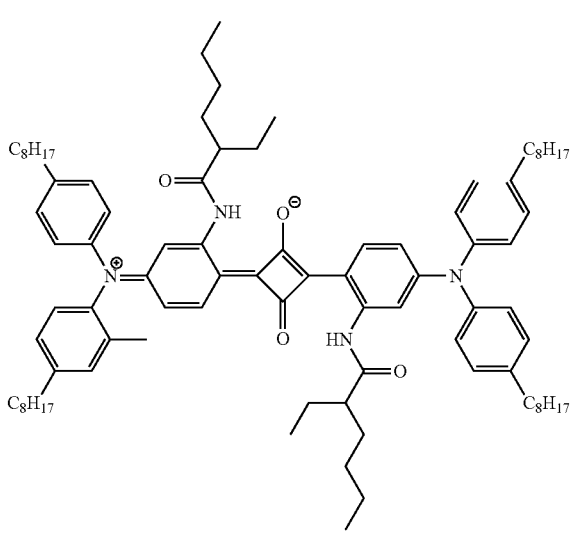
Q-18
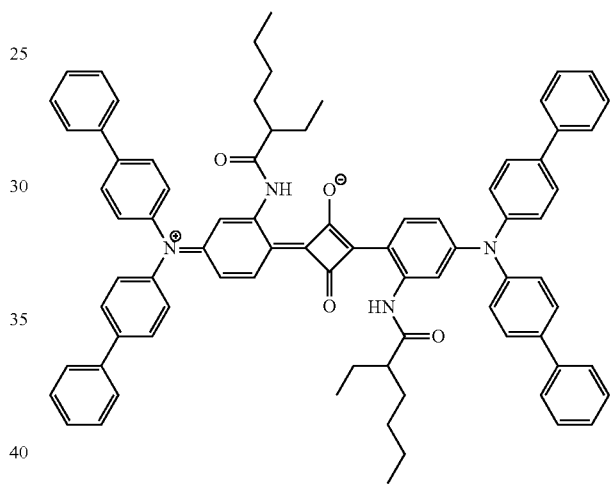
Q-16
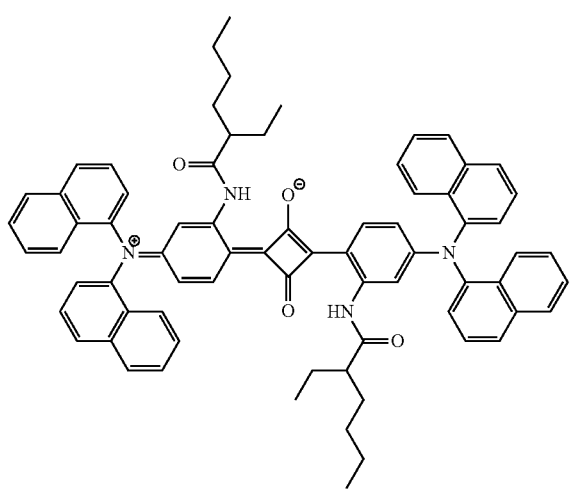
Q-19
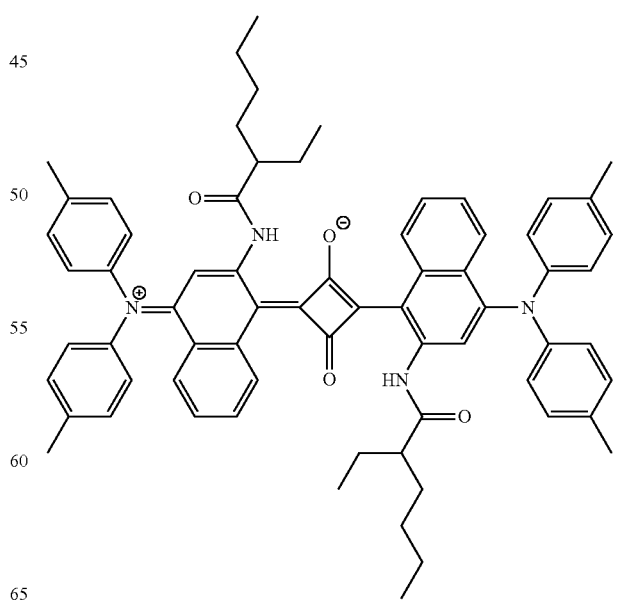

Q-20
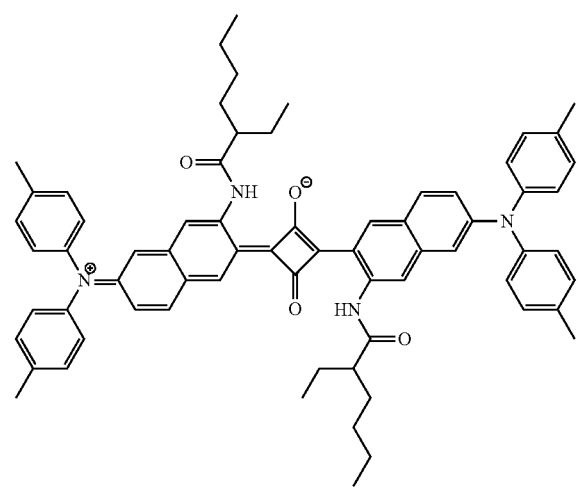
Q-24
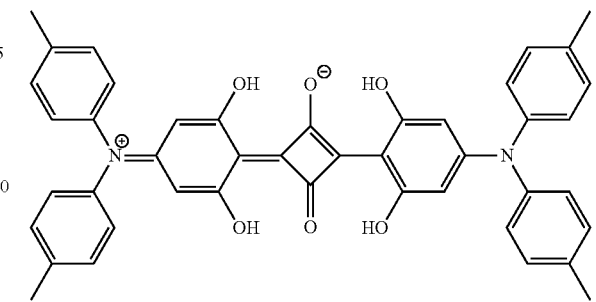
Q-25
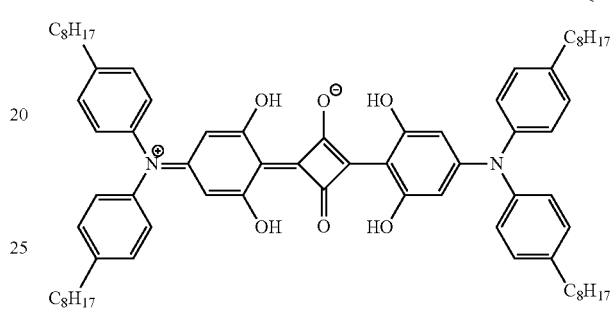
Q-21
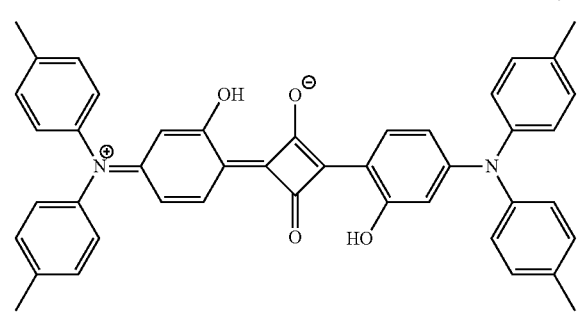
Q-26
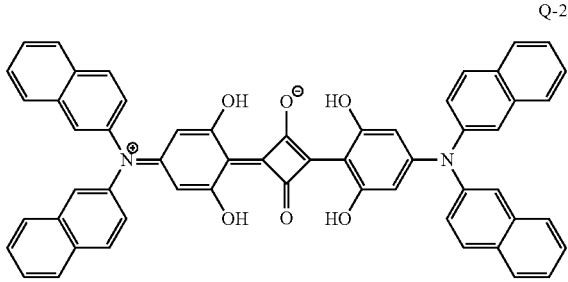
Q-22
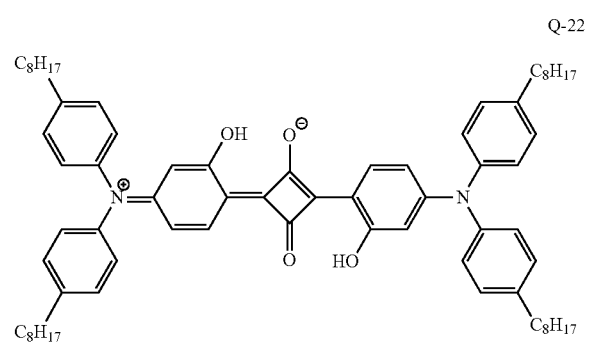
Q-27
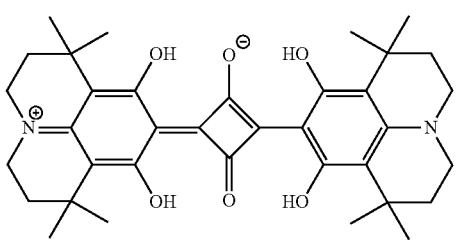
Q-28
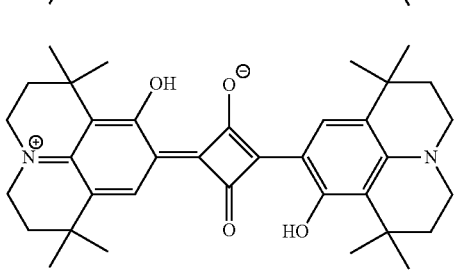
Q-23
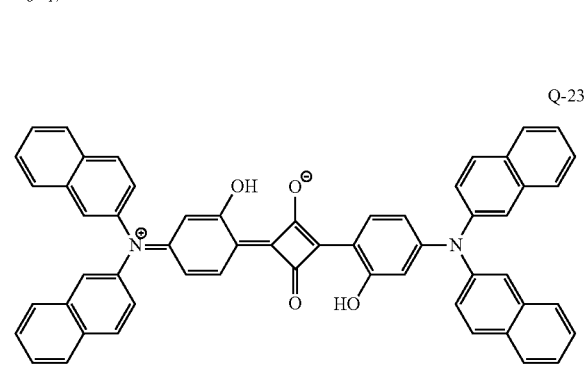
Q-29

-continued
Q-30
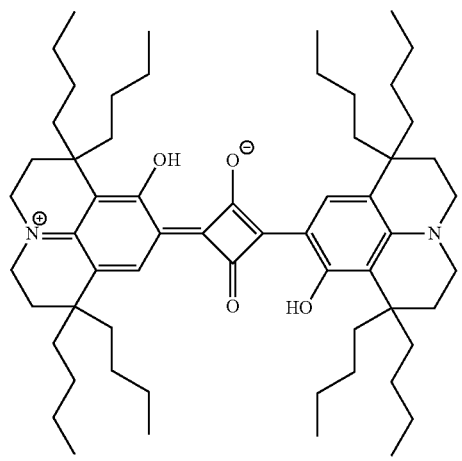
Q-31
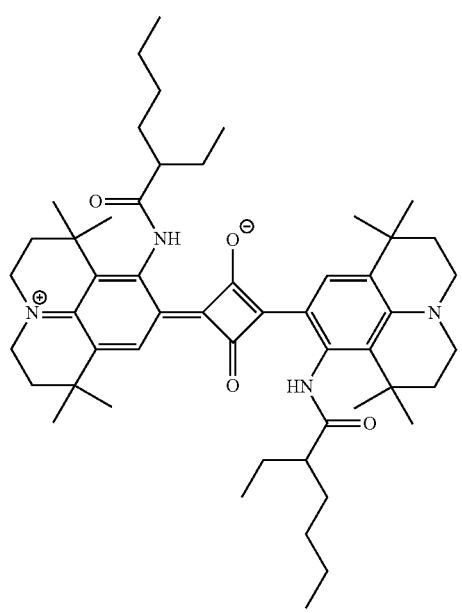
Q-32
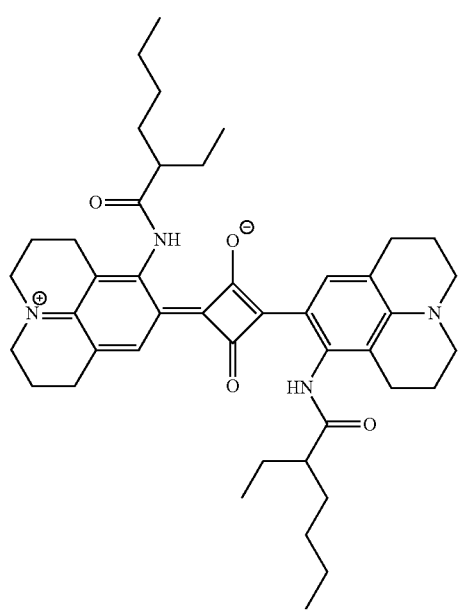
-continued
Q-33
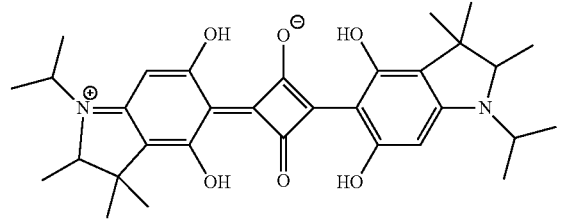
Q-34
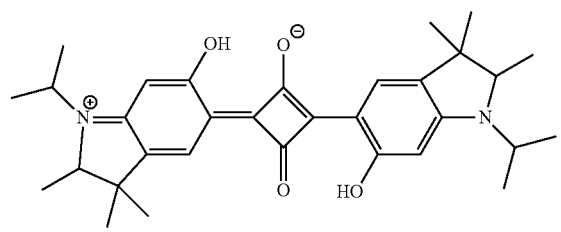
Q-35
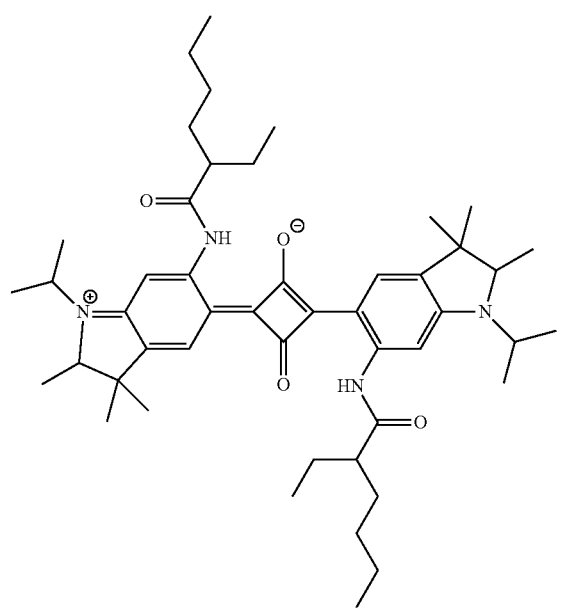

Q-36
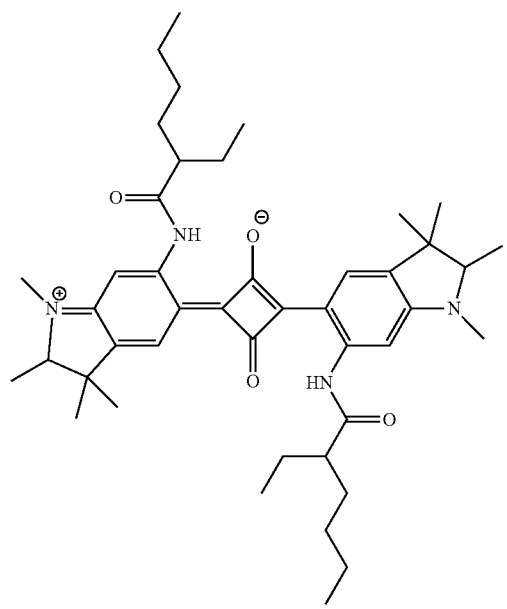
Q-37
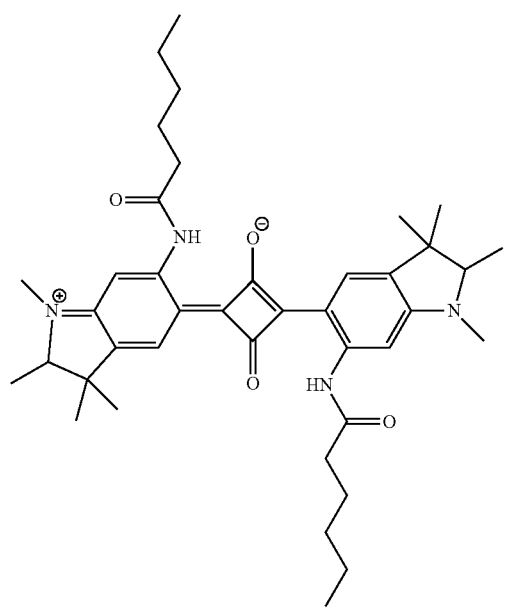
Q-38
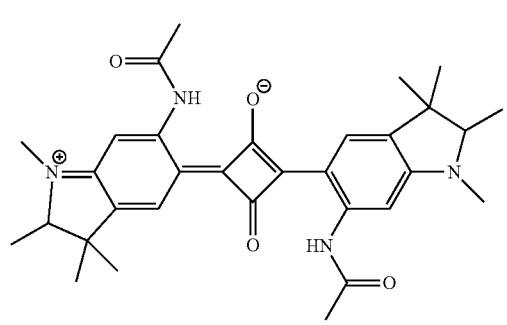
Q-39
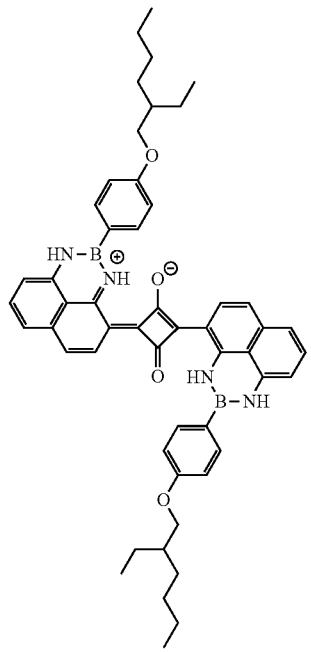
Q-40
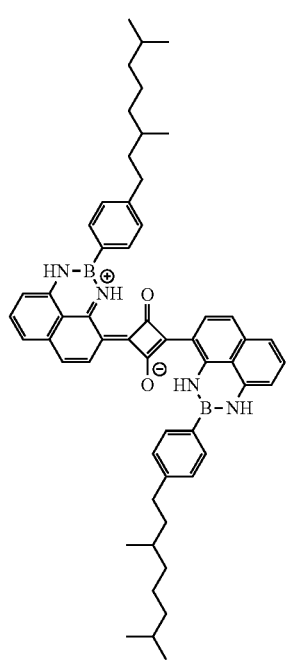

-continued
Q-41
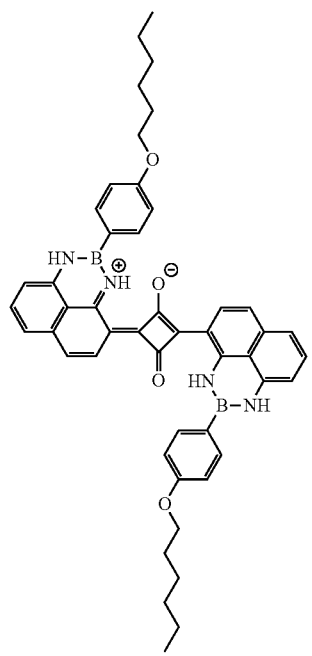
Q-42
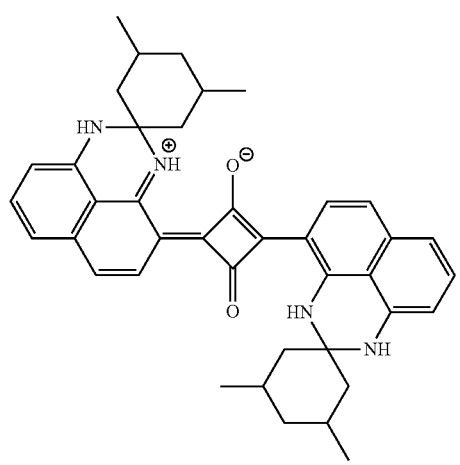
Q-43
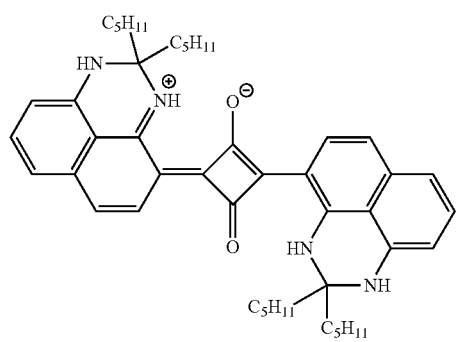
-continued
Q-44
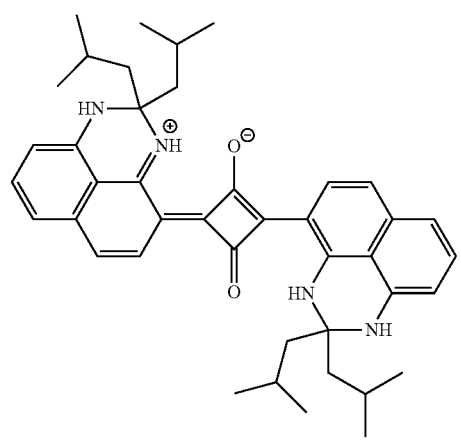
Q-45
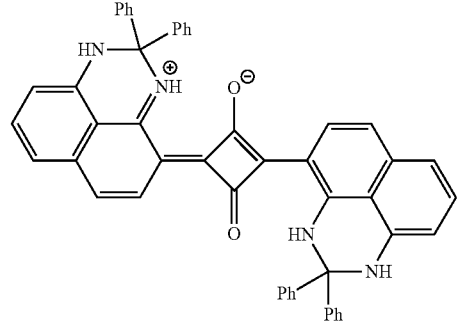
Q-46
Q-47
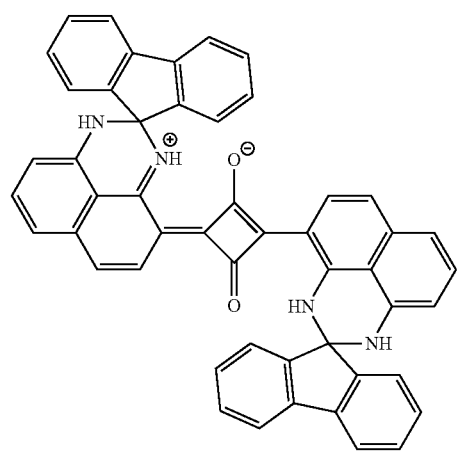

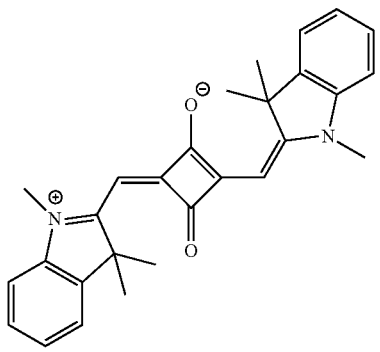 Q-48
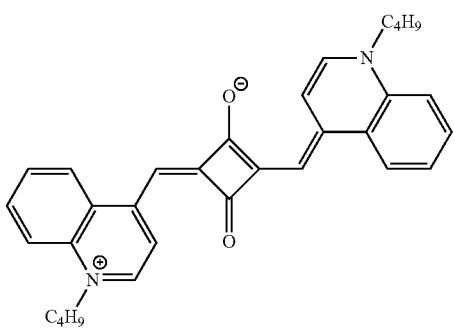 Q-52
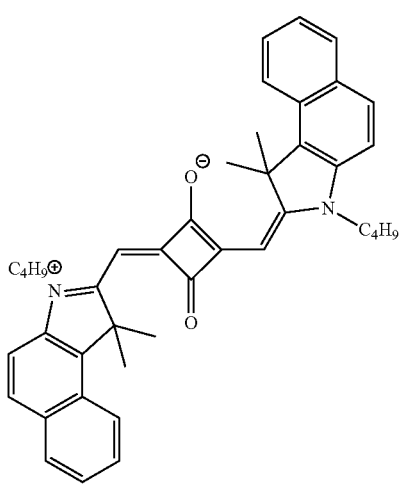 Q-49
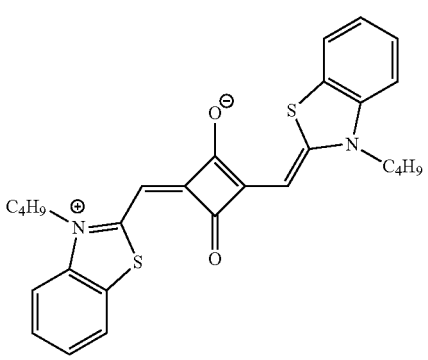 Q-53
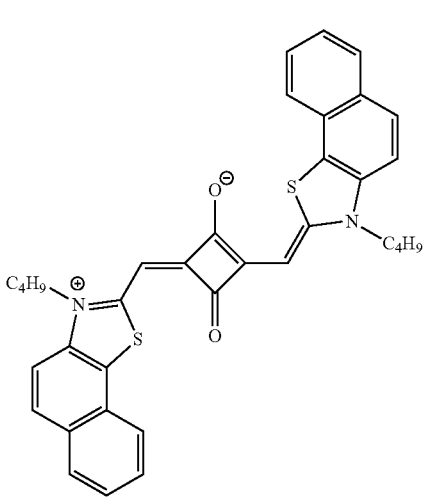 Q-54
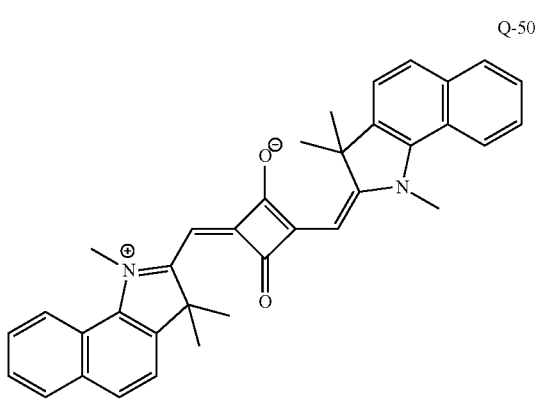 Q-50
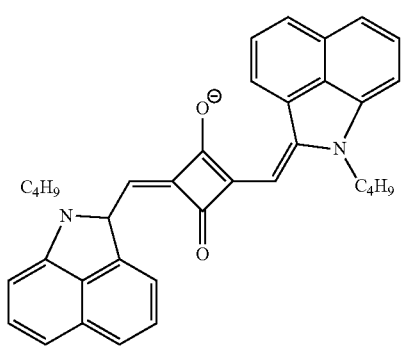 Q-51
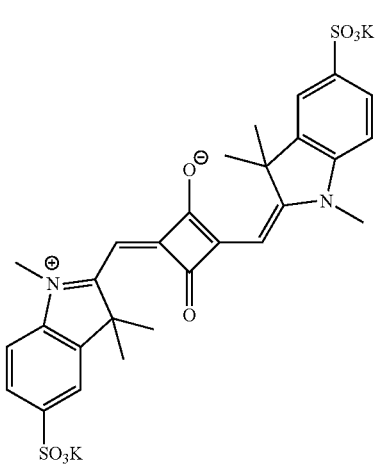 Q-55

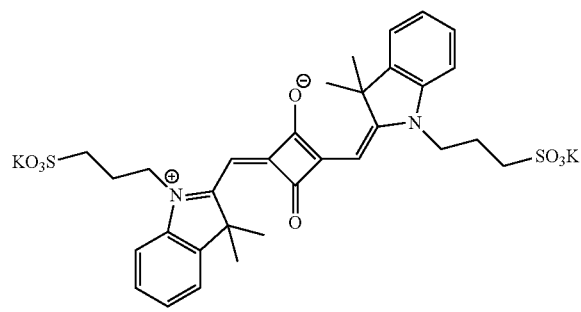
Q-56
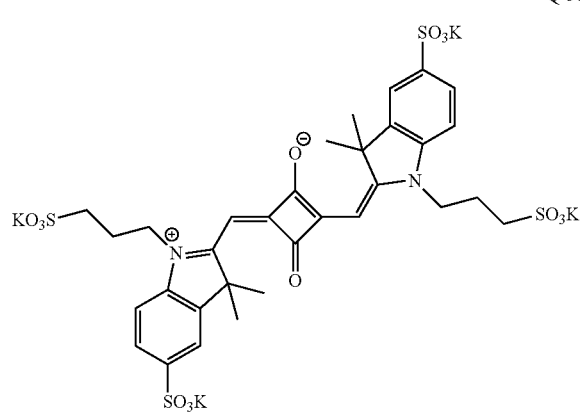
Q-57
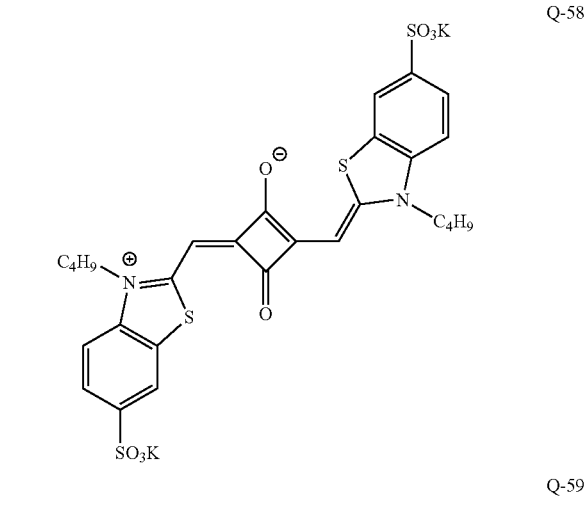
Q-58
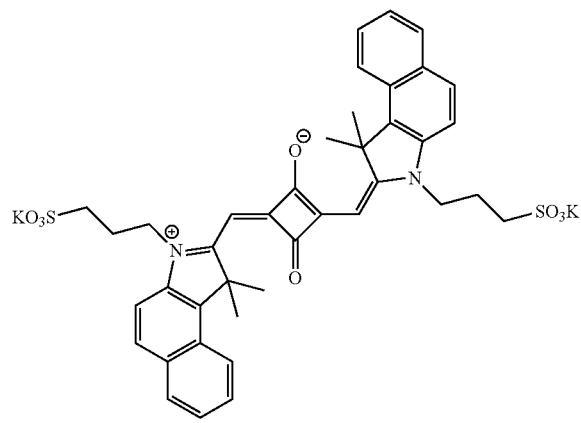
Q-59
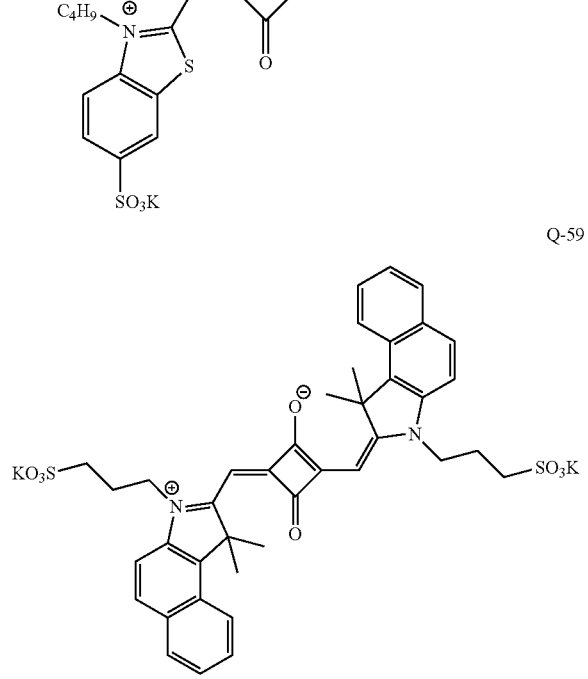
Q-60
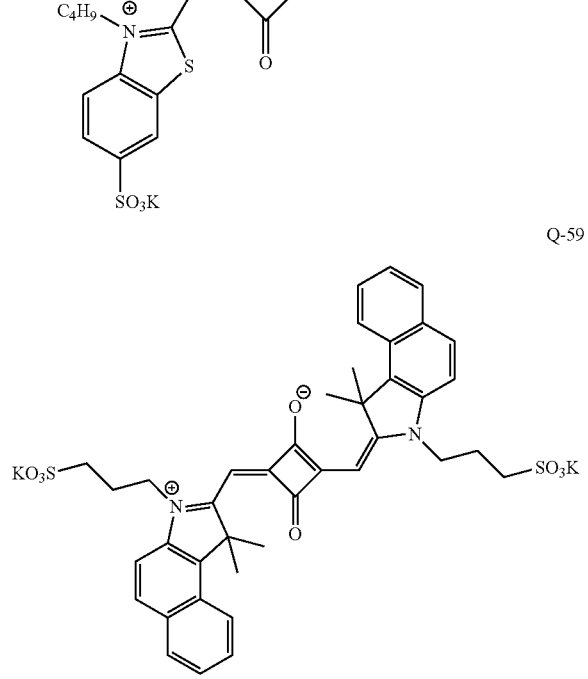
Q-61
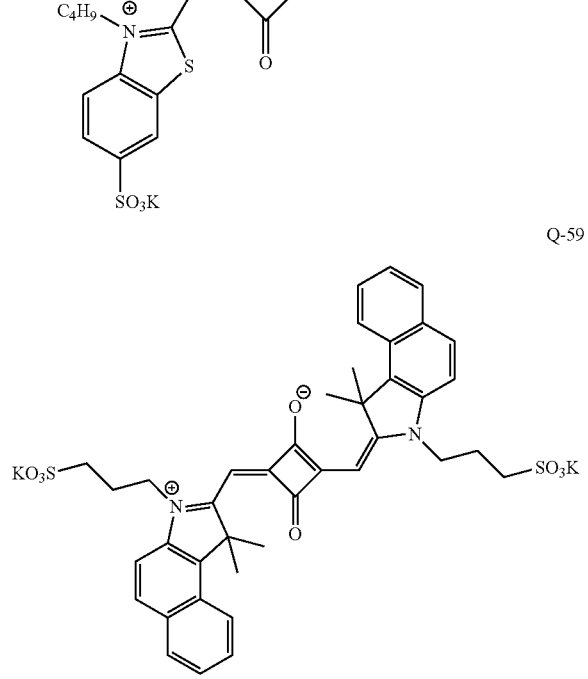
Q-62
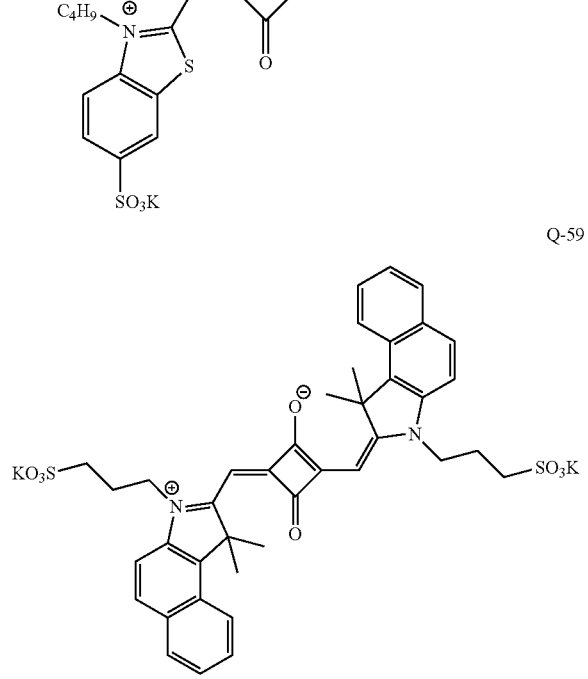
Q-63
<<<Cyanine Compound>>>
It is preferable that the cyanine compound is a compound represented by the following Formula (10).

Formula (10)

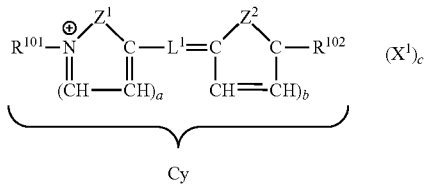

In the formula, $Z^1$ and $Z^2$ each independently represent a non-metal atomic group for forming a 5- or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

$Z^1$ and $Z^2$ each independently represent a non-metal atomic group for forming a 5- or 6-membered nitrogen-containing heterocycle which may be fused.

Another heterocycle, an aromatic ring, or an aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzoimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzoimidazole ring is preferable, and an indolenine ring, a benzothiazole ring, or a benzoimidazole ring is more preferable.

The nitrogen-containing heterocycle and a ring fused thereto may have a substituent. Examples of the substituent include a halogen atom, a cyano group, a nitro group, an alkyl group, an alkenyl group, an alkynyl group, an aralkyl group, an aryl group, a heteroaryl group, —$OR^{c1}$, —$COR^{c2}$, —$COOR^{c3}$, —$OCOR^{c4}$, —$NR^{c5}R^{c6}$, —$NHCOR^{c7}$, —$NHCONR^{c10}R^{c11}$, —$NHCOOR^{c12}$, —$SR^{c13}$, —$SO_2R^{c14}$, —$SO_2OR^{c15}$, —$NHSO_2R^{c16}$, and —$SO_2NR^{c17}R^{c18}$. $R^{c1}$ to $R^{c18}$ each independently represent a hydrogen atom, an alkyl group, an alkenyl group, an alkynyl group, an aryl group, or a heteroaryl group. In a case where $R^{c3}$ in —$COOR^{c3}$ represents a hydrogen atom (that is, a carboxy group), the hydrogen atom may be dissociable (that is, a carbonate group) or may be in the form of a salt. In a case where $R^{c15}$ in —$SO_2OR^{c15}$ represents a hydrogen atom (that is, a sulfo group), the hydrogen atom may be dissociable (that is, a sulfonate group) or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 12, and still more preferably 1 to 8. The alkyl group may be linear, branched, or cyclic. The alkyl group may be unsubstituted or may have a substituent. Examples of the substituent include a halogen atom, a hydroxy group, a carboxy group, a sulfo group, an alkoxy group, and an amino group. Among these, a carboxy group or a sulfo group is preferable, and a sulfo group is more preferable. In the carboxy group and the sulfo group, a hydrogen atom may be dissociable or may be in the form of a salt.

The number of carbon atoms in the alkenyl group is preferably 2 to 20, more preferably 2 to 12, and still more preferably 2 to 8. The alkenyl group may be linear, branched, or cyclic. The alkenyl group may be unsubstituted or may have a substituent. Examples of the substituent include the substituents which may be included in the alkyl group described above, and preferable ranges thereof are also the same.

The number of carbon atoms in the alkynyl group is preferably 2 to 20, more preferably 2 to 12, and still more preferably 2 to 8. The alkynyl group may be linear, branched, or cyclic. The alkynyl group may be unsubstituted or may have a substituent. Examples of the substituent include the substituents which may be included in the alkyl group described above, and preferable ranges thereof are also the same.

The number of carbon atoms in the aryl group is preferably 6 to 25, more preferably 6 to 15, and still more preferably 6 to 10. The aryl group may be unsubstituted or may have a substituent. Examples of the substituent include the substituents which may be included in the alkyl group described above, and preferable ranges thereof are also the same.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12. The heteroaryl group may have a substituent or may be unsubstituted. Examples of the substituent include the substituents which may be included in the alkyl group described above, and preferable ranges thereof are also the same.

$R^{101}$ and $R^{102}$ each independently represent an alkyl group, an alkenyl group, an alkynyl group, an aralkyl group, or an aryl group. Examples of the alkyl group, the alkenyl group, the alkynyl group, the aralkyl group, and the aryl group are as described above regarding the substituents, and preferable ranges thereof are also the same. The alkyl group, the alkenyl group, the alkynyl group, the aralkyl group, and the aryl group may have a substituent or may be unsubstituted. Examples of the substituent include a halogen atom, a hydroxy group, a carboxy group, a sulfo group, an alkoxy group, and an amino group. Among these, a carboxy group or a sulfo group is preferable, and a sulfo group is more preferable. In the carboxy group and the sulfo group, a hydrogen atom may be dissociable or may be in the form of a salt.

$L^1$ represents a methine chain including an odd number of methine groups. $L^1$ represents a methine chain including 3, 5, or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by the following Formula (a). In addition, two substituents in the methine chain may be bonded to each other to form a 5- or 6-membered ring.

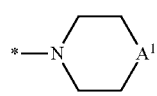

(a)

In Formula (a), * represents a linking portion to the methine chain, and $A^1$ represents an oxygen atom or a sulfur atom.

a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (10) will be shown below.

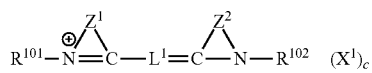

In a case where a site represented by Cy in Formula (10) is a cation site, $X^1$ represents an anion, and c represents the number of $X^1$'s for balancing charge. Examples of the anion include an halide ion (Cl$^-$, Br$^-$, I—), a p-toluenesulfonate ion, an ethyl sulfate ion, $PF_6^-$, $BF_4^-$ or $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), a tetracyano borate anion, and an anion represented by the following Formula A. In addition, as the tris(halogenoalkylsulfonyl)methide anion, an anion described in paragraph "0024" of JP2008-88426A can be used.

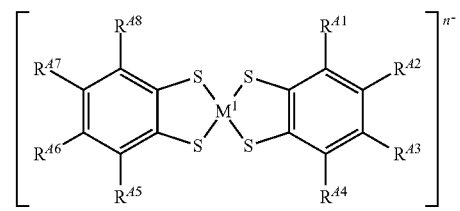

Formula A $M^1$ represents a transition metal, n represents an integer of 1 or 2, and $R^{41}$ to $R^{48}$ each independently represent a hydrogen atom or a substituent.

Examples of the transition metal include Cu, Co, Ni, Fe, Pd, Pt, Ti, V, Zn, Ru, Rh, and Zr. Among these, Cu, Co, Ni, Fe, Pd, or Pt is preferable, and Cu or Ni is more preferable.

Examples of the substituent include a halogen atom, a cyano group, a nitro group, an alkyl group, an alkenyl group, an alkynyl group, an aralkyl group, an aryl group, a heteroaryl group, —$OR^{201}$, —$COR^{202}$, —$COOR^{203}$, —$OCOR^{204}$, —$NR^{205}R^{206}$, —$NHCOR^{207}$, —$CONR^{208}R^{209}$, —$NHCONR^{210}R^{211}$, —$NHCOOR^{212}$, —$SR^{213}$, —$SO_2R^{214}$, —$SO_2OR^{215}$, —$NHSO_2R^{216}$, and —$SO_2NR^{217}R^{218}$. $R^{201}$ to $R^{218}$ each independently represent a hydrogen atom, an alkyl group, an alkenyl group, an alkynyl group, an aryl group, or a heteroaryl group. In a case where $R^{203}$ in —$COOR^{203}$ represents a hydrogen atom (that is, a carboxy group), the hydrogen atom may be dissociable or may be in the form of a salt. In a case where $R^{215}$ in —$SO_2OR^{215}$ represents a hydrogen atom (that is, a sulfo group), the hydrogen atom may be dissociable or may be in the form of a salt. Examples of the alkyl group, the alkenyl group, the alkynyl group, the aralkyl group, the aryl group, and the heteroaryl group are as described above regarding the substituents, and preferable ranges thereof are also the same.

The details of Formula A can be found in paragraphs "0030" to "0050" of JP2015-40895A, the content of which is incorporated herein by reference.

In a case where a site represented by Cy in Formula (10) is an anion site, $X^1$ represents a cation, and c represents the number of $X^1$'s for balancing charge. Examples of the cation include an alkali metal ion (for example, Li$^+$, Na$^+$, or K$^+$), an alkali earth metal ion ($Mg^{2+}$, $Ca^{2+}$, $Ba^{2+}$, or $Sr^{2+}$), a transition metal ion (for example, Ag$^+$, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidium ion, and diazabicycloundecenium. As the cation, Na$^+$, K$^-$, $Mg^{2+}$, $Ca^{2+}$, $Zn^{2+}$, or diazabicycloundecenium is preferable.

In a case where charge of a site represented by Cy in Formula (10) is neutralized in a molecule, $X^1$ is not present. That is, c represents 0.

It is preferable that the compound represented by Formula (10) is a compound represented by the following Formula (11) or (12). This compound has excellent heat resistance.

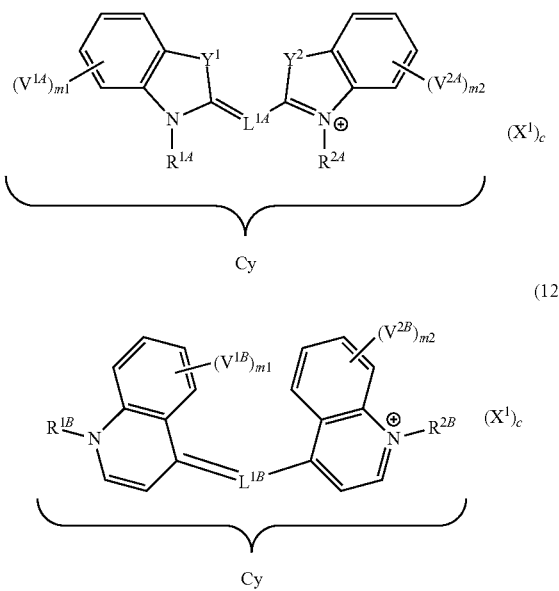

In Formulae (11) and (12), $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —NR$^{X1}$— or, —CR$^{X2}$R$^{X3}$—.

$R^{X1}$, $R^{X2}$, and $R^{X3}$ each independently represent a hydrogen atom or an alkyl group.

$V^{1A}$, $V^{2A}$, $V^{1B}$, and $V^{2B}$ each independently represent a halogen atom, a cyano group, a nitro group, an alkyl group, an alkenyl group, an alkynyl group, an aralkyl group, an aryl group, a heteroaryl group, —OR$^{c1}$, —COR$^{c2}$, —COOR$^{c3}$, —OCOR$^{c4}$, —NR$^{c5}$R$^{c6}$, —NHCOR$^{c7}$, —CONR$^{c8}$R$^{c9}$, —NHCONR$^{c10}$R$^{c11}$, —NHCOOR$^{c12}$, —SR$^{c13}$, —SO$_2$R$^{c14}$, —SO$_2$OR$^{c15}$, —NHSO$_2$R$^{c16}$, or —SO$_2$NR$^{c17}$R$^{c18}$. $V^{1A}$, $V^{2A}$, $V^{1B}$, and $V^{2B}$ may form a fused ring.

$R^{c1}$ to $R^{c18}$ each independently represent a hydrogen atom, an alkyl group, an alkenyl group, an alkynyl group, an aryl group, or a heteroaryl group.

In a case where $R^{c3}$ of —COOR$^{c3}$ represents a hydrogen atom and in a case where $R^{c15}$ of —SO$_2$OR$^{c15}$ represents a hydrogen atom, the hydrogen atom may be dissociable or may be in the form of a salt.

m1 and m2 each independently represent 0 to 4.

In a case where a site represented by Cy in the formula is a cation site, $X^1$ represents an anion, and c represents the number of $X^1$'s for balancing charge.

In a case where a site represented by Cy in the formula is an anion site, $X^1$ represents a cation, and c represents the number of $X^1$'s for balancing charge.

In a case where charge of a site represented by Cy in the formula is neutralized in a molecule, c represents 0.

The groups represented by $R^{1A}$, $R^{2A}$, $R^{1B}$, and $R^{2B}$ have the same definitions and the same preferable ranges as those of the alkyl group, the alkenyl group, the alkynyl group, the aralkyl group, and the aryl group described regarding $R^{101}$ and $R^{102}$ of Formula (10). These groups may be unsubstituted or may have a substituent. Examples of the substituent include a halogen atom, a hydroxy group, a carboxy group, a sulfo group, an alkoxy group, and an amino group. Among these, a carboxy group or a sulfo group is preferable, and a sulfo group is more preferable. In the carboxy group and the sulfo group, a hydrogen atom may be dissociable or may be in the form of a salt.

In a case where $R^{1A}$, $R^{2A}$, $R^{1B}$, and $R^{2B}$ represent an alkyl group, it is more preferable that the alkyl group is linear.

$Y^1$ and $Y^2$ each independently represent —S—, —O—, —NR$^{X1}$— or, —CR$^{X2}$R$^{X3}$— and preferably —NR$^{X1}$—.

$R^{X1}$, $R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group is still more preferably a methyl group or an ethyl group.

$L^{1A}$ and $L^{1B}$ have the same definitions and the same preferable ranges as those of $L^1$ in Formula (10).

The groups represented by $V^{1A}$, $V^{2A}$, $V^{1B}$, and $V^{2B}$ have the same ranges and definitions and the same preferable ranges as those of the substituents which may be included in the nitrogen-containing heterocycle represented by $Z^1$ and $Z^2$ in Formula (10).

m1 and m2 each independently represent 0 to 4 and preferably 0 to 2.

The anion and the cation represented by X1 have the same range and definitions and the same preferable ranges as those described regarding $X^1$ in Formula (10).

It is preferable that the compound represented by Formula (10) is a compound represented by any one of the following Formulae (10-1) to (10-6).

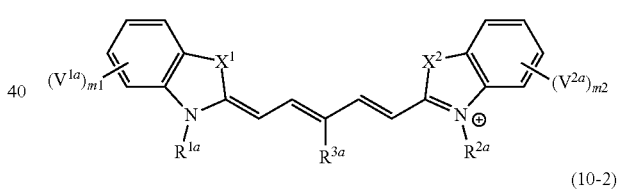

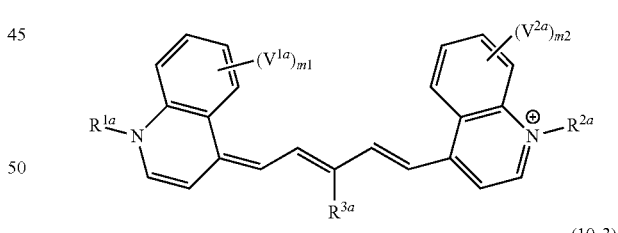

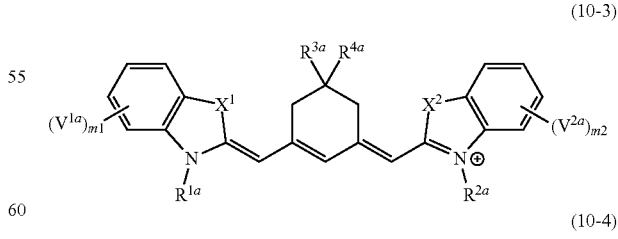

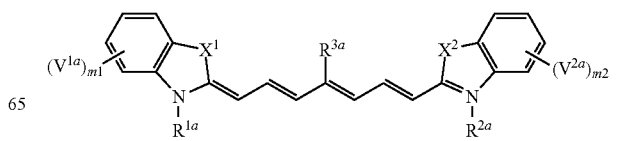

-continued (10-5)
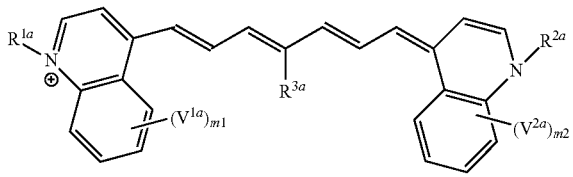

(10-6)
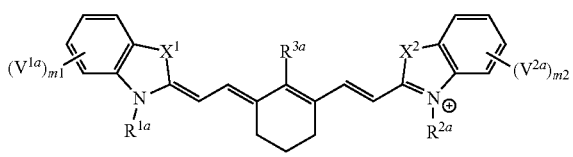

In Formulae (10-1) to (10-6), $R^{1a}$ and $R^{2a}$ each independently represent an alkyl group, an alkenyl group, an alkynyl group, an aralkyl group, or an aryl group.

$X^1$ and $X^2$ each independently represent —S—, —O—, —NR$^{X1}$— or, —CR$^{X2}$R$^{X3}$—.

$R^{X1}$, $R^{X2}$, and $R^{X3}$ each independently represent a hydrogen atom or an alkyl group.

$R^{1a}$ and $R^{4a}$ each independently represent a halogen atom, a cyano group, a nitro group, an alkyl group, an alkenyl group, an alkynyl group, an aralkyl group, an aryl group, a heteroaryl group, —OR$^{c1}$, —COR$^{c2}$, —COOR$^{c3}$, —OCOR$^{c4}$, —NR$^{c5}$R$^{c6}$, —NHCOR$^{c7}$, —CONR$^{c8}$R$^{c9}$, —NHCONR$^{c10}$R$^{c11}$, —NHCOOR$^{c12}$, —SR$^{c13}$, —SO$_2$R$^{c14}$, —SO$_2$OR$^{c15}$, —NHSO$_2$R$^{c16}$, —SO$_2$NR$^{c17}$R$^{c18}$, or a group represented by the following Formula (a).

$V^{1a}$ and $V^{2a}$ each independently represent a halogen atom, a cyano group, a nitro group, an alkyl group, an alkenyl group, an alkynyl group, an aralkyl group, an aryl group, a heteroaryl group, —OR$^{c1}$, —COR$^{c2}$, —COOR$^{c3}$, —OCOR$^{c4}$, —NR$^{c5}$R$^{c6}$, —NHCOR$^{c7}$, —CONR$^{c8}$R$^{c9}$, —NHCONR$^{c10}$R$^{c11}$, —NHCOOR$^{c12}$, —SR$^{c13}$, —SO$_2$R$^{c14}$, —SO$_2$OR$^{c15}$, —NHSO$_2$R$^{c16}$, or —SO$_2$NR$^{c17}$R$^{c18}$.

$V^{1a}$ and $V^{2a}$ may form a fused ring.

$R^{c1}$ to $R^{c18}$ each independently represent a hydrogen atom, an alkyl group, an alkenyl group, an alkynyl group, an aryl group, or a heteroaryl group.

In a case where $R^{c3}$ of —COOR$^{c3}$ represents a hydrogen atom and in a case where $R^{c15}$ of —SO$_2$OR$^{C15}$ represents a hydrogen atom, the hydrogen atom may be dissociable or may be in the form of a salt.

m1 and m2 each independently represent 0 to 4.

(a)
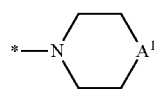

In Formula (a), * represents a linking portion to the methine chain, and $A^1$ represents an oxygen atom or a sulfur atom.

The groups represented by $R^{1a}$ and $R^{2a}$ have the same definitions and the same preferable ranges as those of $R^{1A}$ and $R^{1B}$ in Formula (11). In a case where $R^{1a}$ and $R^{2a}$ represent an alkyl group, it is more preferable that the alkyl group is linear.

$X^1$ and $X^2$ have the same definitions and the same preferable ranges as those of $Y^1$ and $Y^2$ in Formula (11).

$R^{3a}$ and $R^{4a}$ have the same ranges and definitions and the same preferable ranges as those of the substituents which may be included in $L^1$ in Formula (10).

The groups represented by $V^{1a}$, and $V^{2a}$ have the same ranges and definitions and the same preferable ranges as those of the substituents which may be included in the nitrogen-containing heterocycle or the ring fused thereto in Formula (10).

m1 and m2 each independently represent 0 to 4 and preferably 0 to 2.

It is preferable that the cyanine compound is a compound having an anion represented by Formula A described above and a cation represented by any one of Formulae (II-1) to (II-3).

(II-1)
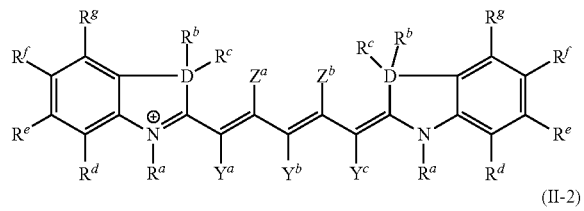

(II-2)
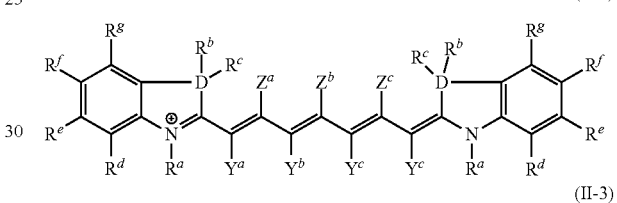

(II-3)
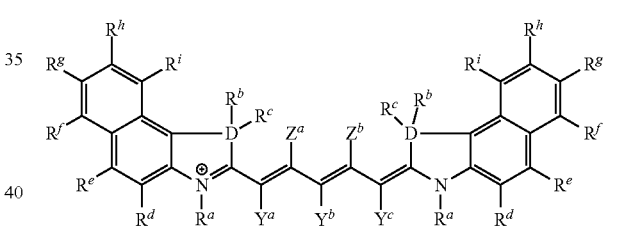

In Formulae (II-1) to (II-3), a plurality of D's each independently represent a carbon atom, a nitrogen atom, an oxygen atom, or a sulfur atom, a plurality of $R^a$'s to $R^i$'s each independently represent a hydrogen atom or a substituent, $R_b$ and $R_c$, $R_d$ and $R_e$, $R_e$ and $R_f$, $R_f$ and $R_g$, $R_g$ and $R_h$, or $R_h$ and $R_i$ may be bonded to each other to form a ring, $Z^a$ to $Z^c$ and $Y^a$ to $Y^d$ each independently represent a hydrogen atom or a substituent, and two adjacent selected Z's or Y's may be bonded to each other to form a ring. Examples of the substituent include the above-described substituents.

The details of Formulae (II-1) to (II-3) can be found in paragraphs "0051" to "0064" of JP2015-40895A, the content of which is incorporated herein by reference.

It is preferable that the cyanine compound is a compound represented by the following Formula (III).

(III)
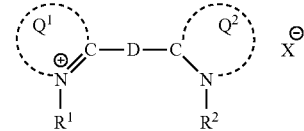

In the formula, $Q^1$ and $Q^2$ each independently represent a nitrogen-containing fused heterocycle which may have a substituent, $R^1$ and $R^2$ each independently an alkyl group which may have a substituent or an alkenyl group which may have a substituent, D represents a linking group for forming mono-, di-, or tri-carbocyanine, and $X^-$ represents a tris(halogenoalkylsufonyl)methide anion.

Examples of the substituent include the above-described substituents. Examples of the nitrogen-containing fused heterocycle represented by $Q^1$ and $Q^2$ include the following Formulae (IV-1) to (IV-5).

(IV-1)
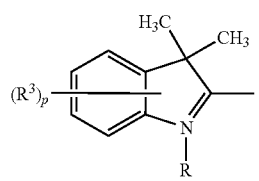

(IV-2)
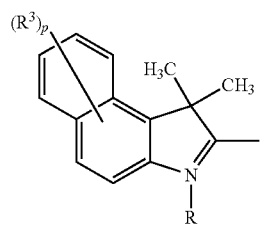

(IV-3)
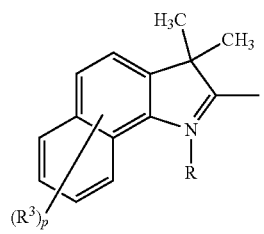

(IV-4)
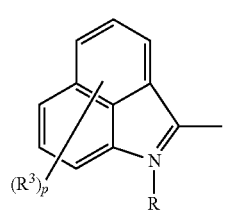

(IV-5)
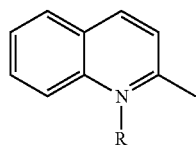

R has the same definition as that of $R^1$ and $R^2$, $R^3$ represents a halogen atom, an alkyl group, an alkoxy group, or a nitro group, and p represents an integer of 0 to 2. It should be noted that, in the case of the nitrogen-containing fused heterocycle represented by $Q^2$, the formula be read as a corresponding structural formula.

Specific examples of the compound represented by Formula (10) will be shown as follows. In the following tables, Me represents a methyl group, Et represents an ethyl group, Bu represents a butyl group, Bn represents a benzyl group, Ph represents a phenyl group, PRS represents $C_3H_6SO_3-$, and BUS represents $C_4H_9SO_3-$. In addition, numerical values added to structural formulae in the tables represent binding sites of $V^1$ and $V^2$.

In addition, other examples include a compound described in paragraphs "0044" and "0045" of JP2009-108267A, a compound represented by paragraph "0149" of JP2014-214262A, a compound described in paragraphs "0051" to "0068" of JP2015-40895A, and a compound described in paragraphs "0047" to "0052" and "0063" of JP2008-88426A, the contents of which are incorporated herein by reference.

C-1
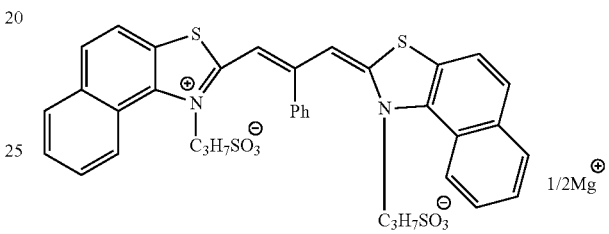

C-2
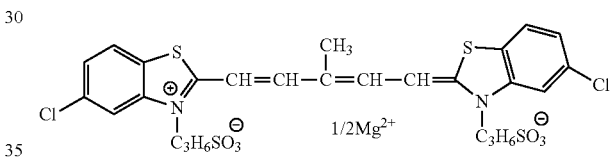

C-3
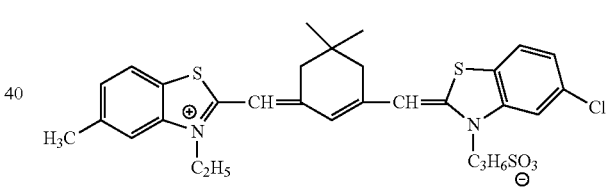

C-4
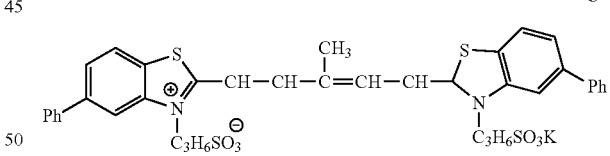

C-5
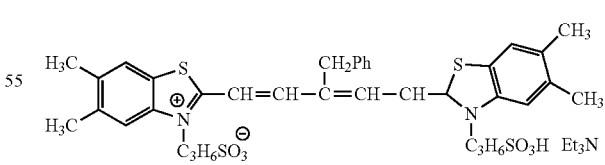

C-6
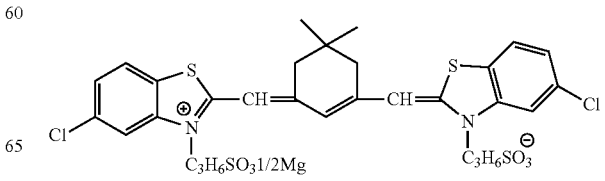

-continued
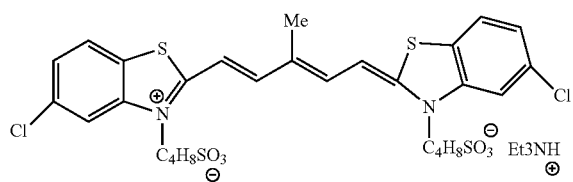
C-7
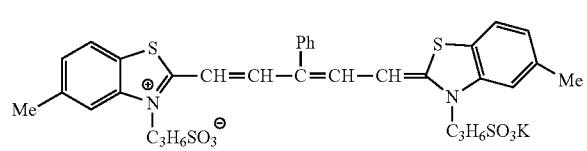
C-8
TABLE 1
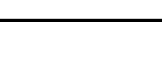
| Compound No. | R | L | $V^1$ | m | M |
|---|---|---|---|---|---|
| C-9 | PRS | | 5:Cl | 1 | K |
| C-10 | PRS | | 5:Cl | 1 | K |
| C-11 | PRS | | 6:Cl | 1 | K |
| C-12 | BUS | | 5:COOH | 1 | K |
| C-13 | PRS | | 5:Cl | 1 | Na |
TABLE 1-continued
| Compound No. | R | L | $V^1$ | m | M |
|---|---|---|---|---|---|
| C-14 | PRS | | 5:Cl | 1 | 1/2Mg |
TABLE 2
| Compound No. | R1 | R2 | $V^1$ | m | M |
|---|---|---|---|---|---|
| C-15 | PRS | Et | 5:Cl 6:Cl | 2 | Na |
| C-16 | PRS | Me | 5:Cl 6:Cl | 2 | K |
| C-17 | BUS | Et | 5:Cl 6:Cl | 2 | K |
| C-18 | BUS | CF$_3$CH$_2$ | 5:Cl 6:Cl | 2 | 1/2Ca |
| C-19 | PRS | Et | 5:Cl 6:Cl | 2 | K |
| C-20 | PRS | Et | 5:Cl 6:Cl | 2 | 1/2Mg |
| C-21 | BUS | Et | 5:Cl 6:Cl | 2 | Na |
| C-22 | PRS | Me | 5:Cl 6:Cl | 2 | |
| C-23 | PRS | | 5:Cl 6:Cl | 2 | Na |
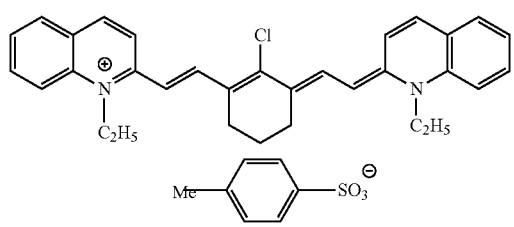
C-24
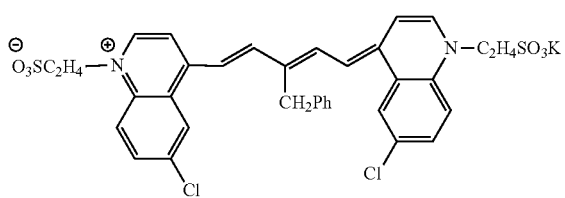
C-25

C-26
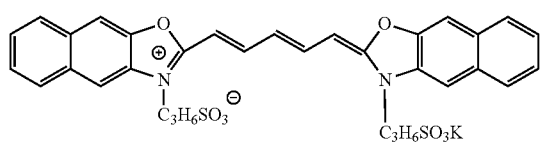
C-27
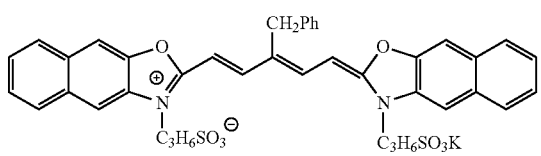
C-28
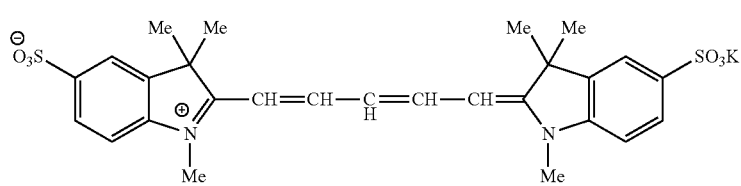
C-29
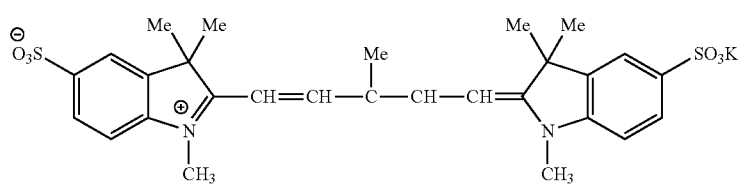
C-30
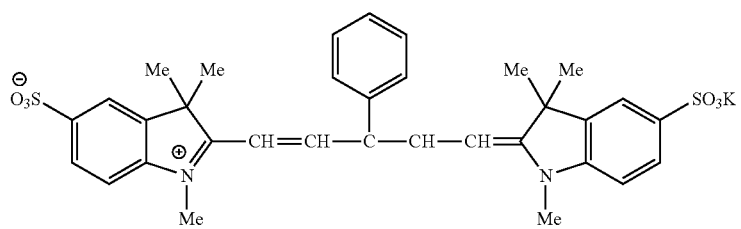
C-31
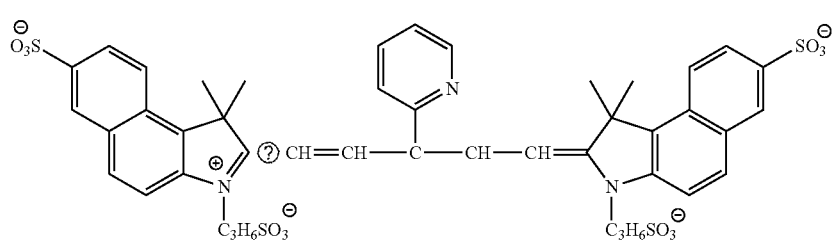
C-32
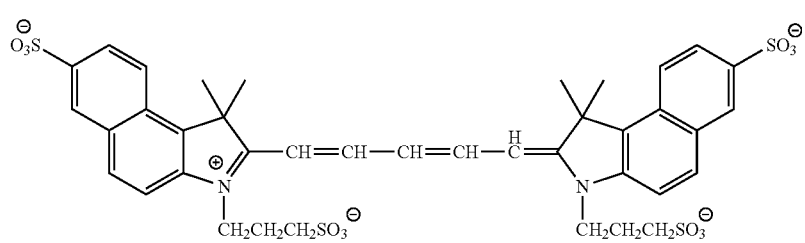

-continued
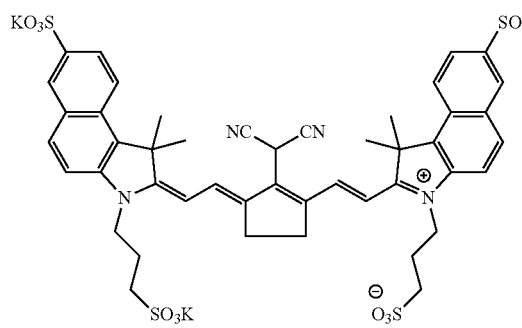
C-33
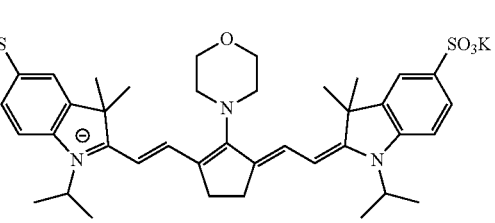
C-34
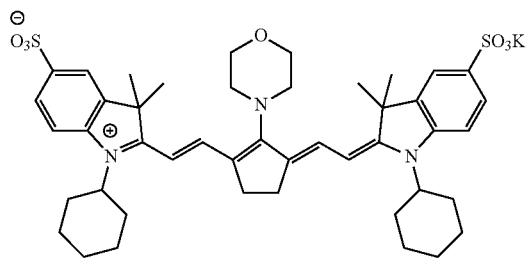
C-35
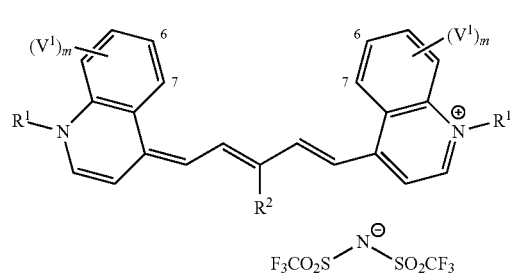
C-36
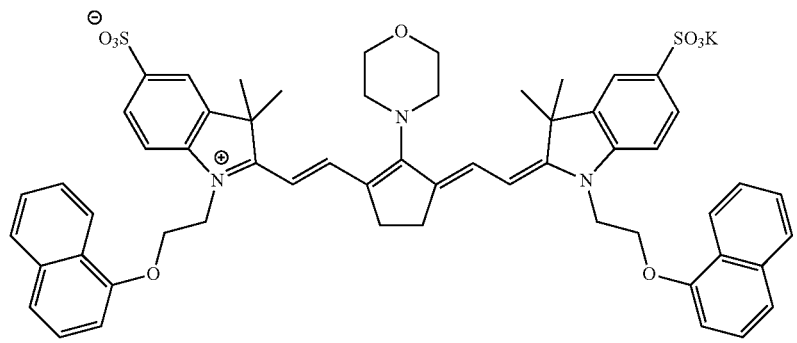
C-37
TABLE 3
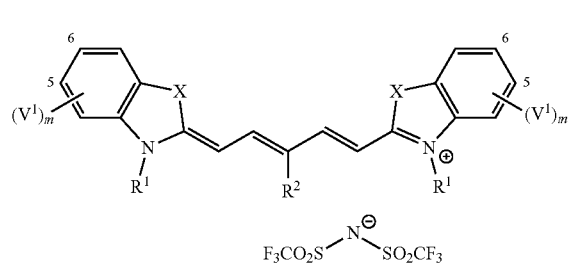
| Compound No. | X | R¹ | R² | V¹ | m |
|---|---|---|---|---|---|
| S-1 | S | Et | H | — | 0 |
| S-2 | O | Et | Me | — | 0 |
| S-3 | N—Et | Et | H | 5:Cl 6:Cl | 2 |
| S-4 | S | n-Bu | Bn | 5:Cl | 1 |
TABLE 4
| Compound No. | R¹ | R² | V¹ | m |
|---|---|---|---|---|
| S-5 | Et | H | — | 0 |
| S-6 | Et | Me | — | 0 |
| S-7 | Et | Bn | 6:Cl 7:Cl | 2 |
| S-8 | n-Bu | Bn | 6:Cl | 1 |

TABLE 5
| Compound No. | X | R¹ | R² | R³ | V¹ | m |
|---|---|---|---|---|---|---|
| S-9  | S | Et   | H  | H  | —    | 0 |
| S-10 | O | Et   | H  | Me | —    | 0 |
| S-11 | S | Et   | Me | Me | 5:MeO| 1 |
| S-12 | S | n-Bu | H  | Ph | 5:Cl | 1 |
TABLE 6
| Compound No. | X | R¹ | R² | V¹ | m1 | V² | m2 |
|---|---|---|---|---|---|---|---|
| S-13 | S | Et   | H  | —    | 0 | —    | 0 |
| S-14 | O | Et   | H  | 5:Cl | 1 | —    | 0 |
| S-15 | S | Et   | Me | 5:MeO| 1 | 5:MeO| 1 |
| S-16 | S | n-Bu | Bn | 5:Cl | 1 | 5:Cl | 1 |
TABLE 7
| Compound No. | R¹ | R² | V¹ | m |
|---|---|---|---|---|
| S-17 | Et   | H  | —    | 0 |
| S-18 | Et   | Me | —    | 0 |
| S-19 | Et   | Bn | 6:Cl, 7:Cl | 2 |
| S-20 | n-Bu | Bn | 6:Cl | 1 |
TABLE 8
| Compound No. | X | R¹ | R² | R³ | V¹ | m |
|---|---|---|---|---|---|---|
| S-21 | S | Et   | Et   | H  | —    | 0 |
| S-22 | O | Et   | Et   | Cl | —    | 0 |
| S-23 | S | n-Bu | n-Bu | H  | 5:MeO| 1 |
| S-24 | S | Et   | Et   | Ph | 5:Cl | 1 |
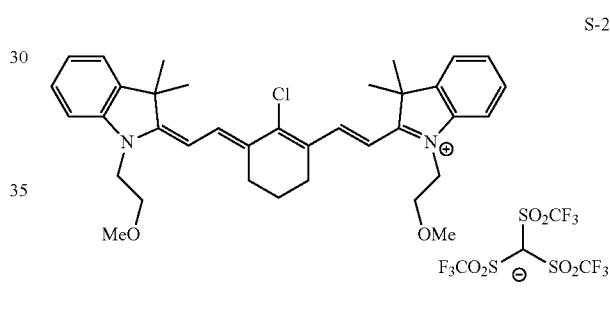
S-25
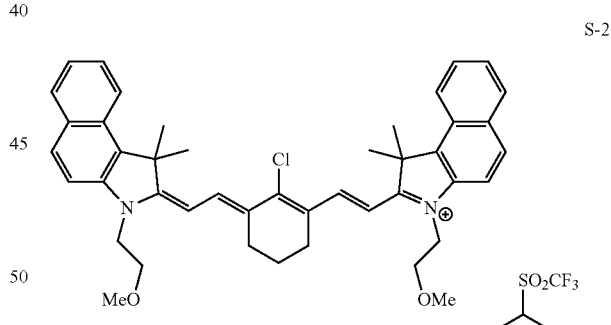
S-26
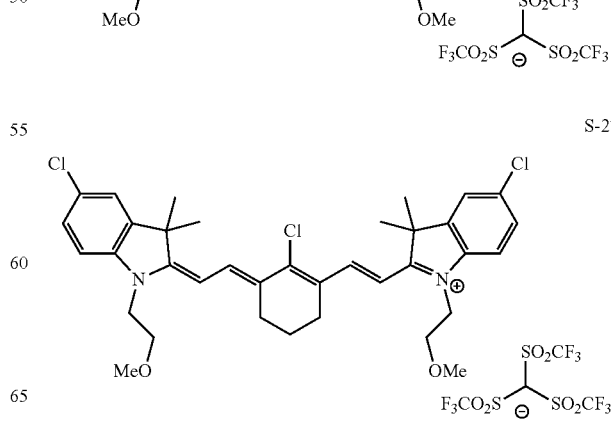
S-27

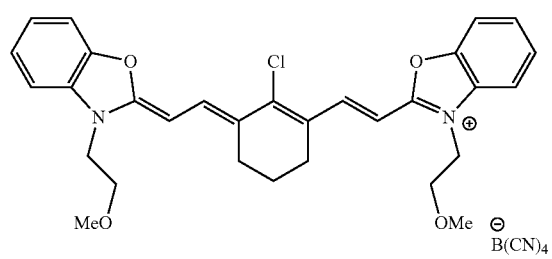
S-28
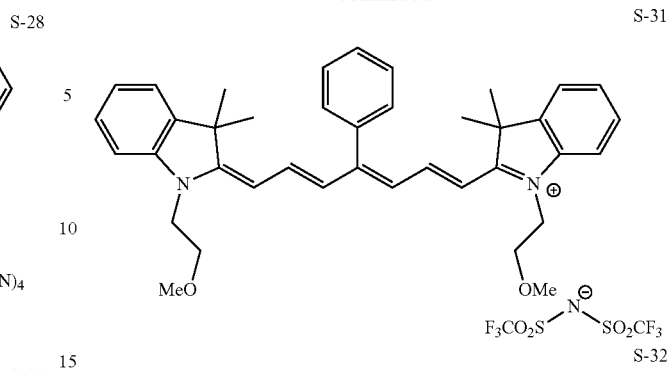
S-31
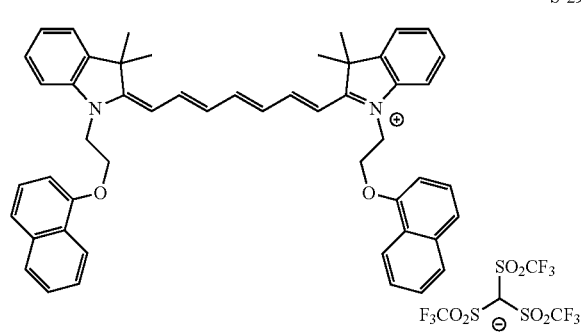
S-29
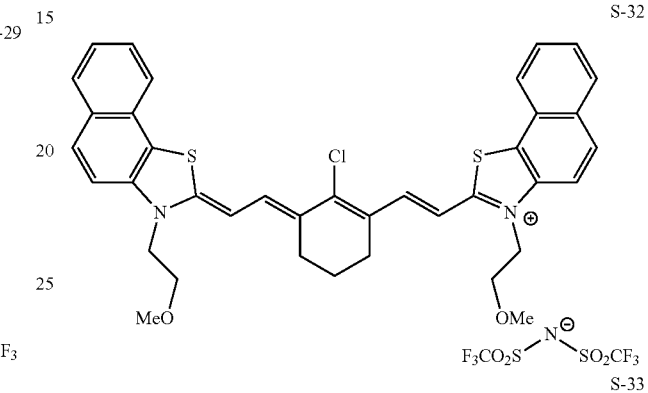
S-32
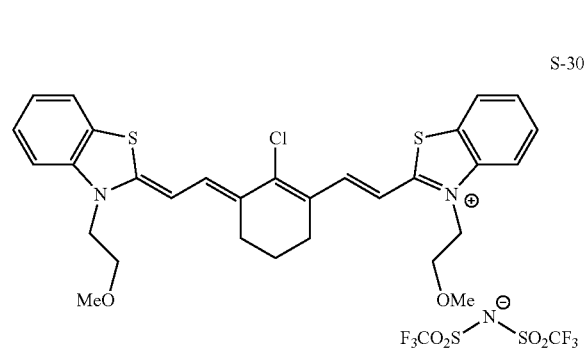
S-30
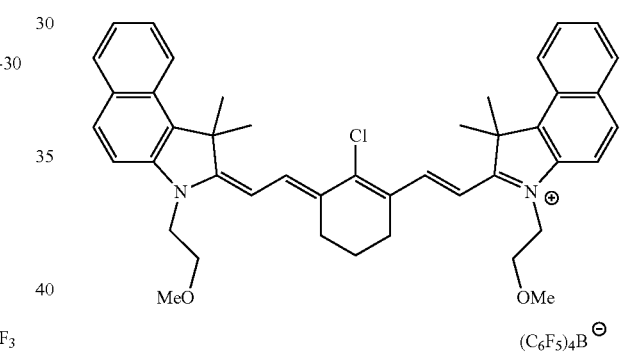
S-33
TABLE 9
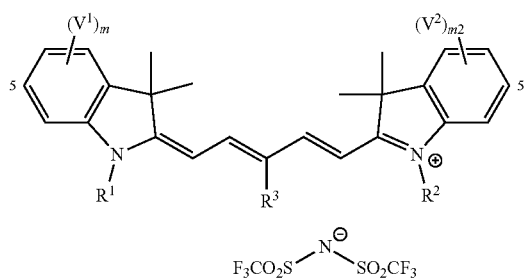
| Compound No. | $R^1$ | $R^2$ | $R^3$ | $V^1$ | $m1$ | $V^2$ | $m2$ |
|---|---|---|---|---|---|---|---|
| I-1 | Et | Et | H | — | 0 | — | 0 |
| I-2 | $CH_2CH_2OMe$ | $CH_2CH_2OMe$ | H | — | 0 | — | 0 |

TABLE 9-continued

| Compound No. | R¹ | R² | R³ | V¹ | m1 | V² | m2 |
|---|---|---|---|---|---|---|---|
| I-3 | | | | | | | |
| I-4 | Et | Et | Me | 5:Cl | 1 | 5:Cl | 1 |

TABLE 10

| Compound No. | R¹ | R² | R³ | V¹ | m1 | V² | m2 |
|---|---|---|---|---|---|---|---|
| I-5 | Et | Et | H | — | 0 | — | 0 |
| I-6 | CH₂CH₂OMe | CH₂CH₂OMe | H | — | 0 | — | 0 |
| I-7 | | | | | | | |
| I-8 | Et | Et | Me | 5:Cl | 1 | 5:Cl | 1 |

TABLE 11

| Compound No. | R¹ | R² | R³ | V¹ | m1 | V² | m2 |
|---|---|---|---|---|---|---|---|
| I-9 | Et | Et | H | — | 0 | — | 0 |
| I-10 | $CH_2CH_2OMe$ | $CH_2CH_2OMe$ | H | — | 0 | — | 0 |
| I-11 | | | | | | | |
| I-12 | Et | Et | Cl | 6:MeO | 1 | 6:MeO | 1 |

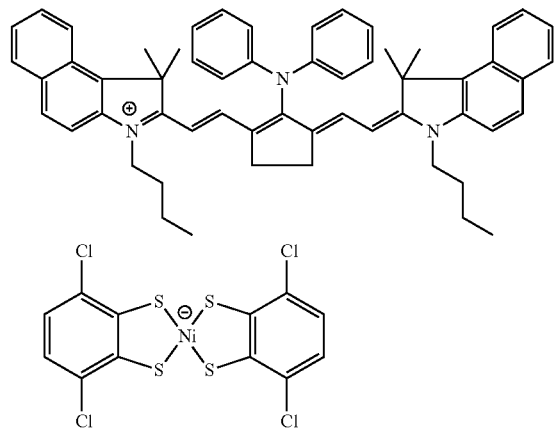

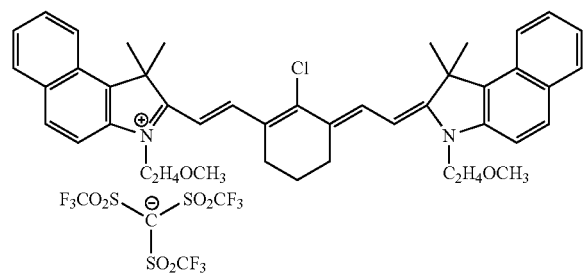

The content of the infrared absorber in the coloring composition according to the present invention is preferably 10 to 200 parts by mass, more preferably 20 to 150 parts by mass, and still more preferably 30 to 80 parts by mass with respect to 100 parts by mass of the coloring material that shields light in the visible range.

The content of the infrared absorber in the coloring composition according to the present invention is preferably 1 to 60 mass % and more preferably 10 to 40 mass % with respect to the total solid content of the coloring composition.

In the coloring composition according to the present invention, as the infrared absorber, one infrared absorber may be used alone, or two or more infrared absorbers may be used in combination. In a case where two or more infrared absorbers are used in combination, it is preferable that the total content of the infrared absorbers is in the above-described range.

<<Coloring Material that Shields Light in Visible Range>>

Next, the coloring material that shields light in the visible range will be described.

In the present invention, it is preferable that the coloring material that shields light in the visible range is a material that absorbs light in a wavelength range of violet to red.

In addition, in the present invention, it is preferable that the coloring material that shields light in the visible range is a material that shields light in a wavelength range of 450 to 650 nm.

In the present invention, it is preferable that the coloring material that shields light in the visible range satisfies at least one of the following requirement (1) or (2).

(1) The coloring material that shields light in the visible range includes two or more chromatic colorants, and a combination of the two or more chromatic colorants forms black.

(2) The coloring material that shields light in the visible range includes an organic black colorant. In the aspect (2), it is preferable that the coloring material that shields light in the visible range further includes a chromatic colorant.

In the present invention, the chromatic colorant denotes a colorant other than a white colorant and a black colorant. It is preferable that the chromatic colorant is a colorant having an absorption maximum in a wavelength range of 400 to 700 nm. In addition, "having an absorption maximum in a wavelength range of 400 to 700 nm" represents having a maximum absorbance in a wavelength range of 400 to 700 nm in an absorption spectrum. For example, in an absorption spectrum in a wavelength range of 350 to 1300 nm, it is preferable that the chromatic colorant has a maximum absorbance in a wavelength range of 400 to 700 nm.

In addition, in the present invention, the organic black colorant as the coloring material that shields light in the visible range denotes a material that absorbs visible light and allows transmission of at least a part of infrared light. Accordingly, in the present invention, the organic black colorant as the coloring material that shields light in the visible range does not denote a black colorant that absorbs both visible light and infrared light, for example, carbon black or titanium black.

In the present invention, it is preferable that the coloring material that shields light in the visible range is a material in which a ratio A/B of a minimum value A of an absorbance in a wavelength range of 450 to 650 nm to a maximum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants. In addition, in the aspect (2), the spectral characteristics may be satisfied using an organic black colorant. In addition, the spectral characteristics may be satisfied using a combination of an organic black colorant and a chromatic colorant.

(Chromatic Colorant)

In the present invention, the chromatic colorant is selected from the group consisting of a red colorant, a green colorant, a blue colorant, a yellow colorant, a violet colorant, and an orange colorant.

In the present invention, the chromatic colorant may be a pigment or a dye. It is preferable that the chromatic colorant is a pigment.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution.

The pigment having a secondary particle size and a particle size distribution of secondary particles in the above-described ranges can be prepared by mixing and dispersing a pigment mixed solution while pulverizing the pigment mixed solution using a pulverizer such as a beads mill or a roll mill, the pigment mixed solution being obtained by mixing a commercially available pigment and another pigment (having an average particle size of secondary particles of more than 300 nm), which is optionally used, with a resin and an organic solvent. The pigment obtained as described above is typically in the form of a pigment dispersion.

The pigment is preferably an organic pigment, and examples thereof are as follows. However, the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In addition, as the dye, an acid dye and/or a derivative thereof may be suitably used.

Furthermore, for example, a direct dye, a basic dye, a mordant dye, an acid mordant dye, an azoic dye, a dispersed dye, an oil-soluble dye, a food dye, and/or a derivative thereof can be suitably used.

Specific examples of the acid dye are shown below, but the present invention is not limited to these examples. For example, the following dyes and derivatives thereof can be used:

acid alizarin violet N;
acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1;
acid chrome violet K;
acid Fuchsin and acid green 1, 3, 5, 9, 16, 25, 27, and 50;
acid orange 6, 7, 8, 10, 12, 50, 51, 52, 56, 63, 74, and 95;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;
acid violet 6B, 7, 9, 17, and 19;
acid yellow 1, 3, 7, 9, 11, 17, 23, 25, 29, 34, 36, 42, 54, 72, 73, 76, 79, 98, 99, 111, 112, 114, 116, 184, and 243; and
Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is at least one selected from the group consisting of a triarylmethane dye, an anthraquinone dye, an azomethine dye, a benzylidene dye, an oxonol dye, a cyanine dye, a phenothiazine dye, a pyrrolopyrazole azomethine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

In a case where a combination of two or more chromatic colorants forms black, examples of the combination of chromatic colorants are as follows.

(1) An aspect in which the coloring material that shields light in the visible range includes a yellow colorant, a blue colorant, a violet colorant, and a red colorant (2) An aspect in which the coloring material that shields light in the visible range includes a yellow colorant, a blue colorant, and a red colorant (3) An aspect in which the coloring material that shields light in the visible range includes a yellow colorant, a violet colorant, and a red colorant (4) An aspect in which the coloring material that shields light in the visible range includes a yellow colorant and a violet colorant (5) An aspect in which the coloring material that shields light in the visible range includes a green colorant, a blue colorant, a violet colorant, and a red colorant (6) An aspect in which the coloring material that shields light in the visible range includes a violet colorant and an orange colorant (7) An aspect in which the coloring material that shields light in the visible range includes a green colorant, a violet colorant, and a red colorant (8) An aspect in which the coloring material that shields light in the visible range includes a green colorant and a red colorant Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

TABLE 12

| No. | Yellow Colorant | Green Colorant | Blue Colorant | Violet Colorant | Red Colorant | Orange Colorant |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

(Organic Black Colorant)

In the present invention, examples of the organic black colorant include a bisbenzofuranone compound, an azomethine compound, a perylene compound, and an azo compound. Among these, a bisbenzofuranone compound or a perylene compound is preferable.

Examples of the bisbenzofuranone compound include compounds described in JP2010-534726A, JP2012-515233A, and JP2012-515234A. For example, "Irgaphor Black" (manufactured by BASF SE) is available.

Examples of the perylene compound include C.I. Pigment Black 31 and 32.

Examples of the azomethine compound include compounds described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available.

The azo compound is not particularly limited, and for example, a compound represented by the following Formula (A-1) can be suitably used.

A-1

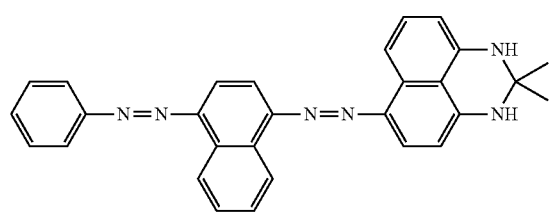

In the present invention, it is preferable that the bisbenzofuranone compound is one of the following compounds represented by the following formulae or a mixture thereof.

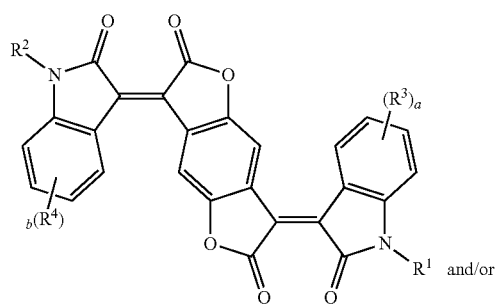
and/or

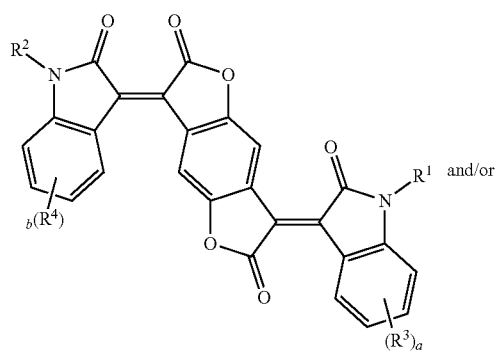
and/or

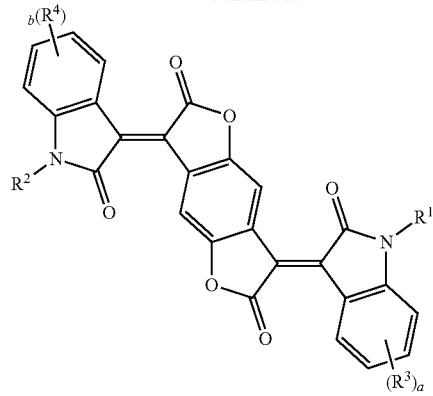

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, —$OR^{301}$, —$COR^{302}$, —$COOR^{303}$, —$OCOR^{304}$, —$NR^{305}R^{306}$, —$NHCOR^{307}$, —$CONR^{308}R^{309}$, —$NHCONR^{310}R^{311}$, —$NHCOOR^{312}$, —$SR^{313}$, —$SO_2R^{314}$, —$SO_2OR^{315}$, —$NHSO_2R^{316}$, or —$SO_2NR^{317}R^{318}$. $R^{301}$ to $R^{318}$ each independently represent a hydrogen atom, an alkyl group, an alkenyl group, an alkynyl group, an aryl group, or a heteroaryl group.

Examples of the halogen atom include a fluorine atom, a chlorine atom, a bromine atom, and an iodine atom.

The number of carbon atoms in the alkyl group is preferably 1 to 12. The alkyl group may be linear, branched, or cyclic.

The number of carbon atoms in the alkenyl group is preferably 2 to 12. The alkenyl group may be linear, branched, or cyclic.

The number of carbon atoms in the alkynyl group is preferably 2 to 12. The alkynyl group may be linear, branched, or cyclic.

The number of carbon atoms in the aryl group is preferably 6 to 12.

The number of carbon atoms in the alkyl group is preferably 1 to 20, more preferably 1 to 12, and still more preferably 1 to 8. The alkyl group may be linear, branched, or cyclic.

The number of carbon atoms in the alkenyl group is preferably 2 to 20, more preferably 2 to 12, and still more preferably 2 to 8. The alkenyl group may be linear, branched, or cyclic.

The number of carbon atoms in the alkynyl group is preferably 2 to 20, more preferably 2 to 12, and still more preferably 2 to 8. The alkynyl group may be linear, branched, or cyclic.

The number of carbon atoms in the aryl group is preferably 6 to 25, more preferably 6 to 15, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12.

The details of the bisbenzofuranone compound can be found in paragraphs "0014" to "0037" of JP2010-534726A, the content of which is incorporated herein by reference.

In the present invention, in a case where an organic black colorant is used as the coloring material that shields light in the visible range, it is preferable that the organic black colorant is used in combination of a chromatic colorant. By using the organic black colorant in combination of a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination.

In addition, regarding a mixing ratio between the chromatic colorant and the organic black colorant, the amount of the organic black colorant is preferably 10 to 200 parts by mass and more preferably 15 to 150 parts by mass with respect to 100 parts by mass of the organic black colorant.

In the present invention, the content of the pigment in the coloring material that shields light in the visible range is preferably 95 mass % or higher, more preferably 97 mass % or higher, and still more preferably 99 mass % or higher with respect to the total mass of the coloring material that shields light in the visible range.

The content of the coloring material that shields light in the visible range in the coloring composition according to the present invention is preferably 10 to 60 mass % and more preferably 30 to 50 mass % with respect to the total solid content of the coloring composition.

The total content of the infrared absorber and the coloring material that shields light in the visible range in the coloring composition according to the present invention is preferably 1 to 80 mass %, more preferably 20 to 70 mass %, and still more preferably 30 to 70 mass % with respect to the total solid content of the coloring composition.

Regarding the spectral characteristics of the coloring composition according to the present invention, it is preferable that a ratio A/B of a minimum value A of an absorbance in a wavelength range of 400 to 830 nm to a maximum value B of an absorbance in a wavelength range of 1000 to 1300 nm is 4.5 or higher. The above-described ratio A/B is preferably 10 or higher, more preferably 15 or higher, and still more preferably 30 or higher.

In a case where the absorbance ratio is 4.5 or higher, a film having spectral characteristics in which a maximum value of a light transmittance of the film in a thickness direction in a wavelength range of 400 to 830 nm is 20% or lower and in which a minimum value of a light transmittance of the film in the thickness direction in a wavelength range of 1000 to 1300 nm is 70% or higher can be suitably formed.

An absorbance $A\lambda$ at a wavelength $\lambda$ is defined by the following Expression (1).

$$A\lambda = -\log(T\lambda) \quad (1)$$

$A\lambda$ represents the absorbance at the wavelength $\lambda$, and $T\lambda$ represents a transmittance at the wavelength $\lambda$.

In the present invention, a value of the absorbance may be a value measured in the form of a solution or a value of a film which is formed using the coloring composition. In a case where the absorbance is measured in the form of the film, it is preferable that the film is formed by applying the coloring composition to a glass substrate using a method such as spin coating such that the thickness of the dried film is a predetermined value, and drying the applied coloring composition on a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be measured using a well-known spectrophotometer of the related art. Measurement conditions of the absorbance are not particularly limited. It is preferable that the maximum value B of the absorbance in a wavelength range of 1000 to 1300 nm is measured under conditions which are adjusted such that the minimum value A of the absorbance in a wavelength range of 400 to 830 nm is 0.1 to 3.0. By measuring the absorbance under the above-described conditions, a measurement error can be further reduced. A method of adjusting the minimum value A of the absorbance in a wavelength range of 400 to 830 nm to be 0.1 to 3.0 is not particularly limited. For example, in a case where the absorbance is measured in the form of the coloring composition, for example, a method of adjusting the optical path length of a sample cell can be used. In addition, in a case where the absorbance is measured in the form of the film, for example, a method of adjusting the thickness of the film can be used.

A method of measuring the spectral characteristics and the thickness of the film formed using the coloring composition according to the present invention is as follows.

The coloring composition according to the present invention is applied to a glass substrate using a method such as spin coating such that the thickness of the dried film is a predetermined value and then is dried on a hot plate at 100° C. for 120 seconds.

The thickness of the film is obtained by measuring the thickness of the dried substrate including the film using a stylus surface profilometer (DEKTAK 150, manufactured by ULVAC Inc.).

The transmittance of the dried substrate including the film is measured in a wavelength range of 300 to 1300 nm using an ultraviolet-visible-near infrared spectrophotometer (U-4100, manufactured by Hitachi High-Technologies Corporation).

<<<Resin>>>

The coloring composition according to the present invention may include a resin. The resin is mixed, for example, in order to disperse the pigments in the composition and to be used as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

The content of the resin is preferably 10 to 80 mass % and more preferably 20 to 60 mass % with respect to the total solid content of the coloring composition. The coloring composition may include one resin or two or more resins. In a case where the coloring composition includes two or more resins, it is preferable that the total content of the two or more resins is in the above-described range.

(Dispersant)

The coloring composition according to the present invention may include a dispersant as a resin.

Examples of the dispersant include: a polymer dispersant such as a resin having an amine group (polyamideamine or a salt thereof), an oligo imine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate;

In terms of a structure, the polymer dispersant can be further classified into a linear polymer, a terminal-modified polymer, a graft polymer, and a block polymer.

In addition, as the polymeric dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-77994A (JP-H9-77994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-37082A (JP-S54-37082A), JP1996-507960A (JP-H8-507960A), or JP2009-258668A, a reaction product of polyallylamine and polyester described in JP1997-169821A (JP-H9-169821A), a copolymer of a macromonomer and a monomer having a nitrogen-containing group described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A.

As the macromonomer used for manufacturing the graft polymer by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A). Among these, from the viewpoint of the dispersibility and dispersion stability of the pigment dispersion and the developability of the coloring composition in which the pigment dispersion is used, a polyester macromonomer having excellent flexibility and solvent compatibility is more preferable, and the polyester macromonomer described in JP1990-272009A (JP-H2-272009A) is most preferable.

As the block polymer, a block polymer described in JP2003-49110A or JP2009-52010A is preferable.

As the resin, a graft copolymer including a structural unit represented by any one of the following Formulae (1) to (4) can also be used.

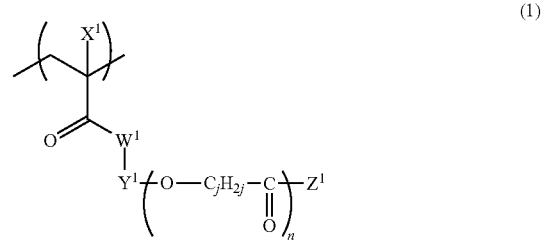

(1)

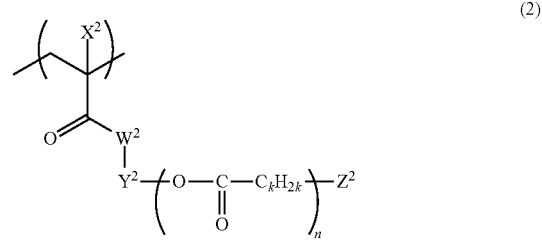

(2)

(3)

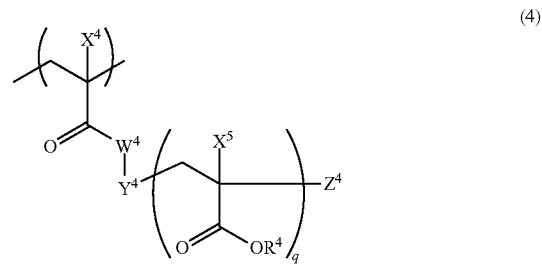

(4)

$X^1$, $X^2$, $X^3$, $X^4$, and $X^5$ each independently represent a hydrogen atom or a monovalent organic group, preferably a hydrogen atom or an alkyl group having 1 to 12 carbon atoms, more preferably a hydrogen atom or a methyl group, and still more preferably a methyl group.

$W^1$, $W^2$, $W^3$, and $W^4$ each independently represent an oxygen atom or NH and preferably an oxygen atom.

$R^3$ represents a branched or linear alkylene group (having preferably 1 to 10 carbon atoms and more preferably 2 or 3 carbon atoms). From the viewpoint of dispersion stability, it is preferable that $R^3$ represents a group represented by —$CH_2$—$CH(CH_3)$— or a group represented by —$CH(CH_3)$—$CH_2$—.

$Y^1$, $Y^2$, $Y^3$, and $Y^4$ each independently represent a divalent linking group, and a structure thereof is not particularly limited.

The graft copolymer can be found in the description of paragraphs "0025" to "0069" of JP2012-255128A, the content of which is incorporated herein by reference.

Specific examples of the graft copolymer are as follows. In addition, a resin described in paragraphs "0072" to "0094" of JP2012-255128A can be used.

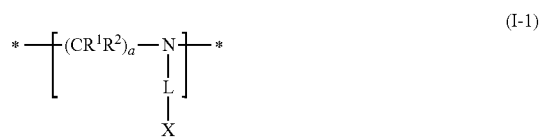
(I-1)

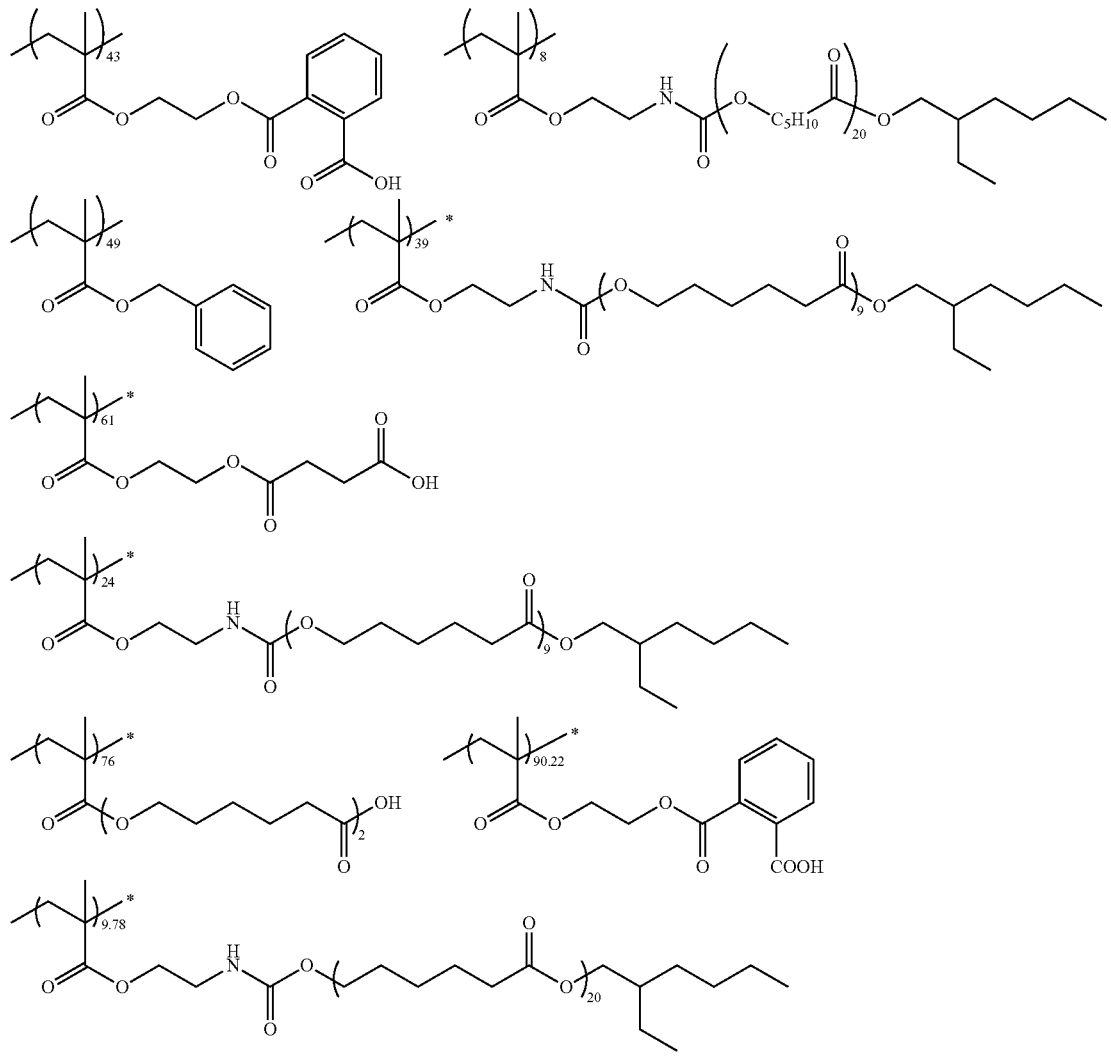

In addition, as the resin, an oligoimine dispersant having a nitrogen atom at at least either a main chain or a side chain can be used. As the oligoimine dispersant, a resin, which includes a structural unit having a partial structure X with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity.

Examples of the oligoimine dispersant include a dispersant including a structural unit represented by the following Formula (I-1), a structural unit represented by the following Formula (I-2), and/or a structural unit represented by the following Formula (I-2a).

-continued

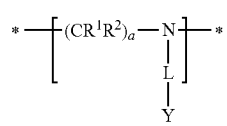
(I-2)

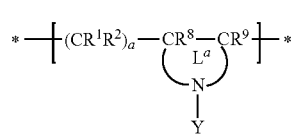
(I-2a)

$R^1$ and $R^2$ each independently represent a hydrogen atom, a halogen atom, or an alkyl group (having preferably 1 to 6 carbon atoms). a's each independently represent an integer of 1 to 5. * represents a linking portion between structural units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is structural unit which forms a ring structure with $CR^8CR^9$ and N, preferably a structural unit which forms a nonaromatic heterocycle having 3 to 7 carbon atoms with $CR^8CR^9$ and a carbon atom, more preferably a structural unit which forms a nonaromatic 5- to 7-membered heterocycle with $CR^8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a functional group (pKa: 14 or lower).

Y represents a side chain having 40 to 10000 atoms.

The dispersant (oligoimine dispersant) may further include one or more copolymerization components selected from the group consisting of the structural units represented by Formulae (I-3), (I-4), and (I-5). By the dispersant including the above-described structural units, the dispersion performance can be further improved.

(I-3)

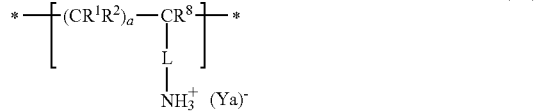
(I-4)

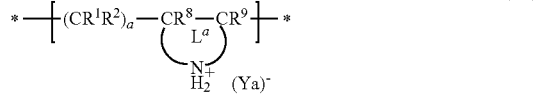
(I-5)

$R^1$, $R^2$, $R^8$, $R^9$, L, La, a, and * have the same definitions as those in Formulae (I-1), (I-2), and (I-2a).

Ya represents a side chain having 40 to 10000 atoms which has an anionic group. The structural unit represented by Formula (I-3) can be formed by adding an oligomer or a polymer having a group, which reacts with amine to form a salt, to a resin having a primary or secondary amino group at a main chain such that they react with each other.

The oligoimine dispersant can be found in the description of paragraphs "0102" to "0166" of JP2012-255128A, the content of which is incorporated herein by reference.

Specific examples of the oligoimine dispersant are as follows. In addition, a resin described in paragraphs "0168" to "0174" of JP2012-255128A can be used.

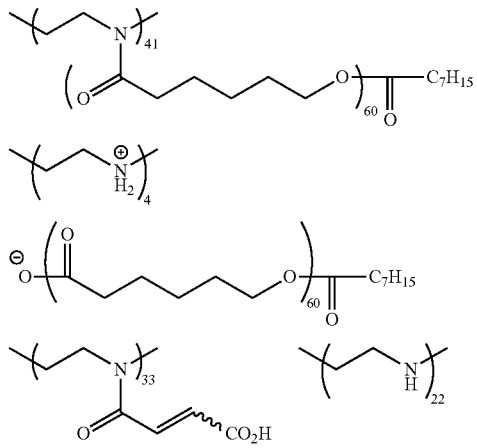

As the resin, a resin including a structural unit represented by the following Formula (P1) can be used. By using the following resin, the dispersibility of the infrared absorber (in particular, the pyrrolopyrrole colorant compound represented by Formula (1)) can be further improved.

(P1)

In Formula (P1), $R^1$ represents a hydrogen atom or a methyl group, $R^2$ represents an alkylene group, and Z represents a nitrogen-containing heterocyclic structure.

The alkylene group represented by $R^2$ is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a structure including a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, a phenoxazine ring, an acridone ring, an anthraquinone ring, a benzimidazole structure, a benzotriazole structure, a benzothiazole structure, a cyclic amide structure, a cyclic urea structure, or a cyclic imide structure. Among these, as the nitrogen-containing heterocyclic structure represented by Z, a structure represented by the following Formula (P2) or (P3) is preferable.

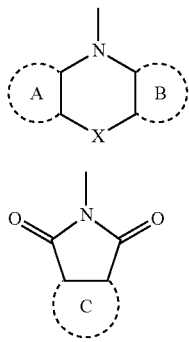

(P2)

(P3)

In Formula (P2), X represents one selected from the group consisting of a single bond, an alkylene group (for example, a methylene group, an ethylene group, a propylene group, a trimethylene group, or a tetramethylene group), —O—, —S—, —NR—, and —C(=O)—. Here, R represents a hydrogen atom or an alkyl group. Examples of the alkyl group represented by R include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among these, X represents preferably a single bond, a methylene group, —O—, or —C(=O)— and more preferably —C(=O)—.

In Formulae (P2) and (P3), a ring A, a ring B, and a ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, a phenoxazine ring, an acridone ring, or an anthraquinone ring is preferable, and a benzene ring, a naphthalene ring, or a pyridine ring is more preferable.

Specific examples of the structural unit represented by Formula (P1) are as follows. In addition, specific examples of the structural unit can be found in paragraph "0023" of JP2008-009426A, the content of which is incorporated herein by reference.

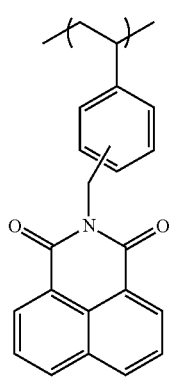

The resin including the structural unit represented by Formula (P1) may further include the structural unit represented by any one of Formulae (1) to (4) of the resin. In addition, the resin including the structural unit represented by Formula (P1) may further the structural unit represented by any one of Formulae (I-1), (I-2), (I-2a), (I-3), (I-4), and (I-5) of the resin.

Specific examples of the resin including the structural unit represented by Formula (P1) are as follows.

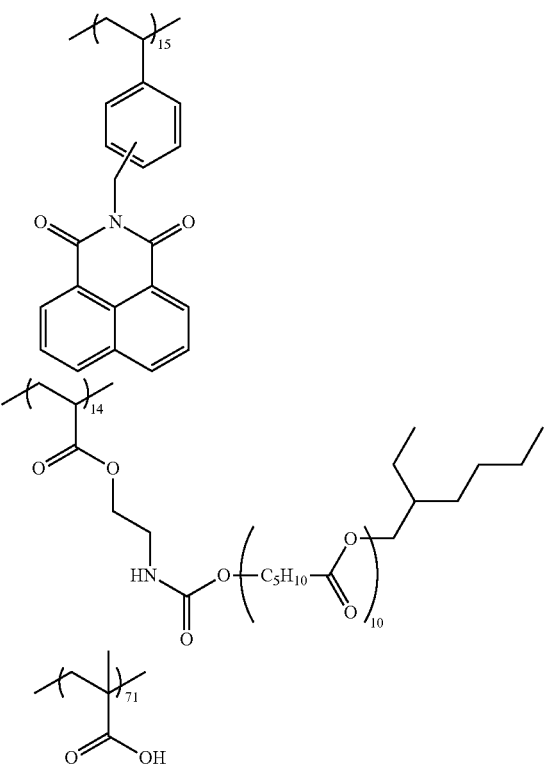

The resin is available as a commercially available product, and specific examples thereof include: "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

Among these resins, one kind may be used alone, or two or more kinds may be used in combination. In the present invention, in particular, it is preferable that the pigment derivative described below and a polymeric dispersant are used in combination. In addition, regarding the resin, the terminal-modified polymer, the graft polymer, or the block polymer having an anchor site to a pigment surface may be used in combination with an alkali-soluble resin described below. Examples of the alkali-soluble resin include a (meth) acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H7-319161A) is also preferable.

The content of the dispersant is preferably 1 to 80 parts by mass, more preferably 5 to 70 parts by mass, and still more preferably 10 to 60 parts by mass with respect to 100 parts by mass of the pigment.

(Alkali-Soluble Resin)

It is preferable that the coloring composition according to the present invention includes an alkali-soluble resin as a resin. By the composition including the alkali-soluble resin, developability and pattern formability is improved. The alkali-soluble resin can also be used as the dispersant or the binder.

The molecular weight of the alkali-soluble resin is not particularly limited, and the weight-average molecular weight (Mw) thereof is preferably 5000 to 100000. In addition, the number average molecular weight (Mn) of the alkali-soluble resin is preferably 1000 to 20000.

The alkali-soluble resin may be a linear organic polymer and can be appropriately selected from resins having at least one group for promoting alkali dissolution in a molecule (preferably a molecule having an acrylic copolymer or a styrene copolymer as a main chain).

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali dissolution (hereinafter, also referred to as the acid group) include a carboxy group, a phosphate group, a sulfonate group, and a phenolic hydroxy group. Among these, a carboxy group is preferable. Among these acid groups, one kind may be used alone, or two or more kinds may be used in combination.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxy group at a side chain thereof; and a resin obtained by adding an acid anhydride to a polymer having a hydroxy group. In particular, a copolymer of (meth)acrylic acid and another monomer which is copolymerizable with the (meth) acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, a-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer copolymer described in JP1998-300922A (H10-300922A) such as N-phenylmaleimide or N-cyclohexylmaleimide. Among these monomers which are copolymerizable with the (meth)acrylic acid, one kind may be used alone, or two or more kinds may be used in combination.

In addition, in order to improve a crosslinking effect of the film, an alkali-soluble resin having a polymerizable group may be used. Examples of the polymerizable group include a meth(allyl) group and a (meth)acryloyl group. As the alkali-soluble resin having a polymerizable group, an alkali-soluble resin having a polymerizable group at a side chain thereof is preferable.

Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRY-CURE RD-F8 (manufactured by Nippon Shokubai Co., Ltd.).

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth) acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

In addition, as a commercially available product, for example, FF-426 (manufactured by Fujikura Kasei Co., Ltd.) can also be used.

As the alkali-soluble resin, a polymer obtained by copolymerization of monomer components including a compound represented by the following Formula (ED1) and/or a compound represented by the following Formula (ED2) (hereinafter, these compounds will also be referred to as "ether dimer") is also preferable.

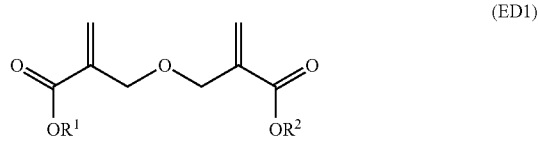

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. Specific examples of Formula (ED2) can be found in the description of JP2010-168539A The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination.

The alkali-soluble resin may include a structural unit which is derived from a compound represented by the following Formula (X).

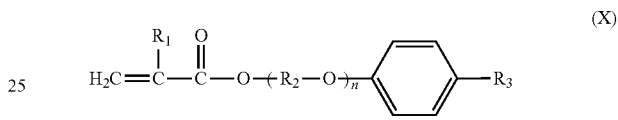

(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms which may have a benzene ring, and n represents an integer of 1 to 15.

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

Specific examples of the alkali-soluble resin are as follows.

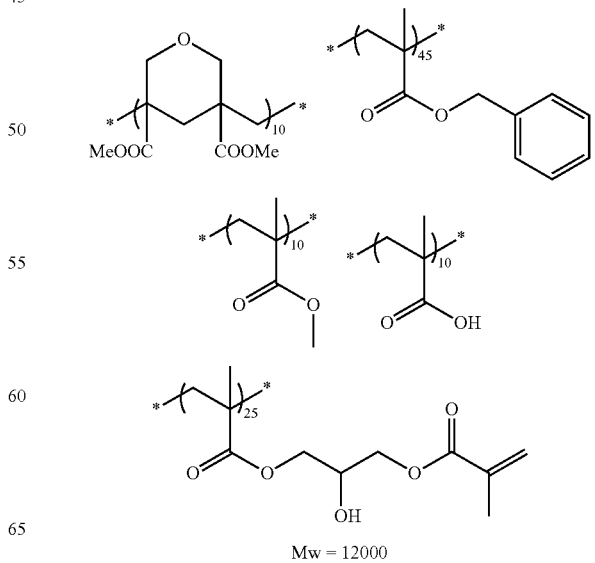

Mw = 12000

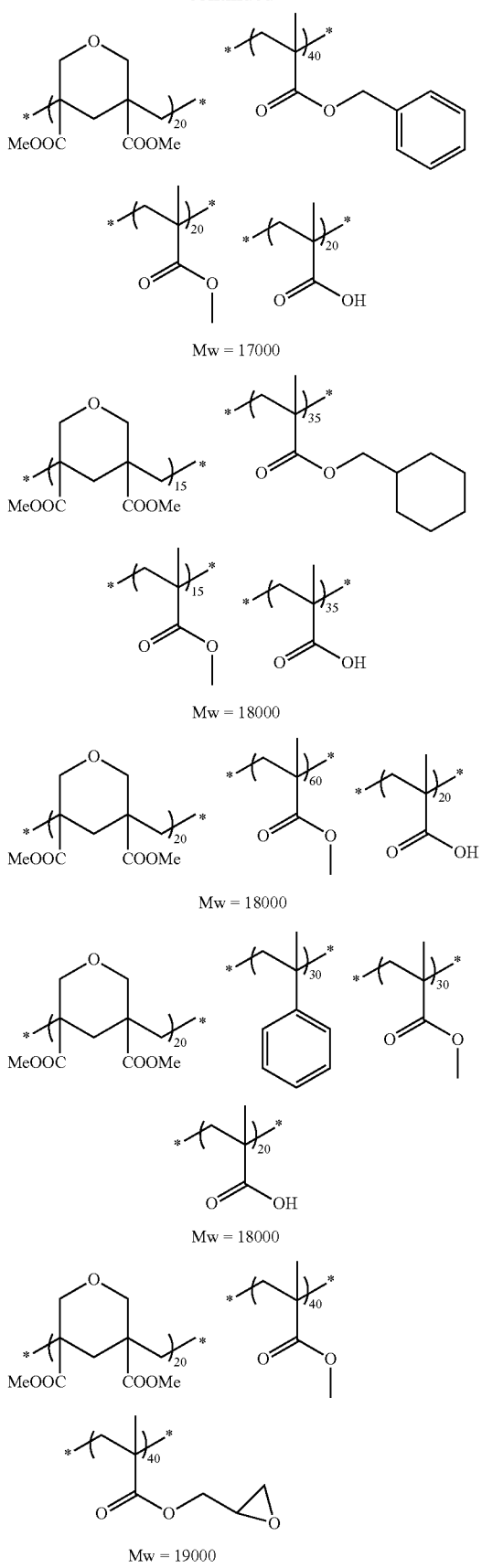

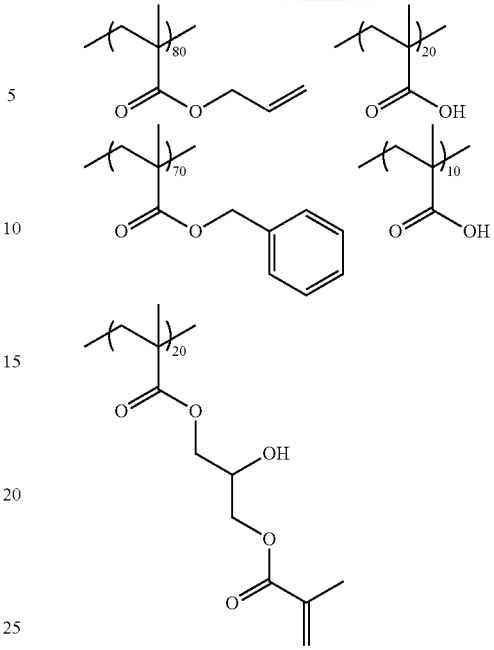

The details of the alkali-soluble resin can be found in paragraphs "0558" to "0571" of JP2012-208494A (corresponding to paragraphs "0685" to "0700" of US2012/0235099A), the content of which is incorporated herein by reference.

Further, a copolymer (B) described in paragraphs "0029" to "0063" and an alkali-soluble resin used in Examples of JP2012-32767A, a binder resin described in paragraphs "0088" to "0098" and a binder resin used in Examples of JP2012-208474A, a binder resin described in paragraphs "0022" to "0032" and a binder resin used in Examples of JP2012-137531A, a binder resin described in paragraphs "0132" to "0143" and a binder resin used in Examples of JP2013-024934A, a binder resin described in paragraphs "0092" to "0098" and a binder resin described in Examples of JP2011-242752A, or a binder resin described in paragraphs "0030" to "0072" of JP2012-032770A can also be used. The contents of which are incorporated herein by reference.

The acid value of the alkali-soluble resin is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and even yet still more preferably 120 mgKOH/g or lower.

The content of the alkali-soluble resin is preferably 0.1 to 20 mass % with respect to the total solid content of the coloring composition. The lower limit is preferably 0.5 mass %% or higher, more preferably 1 mass % or higher, still more preferably 2 mass % or higher, and even still more preferably 3 mass % or higher. The upper limit is more preferably 12 mass % or lower, and still more preferably 10 mass % or lower. The coloring composition according to the present invention may include one alkali-soluble resin or two or more alkali-soluble resins. In a case where the coloring composition includes two or more alkali-soluble resins, it is preferable that the total content of the two or more alkali-soluble resins is in the above-described range.

<<<Pigment Derivative>>>

The coloring composition according to the present invention may include a pigment derivative. Examples of the pigment derivative include a compound having a structure in which a portion of a pigment is substituted with an acidic group, a basic group, or a phthalimidomethyl group. It is preferable that the pigment derivative has an acidic group or a basic group from the viewpoints of dispersibility and dispersion stability.

Examples of an organic pigment for forming the pigment derivative include a pyrrolopyrrole pigment, a diketo pyrrolopyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment.

In addition, as the acidic group included in the pigment derivative, a sulfonic acid, a carboxylic acid, or a quaternary ammonium salt thereof is preferable, a carboxylate group or a sulfonate group is more preferable, and a sulfonate group is still more preferable. As the basic group included in the pigment derivative, an amino group is preferable, and a tertiary amino group is more preferable.

As the pigment derivative, a pyrrolopyrrole pigment derivative, a quinoline pigment derivative, a benzimidazolone pigment derivative, or an isoindoline pigment derivative, is preferable, and a pyrrolopyrrole pigment derivative is more preferable.

Specific examples of the pigment derivative are as follows.

In the present invention, the polymerizable compound may have any chemical form such as a monomer, a prepolymer, that is, a dimer, a trimer, or an oligomer, or a mixture or polymer thereof. Among these, a monomer is preferable.

The molecular weight of the polymerizable compound is preferably 100 to 3000. The upper limit is preferably 2000 or lower and more preferably 1500 or lower. The lower limit is preferably 150 or higher and more preferably 250 or higher.

The polymerizable compound is preferably a (meth)acrylate compound having 3 to 15 functional groups and more preferably a (meth)acrylate compound having 3 to 6 functional groups.

Examples of the monomer and the prepolymer include an unsaturated carboxylic acid (for example, acrylic acid, methacrylic acid, itaconic acid, crotonic acid, isocrotonic acid, or maleic acid), an ester or amide of an unsaturated carboxylic acid, and a polymer thereof. Among these, an ester of an unsaturated carboxylic acid and an aliphatic polyhydric alcohol compound, an amide of an unsaturated carboxylic acid and an aliphatic polyamine compound, or a polymer thereof is preferable. In addition, for example, an adduct of an unsaturated carboxylic acid ester or amide having a nucleophilic substituent, such as a hydroxy group, an amino group, or a mercapto group, with a monofunctional or polyfunctional isocyanate or epoxy, or a dehydrated condensate of an unsaturated carboxylic acid ester or amide having a nucleophilic substituent with a monofunctional or polyfunctional carboxylic acid is also preferably used. In addition, a reactant of an unsaturated carboxylic acid ester or

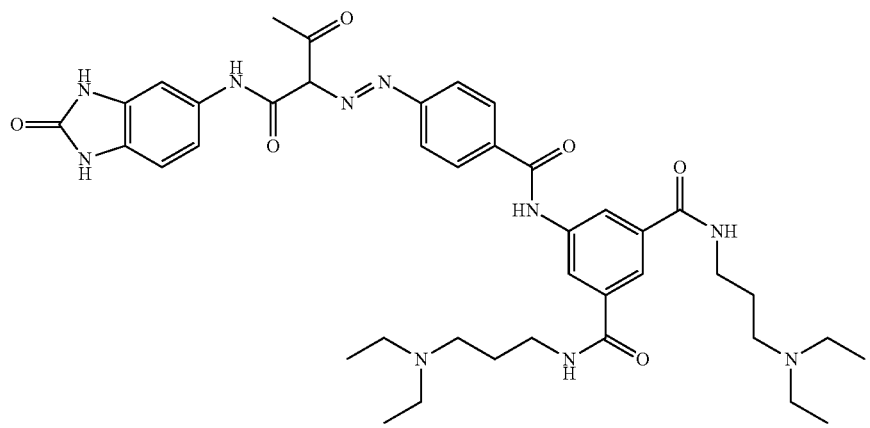 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

The content of the pigment derivative is preferably 1 to 50 mass % and more preferably 3 to 30 mass % with respect to the total mass of the pigments. Among these pigment derivatives, one kind may be used alone, or two or more kinds may be used in combination.

<<<Polymerizable Compound>>>

It is preferable that the coloring composition according to the present invention includes a polymerizable compound. As the polymerizable compound, a well-known compound which is crosslinkable by a radical, an acid, or heat can be used. Examples of the compound include a compound having a group having an ethylenically unsaturated bond or a methylol group. Examples of the group having an ethylenically unsaturated bond include a vinyl group, a meth(allyl) group, and a (meth)acryloyl group. In the present invention, it is more preferable that the polymerizable compound is a radically polymerizable compound.

amide having an electrophilic substituent such as an isocyanate group or an epoxy group with a monofunctional or polyfunctional alcohol, amine, or thiol, or a reactant of an unsaturated carboxylic acid ester or amide having a leaving substituent such as a halogen atom or a tosyloxy group with a monofunctional or polyfunctional alcohol, amine, or thiol is also preferable. In addition, a group of compounds in which the unsaturated carboxylic acid is substituted with, for example, an unsaturated phosphonic acid, a vinylbenzene derivative such as styrene, vinyl ether, or allyl ether can also be used.

As specific examples of the compounds, compounds described in paragraphs "0095" to "0108" of JP2009-288705A can be preferably used in the present invention.

In the present invention, as the polymerizable compound, a compound having one or more ethylenically unsaturated bonds and having a boiling point of 100° C. or higher under normal pressure is also preferable. Examples of the compound include compounds described in paragraph "0227" of JP2013-29760 and paragraphs "0254" to "0257" of JP2008-292970A, the content of which is incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E as a commercially available product; manufactured by Shin-Nakamura Chemical Co., Ltd.), and a compound (for example, SR454 or SR499; manufactured by Sartomer) in which these (meth)acryloyl groups are bonded through an ethylene glycol or a propylene glycol residue is preferable. Oligomers of the above-described examples can be used. In addition, KAYARAD RP-1040 and CPCA-20 (manufactured by Nippon Kayaku Co., Ltd.), A-TMMT (pentaerythritol tetraacrylate, manufactured by Shin-Nakamura Chemical Co., Ltd.), and ARONIX M-313 and M-315 (manufactured by Toagosei Co., Ltd.) can also be used. Hereinafter, a preferable aspect of the polymerizable compound will be described.

The polymerizable compound may have an acid group such as a carboxy group, a sulfonate group, or a phosphate group. As the polymerizable compound having an acid group, an ester of an aliphatic polyhydroxy compound and an unsaturated carboxylic acid is preferable. A polymerizable compound having an acid group obtained by causing a nonaromatic carboxylic anhydride to react with an unreacted hydroxy group of an aliphatic polyhydroxy compound is more preferable. In particular, it is still more preferable that, in this ester, the aliphatic polyhydroxy compound is pentaerythritol and/or dipentaerythritol. Examples of a commercially available product of the monomer having an acid group include M-305, M-510, and M-520 as polybasic acid-modified acrylic oligomer (manufactured by Toagosei Co., Ltd.).

The acid value of the polymerizable compound having an acid group is preferably 0.1 to 40 mgKOH/g and more preferably 5 to 30 mgKOH/g. In a case where the acid value of the polymerizable compound is 0.1 mgKOH/g or higher, development solubility is excellent. In a case where the acid value of the polymerizable compound is 40 mgKOH/g or lower, there are advantageous effects in manufacturing and handleability. Further, photopolymerization performance is excellent, and curing properties are excellent.

In addition, a compound having a caprolactone structure is also preferable as the polymerizable compound.

The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. In particular, a compound represented by the following Formula (Z-1) is preferable.

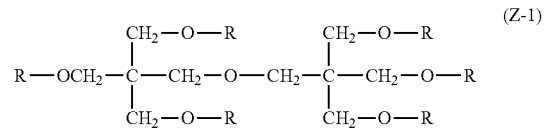

In Formula (Z-1), all of six R's represent a group represented by the following Formula (Z-2), or one to five R's among the six R's represent a group represented by the following Formula (Z-2) and the remaining R's represent a group represented by the following Formula (Z-3).

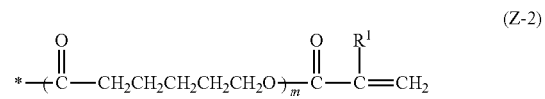

In Formula (Z-2), $R^1$ represents a hydrogen atom or a methyl group, m represents 1 or 2, and "*" represents a direct bond.

In Formula (Z-3), $R^1$ represents a hydrogen atom or a methyl group, and "*" represents a direct bond.

The polymerizable compound having a caprolactone structure is commercially available as for example, KAYARAD DPCA series (manufactured by Nippon Kayaku Co., Ltd.), and examples thereof include DPCA-20 (a compound in which m=1 in the formulae, the number of groups represented by Formula (Z-2)=2, and all of $R^1$'s represent a hydrogen atom), DPCA-30 (a compound in which m=1 in the formulae, the number of groups represented by Formula (Z-2)=3, and all of $R^1$'s represent a hydrogen atom), DPCA-60 (a compound in which m=1 in the formulae, the number of groups represented by Formula (Z-2)=6, and all of $R^1$'s represent a hydrogen atom), and DPCA-120 (a compound in which m=2 in the formulae, the number of groups represented by Formula (Z-2)=6, and all of $R^1$'s represent a hydrogen atom).

As the polymerizable compound, a compound represented by Formula (Z-4) or (Z-5) can be used.

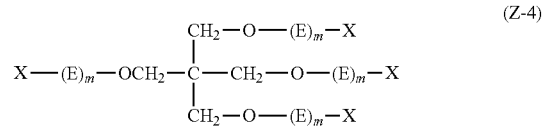

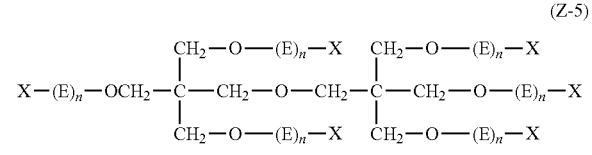

In Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxy group.

In Formula (Z-4), the total number of (meth)acryloyl groups is 3 or 4, m's each independently represent an integer of 0 to 10, and the sum of m's is an integer of 0 to 40.

In Formula (Z-5), the total number of (meth)acryloyl groups is 5 or 6, n's each independently represent an integer of 0 to 10, and the sum of n's is an integer of 0 to 60.

In Formula (Z-4), m represents preferably an integer of 0 to 6 and more preferably an integer of 0 to 4.

In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, it is preferable that, in —((CH$_2$)$_y$CH$_2$O)— or —((CH$_2$)$_y$CH(CH$_3$)O)— of Formula (Z-4) or (Z-5), a terminal thereof on an oxygen atom side is bonded to X.

Among these compounds represented by Formula (Z-4) and (Z-5), one kinds may be used alone, or two or more kinds may be used in combination. In particular, it is preferable that all of six X's in Formula (Z-5) represent an acryloyl group.

In addition, the total content of the compound represented by Formula (Z-4) or (Z-5) in the polymerizable compound is preferably 20 mass % or higher and more preferably 50 mass % or higher.

The compound represented by Formula (Z-4) or (Z-5) can be synthesized through well-known steps of the related art including: a step of bonding a ring-opened skeleton using a ring-opening addition reaction between pentaerythritol or dipentaerythritol and ethylene oxide or propylene oxide; and a step of causing, for example, (meth)acryloyl chloride to react with a terminal hydroxyl group of the ring-opened skeleton to introduce a (meth)acryloyl group to the terminal hydroxy group. The respective steps are well-known in the art, and those skilled in the art can easily synthesize the compounds represented by Formula (Z-4) and (Z-5).

Among the compounds represented by Formula (Z-4) and (Z-5), a pentaerythritol derivative and/or a dipentaerythritol derivative is more preferable.

Specific examples of the pentaerythritol derivative and/or the dipentaerythritol derivative include compounds represented by the following Formulae (a) to (f) (hereinafter, also referred to as "Exemplary Compounds (a) to (f)"). Among these, Exemplary Compound (a), (b), (e), or (f) is preferable.

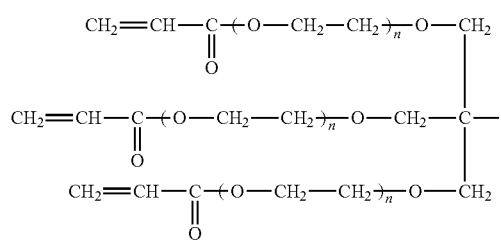
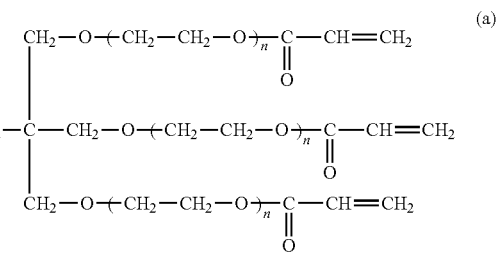

(a)

(The sum of n's is 6)

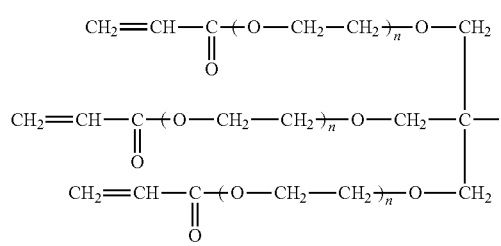
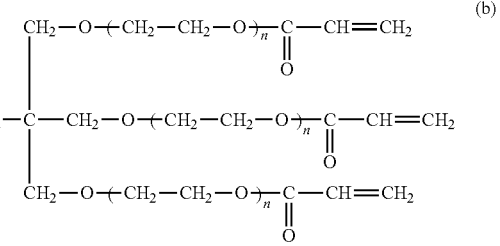

(b)

(The sum of n's is 12)

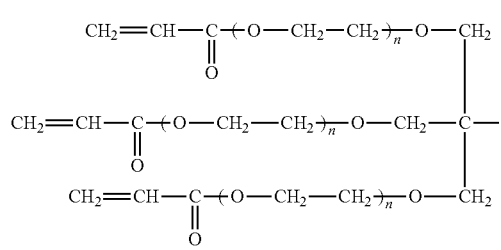
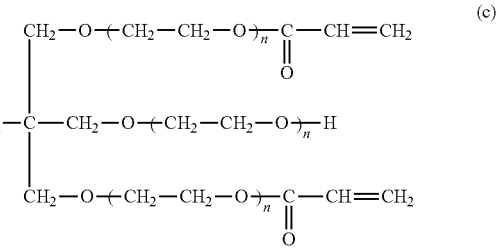

(c)

(The sum of n's is 12)

-continued

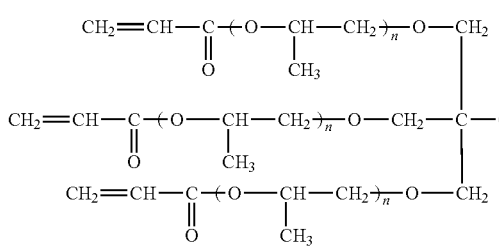
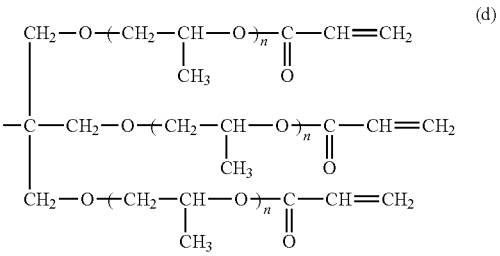

(d)

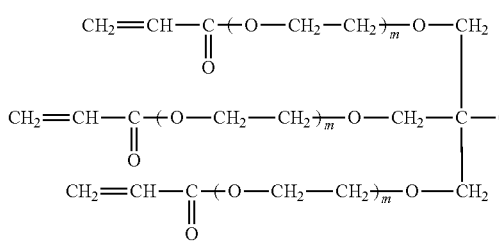

(The sum of n's is 6)

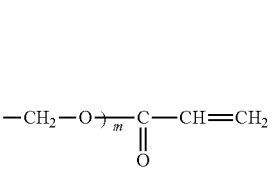

(e)

(The sum of m's is 4)

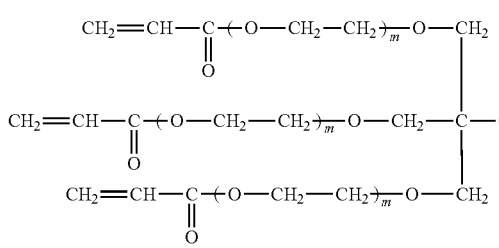

(f)

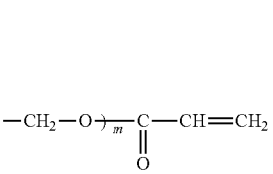

(The sum of m's is 12)

Examples of a commercially available product of the polymerizable compound represented by Formula (Z-4) or (Z-5) include SR-494 (manufactured by Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

As the polymerizable compound, an isocyanuric acid ethylene oxide-modified (meth)acrylate is also preferable. Examples of a commercially available product of the isocyanuric acid ethylene oxide-modified (meth)acrylate include ARONIX M-315 and M-313 (manufactured by Toagosei Co., Ltd.), NK ESTER A-9300 (manufactured by Shin-Nakamura Chemical Co., Ltd.), and SR368 (manufactured by Sartomer). In addition, as a polymerizable compound which is used in combination with a titanyl phthalocyanine pigment, a polymerizable compound having a high solubility parameter (SP) value is preferable from the viewpoint of heat resistance. Examples of the polymerizable compound having a high SP value include ARONIX M-315 and M-313 (manufactured by Toagosei Co., Ltd.).

As the polymerizable compound, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, a coloring composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (manufactured by Kyoeisha Chemical Co., Ltd.).

<<<Polyfunctional Thiol Compound>>>

In order to promote a reaction of the polymerizable compound, the coloring composition according to the present invention may include a polyfunctional thiol compound having two or more mercapto groups in a molecule. The polyfunctional thiol compound is preferably a secondary alkanethiol and more preferably a compound having a structure represented by the following Formula (T1).

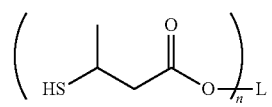

Formula (T1)

(In Formula (T1), n represents an integer of 2 to 4, and L represents a divalent to tetravalent linking group.)

In Formula (T1), it is preferable that a linking group L is an aliphatic group having 2 to 12 carbon atoms, and it is more preferable that n represents 2 and L represents an alkylene group having 2 to 12 carbon atoms. Specific examples of the polyfunctional thiol compound include compounds represented by the following Structural Formulae (T2) to (T4). Among these, a compound represented by Structural Formula (T2) is preferable. Among these polyfunctional thiols compounds, one kind may be used alone, or two or more kinds may be used in combination.

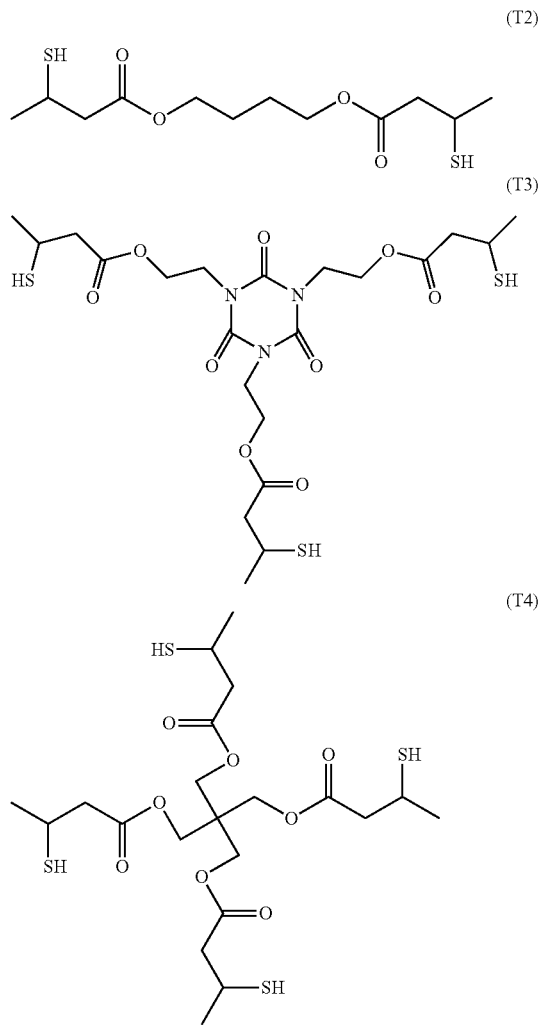

The content of the polyfunctional thiol compound is preferably 0.3 to 8.9 mass % and more preferably 0.8 to 6.4 mass % with respect to the total solid content of the coloring composition. In addition, the polyfunctional thiol compound may be added in order to improve stability, odor, resolution, developability, adhesiveness, and the like.

<<<Compound having Epoxy Group>>>

In the present invention, as the curable compound, a compound having an epoxy group can also be used.

In the present invention, as the compound having an epoxy group, a compound having two or more epoxy groups in one molecule is preferable. By using the compound having two or more epoxy groups in one molecule, a cured film having excellent heat resistance is likely to be obtained. The number of epoxy groups in one molecule is preferably 2 to 100. The upper limit is, for example, 10 or less or 5 or less.

In the present invention, it is preferable that the compound having an epoxy group has a structure having an aromatic ring and/or an aliphatic ring, and it is more preferable that the compound having an epoxy group has a structure having an aliphatic ring. It is preferable that the epoxy group is bonded to the aromatic ring and/or the aliphatic ring through a single bond or a linking group. Examples of the linking group include an alkylene group, an arylene group, —O—, a structure represented by —NR'— (R' represents a hydrogen atom, an alkyl group which may have a substituent, or an aryl group which may have a substituent and preferably represents a hydrogen atom), and a group having at least one selected from —SO$_2$—, —CO—, —O—, and —S—. In the case of the compound having an aliphatic ring, it is preferable that the epoxy group is directly bonded (single bond) to the aliphatic ring. In the case of the compound having an aromatic ring, it is preferable that the epoxy group is bonded to the aromatic ring through a linking group. As the linking group, an alkylene group, or a group including a combination of an alkylene group and —O— is preferable.

As the compound having an epoxy group, a compound having a structure in which two or more aromatic rings are linked through a hydrocarbon group can be preferably used. As the hydrocarbon group, an alkylene group having 1 to 6 carbon atoms is preferable. In addition, it is preferable that the epoxy groups are linked to each other through the linking group.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecule weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 3000 or lower, more preferably 2000 or lower, and still more preferably 1500 or lower.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference. Regarding the commercially available product, examples of the bisphenol A epoxy resin include jER825, jER827, jER828, jER834, jER1001, jER1002, jER1003, jER1055, jER1007, jER1009, and jER1010 (all of which are manufactured by Mitsubishi Chemical Corporation) and EPICLON860, EPICLON1050, EPICLON1051, and EPICLON1055 (all of which are manufactured by DIC Corporation). Examples of the bisphenol F epoxy resin include jER806, jER807, jER4004, jER4005, jER4007, and jER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include jER152, jER154, jER157S70, and jER157S65 (all of which are manufactured by Mitsubishi Chemical Corporation) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPO-LEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003 S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), and jER1031S (manufactured by Mitsubishi Chemical Corporation).

In a case where a compound having an epoxy group is used, the content of the compound having an epoxy group is preferably 0.1 to 40 mass % with respect to the total solid content of the coloring composition. For example, the lower limit is preferably 0.5 mass % or higher and more preferably 1 mass % or higher. For example, the upper limit is more preferably 30 mass % or lower and still more preferably 20 mass % or lower. As the compound having an epoxy group, one kind may be used alone, or two or more kinds may be used in combination. In a case where two or more compounds having an epoxy group are used in combination, it is preferable that the total content of the compounds having an epoxy group is in the above-described range.

In addition, in a case where the polymerizable compound and the compound having an epoxy group are used in combination, a mass ratio of the polymerizable compound to the compound having an epoxy group is preferably 100:1 to 100:400 and more preferably 100:1 to 100:100.

<<<Photopolymerization Initiator>>>

It is preferable that the coloring composition according to the present invention includes a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light in a range from the ultraviolet range to the visible range is preferable. In addition, the photopolymerization initiator may be an activator which causes an action with a photoexcited sensitizer to generate active radicals, or may be an initiator which initiates cation polymerization depending on the kinds of monomers.

In addition, it is preferable that the photopolymerization initiator is at least one compound having a molar absorption coefficient of at least 50 in a range of about 300 nm to 800 nm (preferably 330 nm to 500 nm).

Specific examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-58241A (JP-562-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an a-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

Among these, a trihalomethyltriazine compound, an α-amino ketone compound, an acylphosphine compound, a phosphine oxide compound, an oxime compound, a triarylimidazole dimer, an onium compound, a benzophenone compound, or an aminoacetophenone compound is more preferable, and at least one compound selected from the group consisting of a trihalomethyltriazine compound, an α-amino ketone compound, an oxime compound, a triarylimidazole dimer, and a benzophenone compound is still more preferable.

In particular, in a case where the film according to the present invention is used for a solid image pickup element, it is necessary to form a fine pattern in a sharp shape, and thus it is important to obtain excellent curing properties and perform development without a residue remaining in a non-exposed portion. From these viewpoint, it is more preferable that an oxime compound is used as the photopolymerization initiator. In particular, in a case where a fine pattern is formed in a solid image pickup element, a stepper is used for exposure for curing, and this exposure device may be damaged by halogen, and it is also necessary to reduce the addition amount of the photopolymerization initiator to be small. Therefore, in consideration of this point, it is more preferable that an oxime compound is used as the photopolymerization initiator for forming a fine pattern in a solid image pickup element or the like. In addition, by using the oxime compound, color transfer properties can be further improved.

Examples of the photopolymerization initiator can be found in paragraphs "0265" to "0268" of JP2013-29760A, the content of which is incorporated herein by reference.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-1110-291969A) or an acylphosphine initiator described in JP4225898B can also be used.

As the hydroxyacetophenone initiator, for example, IRGACURE-184, DAROCUR-1173, IRGACURE-500, IRGACURE-2959, or IRAGACURE-127 (trade name, all of which are manufactured by BASF SE) can be used.

As the aminoacetophenone initiator, IRGACURE-907, IRGACURE-369, IRGACURE-379, or IRGACURE-379EG (trade name, all of which are manufactured by BASF SE) which is a commercially available product can be used. As the aminoacetophenone initiator, a compound described in JP2009-191179A whose absorption wavelength is adjusted to match with that of a light source having a wavelength of, for example, 365 nm or 405 nm can also be used.

As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable.

Specific examples of the oxime compound include a compound described in JP2001-233842A, a compound described in JP2000-80068A, and a compound described in JP2006-342166A.

Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one.

In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-66385A, JP2000-80068A, JP2004-534797A, or JP2006-342166A.

As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), ADEKA OPTOMER N-1919 (manufactured by Adeka Corporation, a photopolymerization initiator 2 described in JP2012-14052A) can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, as the photopolymerization initiator, an oxime oxime compound containing a fluorine atom (fluorine-containing oxime ester photopolymerization initiator) can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, it is preferable that the fluorine-containing oxime ester photopolymerization initiator is a compound represented by the following Formula (OX-100).

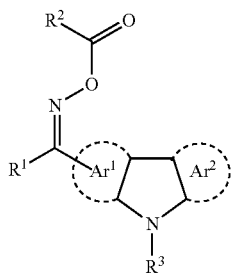

(OX-100)

In Formula (OX-100), $Ar^1$ and $Ar^2$ each independently represent an aromatic hydrocarbon ring which may have a substituent, $R^1$ represents an aryl group which has a group containing a fluorine atom, and $R^2$ and $R^3$ each independently represent an alkyl group or an aryl group.

In Formula (1), $Ar^1$ and $Ar^2$ each independently represent an aromatic hydrocarbon ring which may have a substituent.

The aromatic hydrocarbon ring may be a monocycle or a fused ring. The number of carbon atoms constituting the aromatic hydrocarbon ring is preferably 6 to 20, more preferably 6 to 15, and still more preferably 6 to 10. As the aromatic hydrocarbon ring, a benzene ring or a naphthalene ring is preferable. In particular, it is preferable that at least one of $Ar^1$ or $Ar^2$ represents a benzene ring, and it is more preferable that $Ar^1$ represents a benzene ring. $Ar^2$ represents preferably a benzene ring or a naphthalene ring, and more preferably a naphthalene ring.

Examples of the substituent which may be included in $Ar^1$ and $Ar^2$ include an alkyl group, an aryl group, a heterocyclic group, a nitro group, a cyano group, a halogen atom, $-OR^{X1}$, $-SR^{X1}$, $-COR^{X1}$, $-COOR^{X1}$, $-OCOR^{X1}$, $-NR^{X1}R^{X2}$, $-NHCOR^{X1}$, $-CONR^{X1}R^{X2}$, $-NHCONR^{X1}R^{X2}$, $-NHCOOR^{X1}$, $-SO_2R^{X1}$, $-SO_2OR^{X1}$, and $-NHSO_2R^{X1}$. $R^{X1}$ and $R^{X2}$ each independently represent a hydrogen atom, an alkyl group, an aryl group, or a heterocyclic group.

Examples of the halogen atom include a fluorine atom, a chlorine atom, a bromine atom, and an iodine atom. In particular, a fluorine atom is preferable.

The number of carbon atoms in the alkyl group as the substituent and the alkyl group represented by $R^{X1}$ and $R^{X2}$ is preferably 1 to 20. The alkyl group may be linear, branched, or cyclic and is preferably linear or branched. At least a portion or all of the hydrogen atoms in the alkyl group may be substituted with halogen atoms (preferably fluorine atoms). In addition, at least a portion or all of the hydrogen atoms in the alkyl group may be substituted with the above-described substituent.

The number of carbon atoms in the aryl group as the substituent and the aryl group represented by $R^{X1}$ and $R^{X2}$ is preferably 6 to 20, more preferably 6 to 15, and still more preferably 6 to 10. The aryl group may be a monocycle or a fused ring. In addition, at least a portion or all of the hydrogen atoms in the aryl group may be substituted with the above-described substituent.

The heterocyclic group as the substituent and the heterocyclic group represented by $R^{X1}$ and $R^{X2}$ are preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. It is preferable that the heteroatoms constituting the heterocyclic group are a nitrogen atom, an oxygen atom, or a sulfur atom. In addition, at least a portion or all of the hydrogen atoms in the heterocyclic group may be substituted with the above-described substituent.

It is preferable that $Ar^1$ represents an unsubstituted aromatic hydrocarbon ring. $Ar^2$ may represent an unsubstituted aromatic hydrocarbon ring or an aromatic hydrocarbon ring having a substituent. As the substituent, $-COR^{X1}$ is preferable. $R^{X1}$ represents preferably an alkyl group, an aryl group, or a heterocyclic group, and more preferably an aryl group. The aryl group may have a substituent or may be unsubstituted. Examples of the substituent include an alkyl group having 1 to 10 carbon atoms.

$R^1$ represents an aryl group which has a group containing a fluorine atom.

The number of carbon atoms in the aryl group is preferably 6 to 20, more preferably 6 to 15, and still more preferably 6 to 10. The aryl group may be a monocycle or a fused ring.

As the group containing a fluorine atom, an alkyl group containing a fluorine atom (fluorine-containing alkyl group) and/or a group (fluorine-containing group) which contains an alkyl group containing a fluorine atom is preferable.

As the fluorine-containing group, at least one group selected from the group consisting of $-OR^{X11}$, $-SR^{X11}$, $-COR^{X11}$, $-COOR^{X11}$, $-OCOR^{X11}$, $-NR^{X11}R^{X12}$, $-NHCOR^{X11}$, $-CONR^{X11}R^{X12}$, $-NHCONR^{X11}R^{X12}$, $-NHCOOR^{X11}$, $-SO_2R^{X11}$, $-SO_2OR^{X11}$, and $-NHSO_2R^{X11}$ is preferable, and $-OR^{X11}$ is more preferable. $R^{X11}$ represents a fluorine-containing alkyl group, and $RR^{X12}$ represents a hydrogen atom, an alkyl group, a fluorine-containing alkyl group, an aryl group, or a heterocyclic group.

As the group containing a fluorine atom, a fluorine-containing alkyl group and/or $-OR^{X11}$ is preferable.

The number of carbon atoms in the fluorine-containing alkyl group is preferably 1 to 20, more preferably 1 to 15, still more preferably 1 to 10, and even still more preferably 1 or 4. The fluorine-containing alkyl group may be linear, branched, or cyclic and is preferably linear or branched.

The substitution ratio of the fluorine-containing alkyl group with fluorine atoms is preferably 40% to 100%, more preferably 50% to 100%, and still more preferably 60 to 100%.

The alkyl group, the aryl group, and the heterocyclic group represented by $RR^{X12}$ have the same definitions as those described regarding the alkyl group, the aryl group, and the heterocyclic group represented by $R^{X1}$ and $R^{X2}$.

$R^2$ represents an alkyl group or an aryl group and preferably an alkyl group. The alkyl group and the aryl group may have a substituent or may be unsubstituted. Examples of the substituent include the above-described substituents.

The number of carbon atoms in the alkyl group is preferably 1 to 20, more preferably 1 to 15, still more preferably 1 to 10, and even still more preferably 1 or 4. The alkyl group may be linear, branched, or cyclic and is preferably linear or branched.

The number of carbon atoms in the aryl group is preferably 6 to 20, more preferably 6 to 15, and still more preferably 6 to 10. The aryl group may be a monocycle or a fused ring.

$R^3$ represents an alkyl group or an aryl group and preferably an alkyl group. The alkyl group and the aryl group may have a substituent or may be unsubstituted. Examples of the substituent include the above-described substituents.

The number of carbon atoms in the alkyl group is preferably 1 to 20, more preferably 1 to 15, and still more preferably 1 to 10. The alkyl group may be linear, branched, or cyclic and is preferably linear or branched.

The number of carbon atoms in the aryl group is preferably 6 to 20, more preferably 6 to 15, and still more preferably 6 to 10. The aryl group may be a monocycle or a fused ring.

Specific examples of the compound represented by Formula (OX-100) include the following compounds.

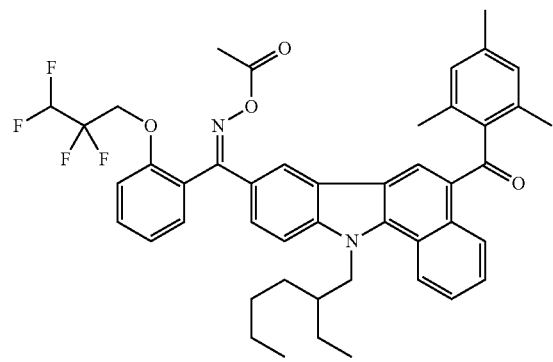

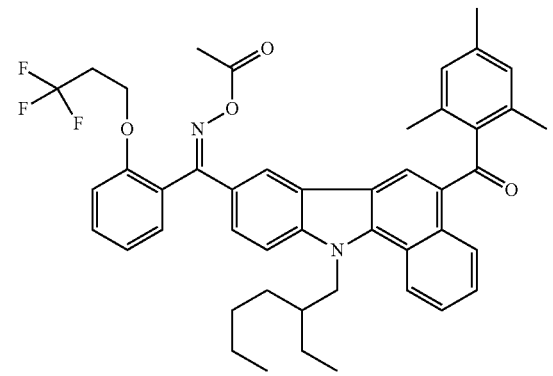

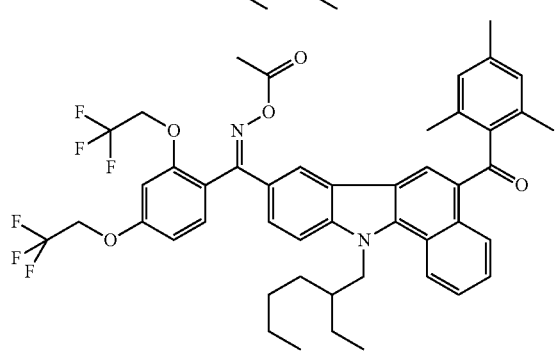

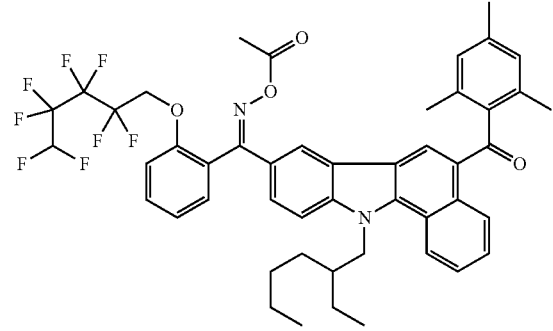

-continued

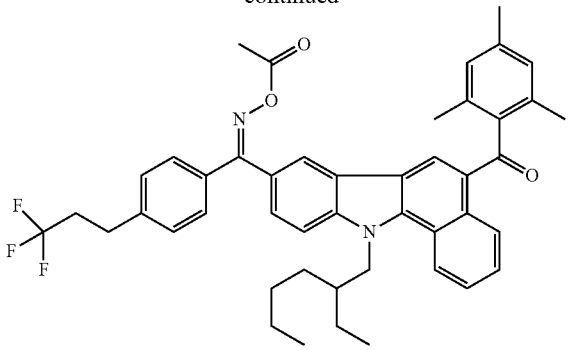

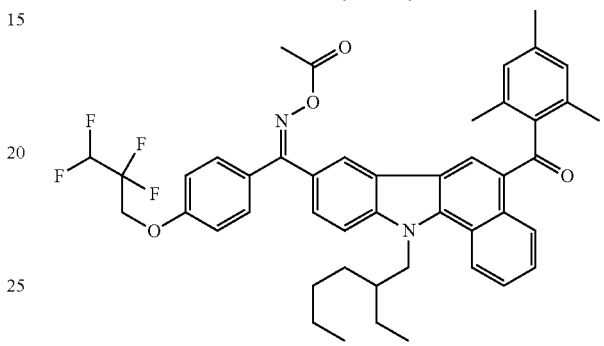

In the present invention, as the photopolymerization initiator, an oxime initiator having a nitro group can be used. Examples of the oxime initiator having a nitro group include a compound represented by the following Formula (OX-200).

Formula (OX-200)

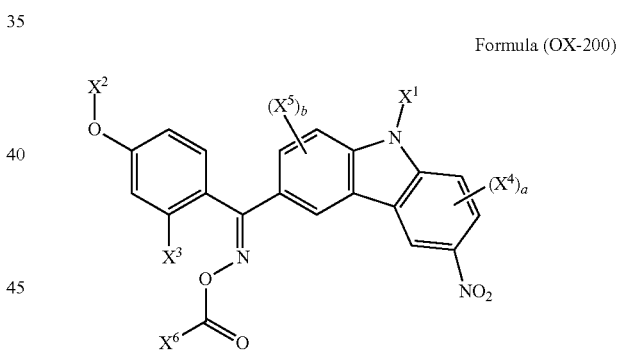

In the formula, $X^1$, $X^3$, and $X^6$ each independently represent $R^{11}$, $OR^{11}$, $COR^{11}$, $SR^{11}$, $CONR^{12}R^{13}$, or $CN$, $X^2$ represents an alkyl group, an aryl group, an aralkyl group, or a heterocyclic group, and $X^4$ and $X^5$ each independently represent $R^{11}$, $OR^{11}$, $SR^{11}$, $COR^{11}$, $CONR^{12}R^{13}$, $NR^{12}COR^{11}$, $OCOR^{11}$, $COOR^{11}$, $SCOR^{11}$, $COSR^{11}$, $CSOR^{11}$, $CN$, a halogen atom or a hydroxyl group. $R^{11}$, $R^{12}$, and $R^{13}$ each independently represent a hydrogen atom, an alkyl group, an aryl group, an aralkyl group, or a heterocyclic group. a and b each independently represent 0 to 3.

The number of carbon atoms in the alkyl group is preferably 1 to 20, more preferably 1 to 15, still more preferably 1 to 10, and even still more preferably 1 or 4. The alkyl group may be linear, branched, or cyclic and is preferably linear or branched.

The number of carbon atoms in the aryl group is preferably 6 to 30, more preferably 6 to 20, and still more preferably 6 to 10. The aryl group may be a monocycle or a fused ring.

The number of carbon atoms in the aralkyl group is preferably 7 to 30 and more preferably 7 to 20. The aryl group may be a monocycle or a fused ring.

The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. It is preferable that the heteroatoms constituting the heterocyclic group are a nitrogen atom, an oxygen atom, or a sulfur atom.

The alkyl group, the aryl group, the aralkyl group, and the heterocyclic group may have a substituent or may be unsubstituted. Examples of the substituent include the substituents which may be included in $Ar^1$ and $Ar^2$ in Formula (1).

Specific examples of the oxime initiator having a nitro group include compounds described in paragraphs "0031" to "0047" of JP2013-114249A and paragraphs "0008" to "0012" and "0070" to "0079" of JP2014-137466A, and ADEKA ARKLS NCI-831 (manufactured by Adeka Corporation).

In the present invention, as the photopolymerization initiator, a compound represented by the following Formula (OX-300) or (OX-400) can also be used.

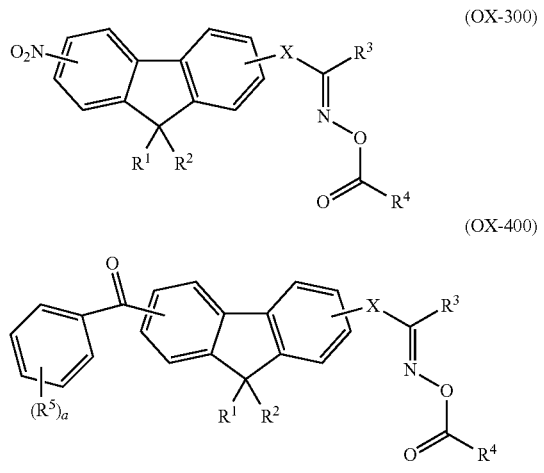

In Formula (OX-300), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, in a case where $R^1$ and $R^2$ represent a phenyl group, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, and X represents a direct bond or a carbonyl group.

In Formula (OX-400), $R^1$, $R^2$, $R^3$, and $R^4$ have the same definitions as those of $R^1$, $R^2$, $R^3$, and $R^4$ in Formula (OX-300), $R^5$ represents $-R^6$, $-OR^6$, $-SR^6$, $-COR^6$, $-CONR^6R^6$, $-NR^6COR^6$, $-OCOR^6$, $-COOR^6$, $-SCOR^6$, $-OCSR^6$, $-COSR^6$, $-CSOR^6$, $-CN$, a halogen atom, or a hydroxyl group, $R^6$ represents a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, X represents a direct bond or a carbonyl group, and a represents an integer of 0 to 4.

In Formulae (OX-300) and (OX-400), it is preferable that $R^1$ and $R^2$ each independently represent a methyl group, an ethyl group, an n-propyl group, i-propyl group, a cyclohexyl group, or a phenyl group. It is preferable that $R^3$ represents a methyl group, an ethyl group, a phenyl group, a tolyl group, or a xylyl group. It is preferable that $R^4$ represents an alkyl group having 1 to 6 carbon atoms or a phenyl group. It is preferable that $R^5$ represents a methyl group, an ethyl group, a phenyl group, a tolyl group, or a naphthyl group. It is preferable that X represents a direct bond.

Specific examples of the compounds represented by Formulae (OX-300) and (OX-400) include compounds described in paragraphs "0076" to "0079" of JP2014-137466A. The content is incorporated herein by reference.

In the present invention, as the photopolymerization initiator, an oxime compound having a benzofuran skeleton can also be used. Specific examples include OE-01 to OE-75 described in WO2015/036910A.

Hereinafter, specific examples of the oxime compound which are preferably used in the present invention are shown below, but the present invention is not limited thereto.

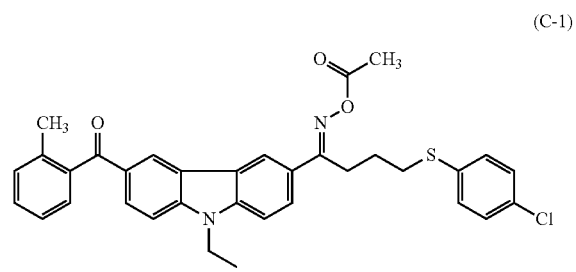

(C-1)

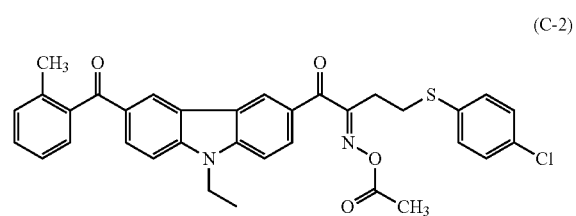

(C-2)

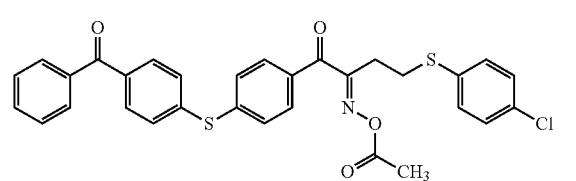

(C-3)

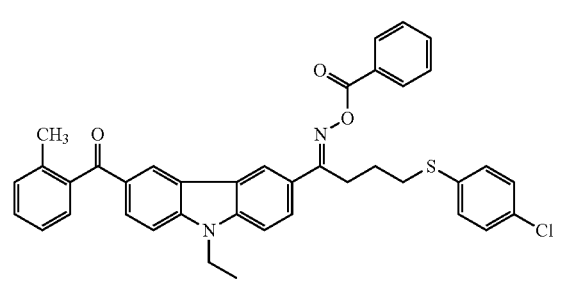

(C-4)

(C-5)
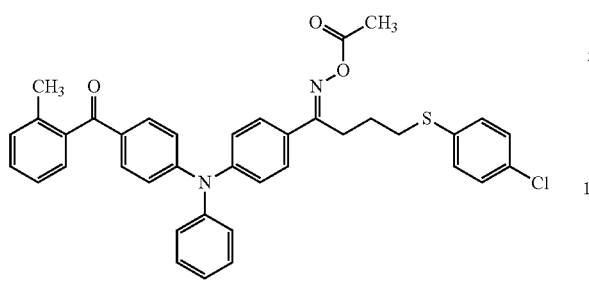

(C-6)
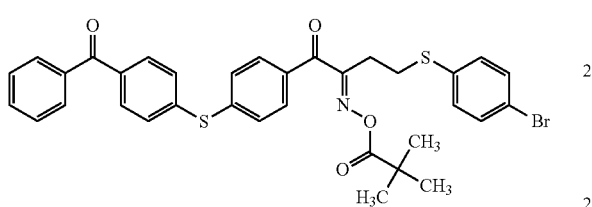

(C-7)
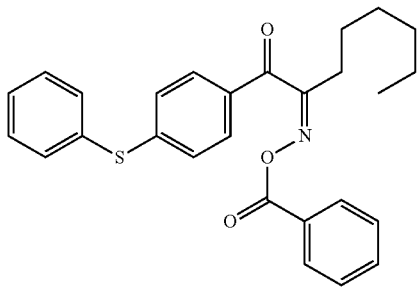

(C-8)
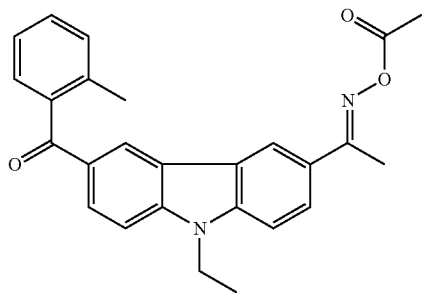

(C-9)
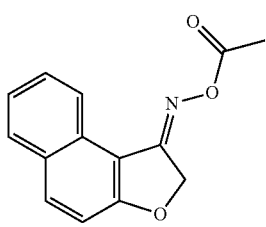

(C-10)
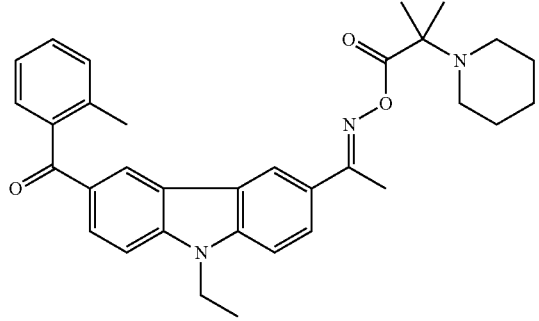

(C-11)
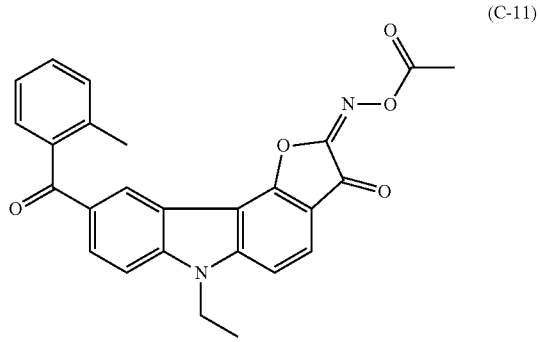

(C-12)
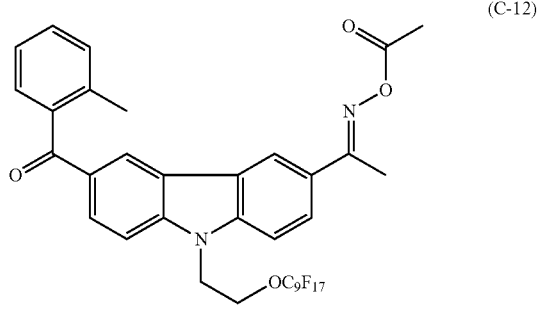

The oxime compound is preferably a compound having an absorption maximum in a wavelength range of 350 nm to 500 nm and more preferably a compound having an absorption maximum in a wavelength range of 360 nm to 480 nm. In addition, the oxime compound is preferably a compound having a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the absorption coefficient can be measured using an ultraviolet-visible spectrophotometer (Carry-5 spectrophotometer, manufactured by Varian Medical Systems, Inc.) and ethyl acetate as a solvent at a concentration of 0.01 g/L.

As the photopolymerization initiator used in the present invention, one kind may be used alone, or two or more kinds may be used in combination.

In the present invention, as the photopolymerization initiator, a combination of an aminoacetophenone compound and an oxime compound is also preferable. According to this aspect, a residue after pattern formation can be reduced.

the content of the photopolymerization initiator is preferably 0.1 to 50 mass %, more preferably 0.5 to 30 mass %, and still more preferably 1 to 20 mass % with respect to the total solid content of the coloring composition. In the above-described range, excellent sensitivity and pattern formability can be obtained. The coloring composition according to the present invention may include one photopolymerization initiator or two or more photopolymerization initiators. In a case where the coloring composition includes two or more photopolymerization initiators, it is preferable that the total content of the two or more photopolymerization initiators is in the above-described range.

<<<Organic Solvent>>>

The coloring composition according to the present invention can include an organic solvent. Basically, the organic solvent is not particularly limited as long as it satisfies the solubility of each component and the coating properties of the coloring composition. However, it is preferable that the organic solvent is selected in consideration of the coating properties and safety of the coloring composition.

Preferable examples of the organic solvent are as follows:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene.

Among these organic solvents, one kind may be used alone, or two or more kinds may be used in combination.

In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, as the organic solvent, an organic solvent containing 0.8 mmol/L or lower of a peroxide is preferable, and an organic solvent containing no peroxide is more preferable.

In the present invention, an organic solvent having a low metal content is preferable. For example, the metal content in the organic solvent is preferably 10 ppb or lower. Optionally, an organic solvent having a metal content at a ppt level may be used. For example, such a high-purity solvent is available from Toyo Gosei Co., Ltd. (The Chemical Daily, Nov. 13, 2015).

Examples of a method of removing impurities such as metal from the organic solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluroethylene, polyethylene, or nylon is preferable.

The organic solvent may include an isomer (a compound having the same number of atoms and a different structure). In addition, the organic solvent may include only one isomer or a plurality of isomers.

The amount of the organic solvent included in the coloring composition is preferably 10 to 90 mass %, more preferably 20 to 80 mass %, and still more preferably 25 to 75 mass % with respect to the total mass of the coloring composition.

<<<Polymerization Inhibitor>>>

The coloring composition according to the present invention may include a polymerization inhibitor in order to prevent unnecessary thermal polymerization of the polymerizable compound during the manufacturing or storage of the coloring composition.

Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium (III) salt. Among these, p-methoxyphenol is preferable.

The addition amount of the polymerization inhibitor is preferably 0.01 to 5 mass % with respect to the mass of the coloring composition.

<<<Substrate Adhesive>>>

The coloring composition according to the present invention may include a substrate adhesive.

As the substrate adhesive, a silane coupling agent, a titanate coupling agent, or an aluminum coupling agent can be preferably used.

Examples of the silane coupling agent include γ-methacryloxypropyl trimethoxy silane, γ-methacryloxypropyl triethoxy silane, γ-acryloxypropyl trimethoxy silane, γ-acryloxypropyl triethoxy silane, γ-mercaptopropyl trimethoxy silane, γ-aminopropyl triethoxy silane, and phenyl trimethoxy silane. Among these, γ-methacryloxypropyl trimethoxy silane is preferable as the substrate adhesive.

In addition, examples of the silane coupling agent include methyl trimethoxysilane, dimethyl dimethoxysilane, methyltriethoxysilane, and dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, hexamethyldisilazane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylethyldimethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. In addition, the following compounds can also be used.

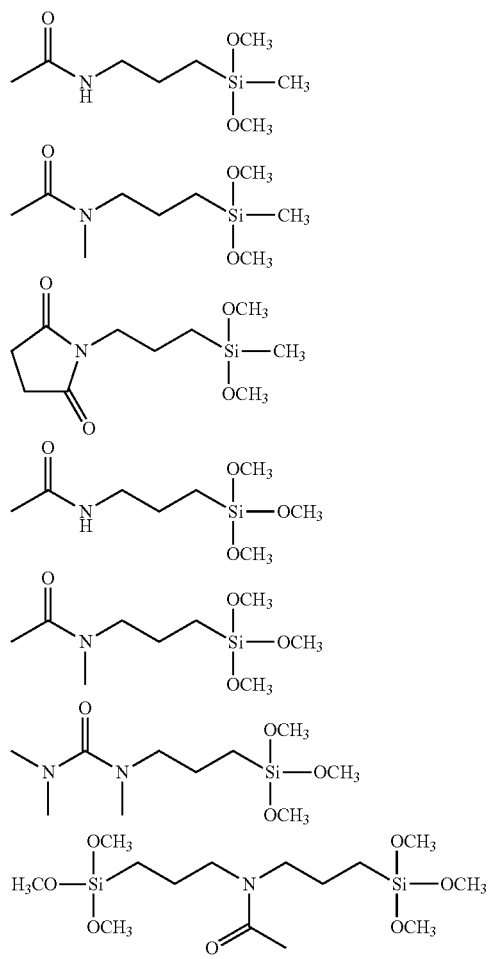

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.).

In addition, as the silane coupling agent, a silane coupling agent Y having at least a silicon atom, a nitrogen atom, and a curable functional group in a molecule and having a hydrolyzable group bonded to a silicon atom can also be used.

The hydrolyzable group refers to a substituent directly linked to a silicon atom and capable of forming a siloxane bond due to a hydrolysis reaction and/or a condensation reaction. Examples of the hydrolyzable group include a halogen atom, an alkoxy group, an acyloxy group, and an alkenyloxy group. In a case where the hydrolyzable group has carbon atoms, the number of carbon atoms is preferably 6 or less and more preferably 4 or less. In particular, an alkoxy group having 4 or less carbon atoms or an alkenyloxy group having 4 or less carbon atoms is preferable.

The silane coupling agent Y is not particularly limited as long as it has at least one silicon atom in a molecule thereof, and the silicon atom can be bonded to the following atoms and substituents. These atoms and substituents may be the same as or different from each other. Examples of the atoms and substituents bonded to the silicon atom include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituents may be further substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamide group, an alkoxycarbonyl group, an amide group, a urea group, an ammonium group, an alkylammonium group, a carboxy group or a salt thereof, or a sulfo group or a salt thereof.

At least one hydrolyzable group is bonded to the silicon atom. The definition of the hydrolyzable group is as described above.

The silane coupling agent Y may include a group represented by the following Formula (Z).

$$*\text{—}Si(R^{z1})_{3-m}(R^{z2})_m \qquad \text{Formula (Z)}$$

$R^{z1}$ represents an alkyl group, $R^{z2}$ represents a hydrolyzable group, and m represents an integer of 1 to 3. The number of carbon atoms in the alkyl group represented by $R^{z1}$ is preferably 1 to 5 and more preferably 1 to 3. The definition of the hydrolyzable group represented by $R^{z2}$ is as described above.

The silane coupling agent Y includes at least one nitrogen atom in a molecule thereof. It is preferable that the nitrogen atom is present in the form of a secondary amino group or a tertiary amino group, that is, it is preferable that the nitrogen atom has at least one organic group as a substituent. Regarding the structure of the amino group, the amino group may be present in a molecule in the form of a partial structure of a nitrogen-containing heterocycle, or may be present as an substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamide group, an alkoxycarbonyl group, a carbonyloxy group, an amide group, a urea group, an alkyleneoxy group, an ammonium group, an alkylammonium group, a carboxy group or a salt thereof, and a sulfo group.

In addition, it is preferable that the nitrogen atom is bonded to a curable functional group through an arbitrary organic linking group. Preferable examples of the organic linking group include the above-described substituents which can be introduced into the nitrogen atom and the organic group bonded to the nitrogen atom.

The curable functional group included in the silane coupling agent Y is preferably one or more groups selected from the group consisting of a (meth)acryloyloxy group, an epoxy group, an oxetanyl group, an isocyanate group, a hydroxy group, an amino group, a carboxy group, a thiol group, an alkoxysilyl group, a methylol group, a vinyl group, a (meth)acrylamide group, a styryl group, and a maleimide group, more preferably one or more groups selected from the group consisting of a (meth)acryloyloxy group, an epoxy group, and an oxetanyl group, and still more preferably one or more groups selected from the group consisting of a (meth)acryloyloxy group, an epoxy group, and an oxetanyl group.

The silane coupling agent Y is not particularly limited as long as it has at least one curable functional group in a molecule thereof. However, the silane coupling agent Y may have two or more curable functional groups. From the viewpoints of sensitivity and stability, the number of curable functional groups in a molecule is preferably 2 to 20, more preferably 4 to 15, and most preferably 6 to 10.

Examples of the silane coupling agent Y include a compound represented by the following Formula (Y).

$R^{y1}$ represents an alkyl group, $R^{y2}$ represents a hydrolyzable group, and $R^{y3}$ represents a curable functional group.

LN represents a (n+1) valent linking group having a nitrogen atom.

m represents an integer of 1 to 3, and n represents an integer of 1 or more.

$R^{y1}$, $R^{y2}$, and m in Formula (Y) have the same definitions and the same preferable ranges as those of $R^{z1}$, $R^{z2}$, and m in Formula (Z).

In Formula (Y), $R^{y3}$ represents a curable functional group. Examples of the curable functional group include the groups described regarding the curable functional group included in the silane coupling agent Y.

n in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from groups represented by the following Formula (LN-1) to (LN-4), and a group of a combination of at least one group selected from groups represented by the following Formula (LN-1) to (LN-4), —CO—, —CO$_2$—, —O—, —S—, and —SO$_2$—. The alkylene group may be linear or branched. The alkylene group and the arylene group may have a substituent or may be unsubstituted. Examples of the substituent include a halogen atom and a hydroxy group.

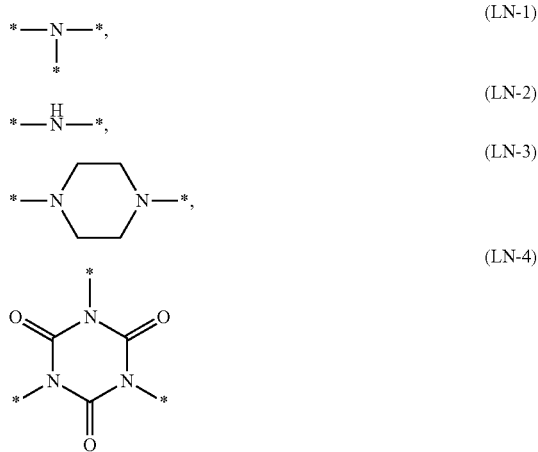

In the formula, * represents a direct bond.

Specific examples of the silane coupling agent Y include the following compounds. In the formula, Et represents an ethyl group. Other examples of the silane coupling agent Y include a compound described in paragraphs "0018" to "0036" of JP2009-288703A, the content of which is incorporated herein by reference.

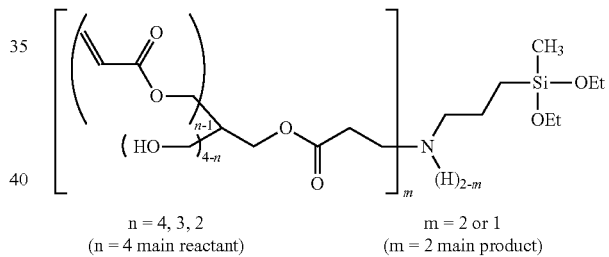

n = 4, 3, 2
(n = 4 main reactant)

m = 2 or 1
(m = 2 main product)

The content of the substrate adhesive is preferably 0.1 to 30 mass %, more preferably 0.5 to 20 mass %, and still more preferably 1 to 10 mass % with respect to the total solid content of the coloring composition.

<<<Surfactant>>>

The coloring composition according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the coloring composition according to the present invention containing a fluorine surfactant, liquid characteristics (for example, fluidity) of a coating solution prepared from the coloring composition are further improved, and the uniformity in coating thickness and liquid saving properties can be further improved.

That is, in a case where a film is formed using a coating solution prepared using the coloring composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include: MEGAFACE F171, F172, F173, F176, F177, F141, F142, F143, F144, R30, F437, F475, F479, F482, F554, F780, and RS-72-K (all of which are manufactured by DIC Corporation); FLUO-RAD FC430, FC431, and FC171 (all of which are manufactured by Sumitomo 3M Ltd.); SURFLON S-382, SC-101, SC-103, SC-104, SC-105, SC1068, SC-381, SC-383, S393, and KH-40 (all of which are manufactured by Asahi Glass Co., Ltd.); and PF636, PF656, PF6320, PF6520, and PF7002 (all of which are manufactured by OMNOVA Solutions Inc.). As the fluorine surfactant, a compound described in paragraphs "0117" to "0132" of JP2011-132503A, or a compound described in paragraphs "0015" to "0158" of JP2015-117327A can also be used. As the fluorine surfactant, a block polymer can also be used, and specific examples thereof include a compound described in JP2011-89090A.

As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include a phthalocyanine derivative (trade name: EFKA-745, manufactured by Morishita Co.,Ltd.), an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The addition amount of the surfactant is preferably 0.001 to 2.0 mass % and more preferably 0.005 to 1.0 mass % with respect to the total mass of the coloring composition.

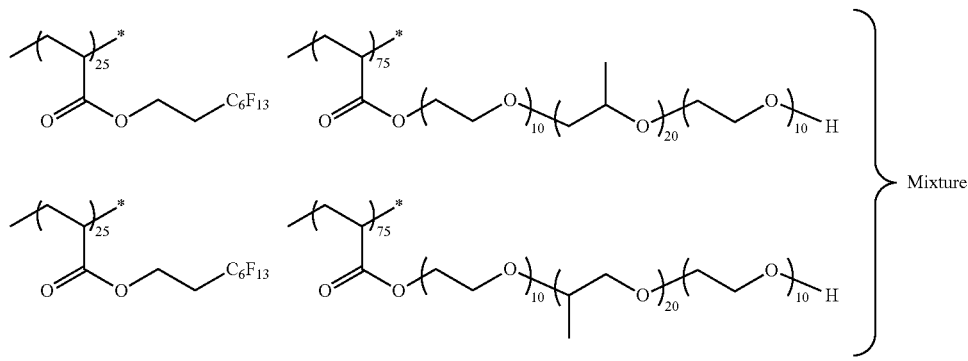

The weight-average molecular weight of the compound is, for example, 14000.

In addition, a fluorine-containing polymer having an ethylenically unsaturated group at a side chain can also be preferably used as the fluorine surfactant. Specific examples include compounds described in paragraphs "0050" of "0090" and paragraphs "0289" to "0295" of JP2010-164965A, for example, MEGAFACE RS-101, RS-102, and RS-718K manufactured by DIC Corporation.

Specific examples of the nonionic surfactant include glycerol, trimethylolpropane, trimethylolethane, an ethoxylate and a propoxylate thereof (for example, glycerol propoxylate or glycerin ethoxylate), polyoxyethylene lauryl <<<Other Components>>>

The coloring composition according to the present invention may include: a thermal polymerization initiator such as an azo compound or a peroxide compound; an ultraviolet absorber such as a thermal polymerization component or alkoxy benzophenone; a plasticizer such as dioctyl phthalate; a developability improving agent such as a low molecular weight organic carboxylic acid; and other various additives such as a filler, an antioxidant, or an aggregation inhibitor.

In addition, in order to increase the degree of cure of a film during heating after development, a thermal curing agent can be added. Examples of the thermal curing agent include a thermal polymerization initiator such as an azo compound or a peroxide, a novolac resin, a resol resin, an epoxy compound, and a styrene compound.

Depending on materials used and the like, the coloring composition may include a metal element. From the viewpoint of, for example, suppressing the generation of defects, the content of a Group 2 element (for example, calcium or magnesium) in the coloring composition is controlled to be preferably 50 ppm or lower and more preferably 0.01 to 10 ppm. In addition, the total amount of inorganic metal salts in the coloring composition is controlled to be preferably 100 ppm or lower and more preferably 0.5 to 50 ppm.

(Method of Preparing Coloring Composition)

The coloring composition according to the present invention can be prepared by mixing the above-described components with each other.

During the preparation of the coloring composition, the respective components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, two or more solutions or dispersions may be appropriately prepared using the respective components, and the solutions or dispersions may be mixed with each other during use (during application) to prepare the composition.

In a case where a pigment is used as the coloring material that shields light in the visible range and the infrared absorber, it is preferable that the composition is prepared using a method including: preparing a pigment dispersion by dispersing the pigment and optionally other components such as a resin, an organic solvent, or a pigment derivative; and mixing the obtained pigment dispersion with other components of the coloring composition.

The pigment dispersion may be prepared by dispersing the coloring material that shields light in the visible range and the infrared absorber separately or by dispersing (co-dispersing) the coloring material that shields light in the visible range and the infrared absorber together. In particular, in a case where a pyrrolopyrrole compound (preferably a pyrrolopyrrole compound represented by Formula (1)) is used as the infrared absorber, it is preferable that the pyrrolopyrrole compound and a chromatic colorant are co-dispersed. According to this embodiment, the dispersion stability of the pyrrolopyrrole compound can be improved.

During the preparation of the coloring composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 µm and is preferably about 0.01 to 3.0 µm and more preferably about 0.05 to 0.5 µm. In the above-described range, fine foreign matter, which inhibits a fine and smooth composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the second filtering using the second filter may be performed on a mixture of the dispersion and other components.

It is preferable that the coloring composition according to the present invention satisfies at least one of the following spectral characteristics (1) to (5).

(1) In a case where a film having a thickness of 1 µm after drying is formed, a maximum value of a light transmittance of the film in a thickness direction in a wavelength range of 400 to 830 nm is 20% or lower, and a minimum value of a light transmittance of the film in the thickness direction in a wavelength range of 1000 to 1300 nm is 70% or higher. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

(2) In a case where a film having a thickness of 2 µm after drying is formed, a maximum value of a light transmittance of the film in a thickness direction in a wavelength range of 400 to 830 nm is 20% or lower, and a minimum value of a light transmittance of the film in the thickness direction in a wavelength range of 1000 to 1300 nm is 70% or higher. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

(3) In a case where a film having a thickness of 3 µm after drying is formed, a maximum value of a light transmittance of the film in a thickness direction in a wavelength range of 400 to 830 nm is 20% or lower, and a minimum value of a light transmittance of the film in the thickness direction in a wavelength range of 1000 to 1300 nm is 70% or higher. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

(4) In a case where a film having a thickness of 5 µm after drying is formed, a maximum value of a light transmittance of the film in a thickness direction in a wavelength range of 400 to 830 nm is 20% or lower, and a minimum value of a light transmittance of the film in the thickness direction in a wavelength range of 1000 to 1300 nm is 70% or higher. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

(5) In a case where a film having a thickness of 2.4 μm after drying is formed, a maximum value of a light transmittance of the film in a thickness direction in a wavelength range of 400 to 830 nm is 20% or lower, and a minimum value of a light transmittance of the film in the thickness direction in a wavelength range of 1000 to 1300 nm is 70% or higher. The maximum value in a wavelength range of 400 to 830 nm is more preferably 20% or lower and still more preferably 10% or lower. The minimum value in a wavelength range of 1000 to 1300 nm is more preferably 70% or higher and still more preferably 80% or higher.

In addition, at at least one value in the above film thickness range, the minimum value A of the absorbance in a wavelength range of 400 to 830 nm is, for example, preferably 0.1 to 5 and more preferably 0.3 to 3. In addition, the maximum value B of the absorbance in a wavelength range of 1000 to 1300 nm is, for example, preferably 0.01 to 0.5 and more preferably 0.02 to 0.3.

<Film>

Next, a film according to the present invention will be described.

The film according to the present invention is formed by curing the above-described coloring composition according to the present invention. The film according to the present invention is preferably used as a color filter. The film according to the present invention is more preferably used as an infrared transmitting filter.

It is preferable that the film according to the present invention has the following spectral characteristics (1) and/ or (2). According to this aspect, a film capable of allowing transmission of infrared light (preferably light having a wavelength of 900 nm or longer) in a state where noise generated from visible light is small can be formed.

(1): It is preferable that a maximum value of a light transmittance of the film in a thickness direction in a wavelength range of 400 to 830 nm is 20% or lower and that a minimum value of a light transmittance of the film in the thickness direction in a wavelength range of 1000 to 1300 nm is 70% or higher. The maximum value of the light transmittance in the thickness direction of the film in a wavelength range of 400 to 830 nm is preferably 20% or lower and more preferably 10% or lower. The minimum value of the light transmittance in the thickness direction of the film in a wavelength range of 1000 to 1300 nm is preferably 70% or higher and more preferably 80% or higher.

(2): It is preferable that a maximum value of a light transmittance of the film in a thickness direction in a wavelength range of 450 to 650 nm is 20% or lower, that a light transmittance of the film in the thickness direction at a wavelength of 835 nm is 20% or lower, and that a minimum value of a light transmittance of the film in the thickness direction in a wavelength range of 1000 to 1300 nm is 70% or higher. The maximum value of the light transmittance of the film in the thickness direction in a wavelength range of 450 to 650 nm is preferably 20% or lower and more preferably 10% or lower. The maximum value of the light transmittance of the film in the thickness direction in a wavelength range of 650 to 835 nm is preferably 50% or lower and more preferably 30% or lower. The light transmittance of the film in the thickness direction at a wavelength of 835 nm is preferably 20% or lower and more preferably 10% or lower. The minimum value of the light transmittance of the film in the thickness direction in a wavelength range of 1000 to 1300 nm is preferably 70% or higher and more preferably 80% or higher.

The spectral characteristics of the film according to the present invention are values obtained by measuring the transmittance in a wavelength range of 300 to 1300 nm using an ultraviolet-visible-near infrared spectrophotometer (U-4100, manufactured by Hitachi High-Technologies Corporation).

The thickness of the film according to the present invention is not particularly limited and is preferably 0.1 to 20 μm and more preferably 0.5 to 10 μm.

<Pattern Forming Method, Color Filter, and Method for Manufacturing Color Filter>

Next, a pattern forming method and a color filter according to the present invention will be described in detail using a manufacturing method thereof. In addition, a method for manufacturing a color filter according to the present invention in which the pattern forming method is used will also be described.

The pattern forming method according to the present invention includes: a step of forming a coloring composition layer on a support using the coloring composition; a step of exposing the coloring composition layer in a pattern shape; and a step of forming a colored pattern by removing a non-exposed portion by development.

This pattern forming method is used for manufacturing a color filter. That is, the present invention also discloses the method for manufacturing a color filter including the pattern forming method. Hereinafter, the details will be described.

<<Step of Forming Coloring Composition Layer>>

In the step of forming a coloring composition layer, the coloring composition according to the present invention is applied to a support to form a coloring composition layer thereon.

Examples of the support include a substrate formed of a material such as silicon, non-alkali glass, soda glass, PYREX (registered trade name) glass, or quartz glass. A charge coupled device (CCD), a complementary metal-oxide-semiconductor (CMOS), a transparent conductive film, or the like may be formed on the substrate. In addition, a black matrix may be formed to separate pixels from each other. Optionally, an undercoat layer may be provided on the support to improve adhesion with a layer above the support, to prevent diffusion of materials, or to make a surface of the substrate flat.

As a method of applying the coloring composition according to the present invention to the support, various coating methods such as slit coating, an ink jet method, spin coating, cast coating, roll coating, or screen printing method can be applied.

It is preferable that the coloring composition layer formed on the support is dried (pre-baked).

The pre-baking temperature is preferably 150° C. or lower, more preferably 120° C. or lower, still more preferably 100° C. or lower, and even still more preferably 90° C. or lower. The lower limit is, for example, 50° C. or higher. By performing pre-baking at 150° C. or lower, the characteristics can be effectively maintained, for example, even in a case where a photoelectric conversion film of an image sensor is formed of an organic material.

The pre-baking time is preferably 10 to 300 seconds, more preferably 40 to 250 seconds, and still more preferably 80 to 220 seconds. Heating can be performed using a hot plate, an oven, or the like.

The thickness of the colored layer after drying (pre-baking) is preferably 0.55 to 10 μm. For example, the upper limit is more preferably 7 μm or less, and still more preferably 5 µm or less. For example, the lower limit is more preferably 0.60 µm or more, still more preferably 0.70 µm or more, and even still more preferably 0.80 µm or more.

<<Exposure Step>>

Next, the coloring composition layer is exposed in a pattern shape (exposure step). For example, the coloring composition layer is exposed in a pattern shape using an exposure device such as a stepper through a mask having a predetermined mask pattern, thereby exposing a pattern. As a result, an exposed portion can be cured.

As radiation (light) used during the exposure, in particular, ultraviolet rays such as g-rays or i-rays are preferably used (i-rays are more preferably used). The irradiation dose (exposure dose) is preferably 30 to 1500 mJ/cm$^2$, more preferably 50 to 1000 mJ/cm$^2$, and still more preferably 80 to 500 mJ/cm$^2$.

The oxygen concentration during exposure can be appropriately selected. For example, exposure may be performed in a low oxygen atmosphere having an oxygen concentration of 19 vol % or lower (for example, preferably 15 vol % or lower, more preferably 5 vol % or lower, and still more preferably 0 vol %), or exposure may be performed in a high oxygen atmosphere having an oxygen concentration of higher than 21 vol % (for example, preferably 22 vol % or higher, more preferably 30 vol % or higher, and still more preferably 50 vol % or higher) In addition, the illuminance of exposure energy can be appropriately in a range of 1000 W/m$^2$ to 100000 W/m$^2$ (for example, preferably 5000 W/m$^2$ or higher, more preferably 15000 W/m$^2$ or higher, and still more preferably 35000 W/m$^2$ or higher). Conditions of the oxygen concentration and conditions of the exposure illuminance may be appropriately combined. For example, conditions are oxygen concentration: 10 vol % and illuminance: 10000 W/m$^2$, or oxygen concentration: 25 vol % and illuminance: 25000 W/m$^2$.

<<Development Step>>

Next, a pattern is formed by removing a non-exposed portion by development. The non-exposed portion can be removed by development using a developer. As a result, a non-exposed portion of the coloring composition layer in the exposure step is eluted into the developer, and only the photocured portion remains.

The development method may be any one of a dipping method, a shower method, a spray method, and a puddle method which may be used in combination with a swing method, a spin method, an ultrasonic method, or the like.

Before contact with the developer, a surface to be developed may be wetted with water or the like in advance to prevent unevenness in development.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the developer include an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5.4.0]-7-undecene. As the developer, an alkaline aqueous solution is preferably used in which the above alkaline agent is diluted with pure water such that a concentration thereof is 0.001 to 10 mass % and preferably 0.01 to 1 mass %.

In addition, an inorganic alkali may be used as the developer. Preferable examples of the inorganic alkali include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the coloring composition. Among these, a nonionic surfactant is preferable. In a case where the developer includes a surfactant, the content of the surfactant is preferably 0.001 to 2.0 mass % and more preferably 0.01 to 1.0 mass % with respect to the total mass of the developer.

In a case where a developer including the alkaline aqueous solution is used, in general, it is preferable that the film is rinsed with pure water after development.

In the present invention, after the exposure step and the drying, a heat treatment (post-baking) or a curing step of curing the film by post-exposure may be performed.

Post-baking is a heat treatment which is performed after development to complete curing. For example, the heating temperature is preferably 100° C. to 240° C. and more preferably 200° C. to 240° C. In addition, in a case where an organic electroluminescence (organic EL) element is used as a light-emitting light source, or in a case where a photoelectric conversion film of an image sensor is formed of an organic material, the heating temperature is preferably 150° C. or lower, more preferably 120° C. or lower, still more preferably 100° C. or lower, and even still more preferably 90° C. or lower. The lower limit is, for example, 50° C. or higher.

The film after the development is post-baked continuously or batchwise using heating means such as a hot plate, a convection oven (hot air circulation dryer), a high-frequency heater under the above-described conditions.

In a case where light is used for post-baking, for example, g-rays, h-rays, i-rays, excimer laser such as KrF or ArF, electron rays, or X-rays can be used. It is preferable that post-baking is performed using an existing high-pressure mercury lamp at a low temperature of about 20° C. to 50° C., and the irradiation time is 10 seconds to 180 seconds and preferably 30 seconds to 60 seconds. In a case where post-exposure and post-heating are performed in combination, it is preferable that post-exposure is performed before post-heating.

By performing the above-described respective steps, a color filter is prepared.

The color filter may consist of only colored pixels having the above-specific spectral characteristics according to the present invention, or may include not only the colored pixels having the above-described spectral characteristics but also colored pixels of red, green, blue, magenta, yellow, cyan, black, or transparent color. In a case where the color filter includes not only the colored pixels having the spectral characteristics but also other color pixels, the colored pixels having the specific spectral characteristics according to the present invention may be provided before or after the other color pixels.

In addition, in the pattern forming method according to the present invention, in order efficiently clean contaminants and the like, which are formed by clogging of a nozzle or a pipe of a discharge portion of an application device, and attachment, precipitation, and drying of the composition in an application device, it is preferable that the solvent relating to the coloring composition according to the present invention is used as a cleaning solution. In addition, a cleaning solution described in JP1995-128867A (JP-H7-128867A), JP1995-146562A (JP-117-146562A), JP1996-278637A (JP-H8-278637A), JP2000-273370A, JP2006-85140A, JP2006-291191A, JP2007-2101A, JP2007-2102A, or JP2007-281523A can be preferably used.

Among these, alkylene glycol monoalkyl ether carboxylate, or alkylene glycol monoalkyl ether is preferable.

Among these solvents, one kind may be used alone, or two or more kinds may be used in combination. In a case where a mixture of two or more solvents is used, it is preferable that a solvent having a hydroxy group is mixed with a solvent having no hydroxy group with each other. A mass ratio of the solvent having a hydroxy group to the solvent having no hydroxy group is 1/99 to 99/1, preferably 10/90 to 90/10, and more preferably 20/80 to 80/20. A mixed solvent obtained by mixing propylene glycol monomethyl ether acetate (PGMEA) and propylene glycol monomethyl ether (PGME) with each other at a ratio of 60/40 is more preferable. In order to improve permeability of the cleaning solution into contaminants, the surfactant relating to the coloring composition according to the present invention may be added to the cleaning solution.

<Solid Image Pickup Element>

A solid image pickup element according to the present invention includes the color filter according to the present invention. The solid image pickup element according to the present invention is configured to include the color filter according to the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a CCD image sensor or a CMOS image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the color filter for a solid image pickup element according to the present invention is formed on the device protective film.

Further, a configuration in which light collecting means (for example, a microlens; hereinafter, the same shall be applied) is provided above the device protective film and below the color filter (on a side thereof close the support), or a configuration in which light collecting means is provided on the color filter may be adopted.

<Infrared Sensor>

An infrared sensor according to the present invention includes the color filter according to the present invention. The configuration of the infrared sensor according to the present invention is not particularly limited as long as it includes the color filter according to the present invention and functions as an infrared sensor.

Hereinafter, an embodiment of the infrared sensor according to the present invention will be described using FIG. 1.

In an infrared sensor 100 shown in FIG. 1, reference numeral 110 represents a solid image pickup element.

In an imaging region provided on the solid image pickup element 110, infrared absorbing filters 111 and color filters 112 are provided.

The infrared absorbing filters 111 are configured to allow transmission of light in the visible range (for example light having a wavelength of 400 to 700 nm) and to shield light in the infrared range (for example, light having a wavelength of 800 to 1300 nm, preferably light having a wavelength of 900 to 1200 nm, and more preferably light having a wavelength of 900 to 1000 nm).

In the color filters 112, pixels which allow transmission of light having a specific wavelength in the visible range and absorbs the light. For example, pixels of red (R), green (G), and blue (B) are formed in the color filters 112.

Regions 114 where the infrared absorbing filters 111 are not formed are provided between infrared transmitting filters 113 and the solid image pickup element 110. In the regions 114, resin layers (for example, transparent resin layers) capable of allowing transmission of light having a wavelength which has passed through the infrared transmitting filters 113 are disposed.

The infrared transmitting filters 113 have visible light shielding properties, allow transmission of infrared light having a specific wavelength, and are formed of the color filter (film) according to the present invention having the above-described spectral characteristics. For example, it is preferable that the infrared transmitting filters 113 shield light having a wavelength of 400 to 830 nm and allow transmission of light having a wavelength of 900 to 1300 nm.

Microlenses 115 are disposed on an incidence ray hv side of the color filters 112 and the infrared transmitting filters 113. A planarizing layer 116 is formed so as to cover the microlenses 115.

In the embodiment shown in FIG. 1, the resin layers are disposed in the regions 114. However, the infrared transmitting filters 113 may be formed in the regions 114. That is, the infrared transmitting filters 113 may be formed on the solid image pickup element 110.

In addition, in the embodiment shown in FIG. 1, the thickness of the color filters 112 is the same as the thickness of the infrared transmitting filters 113. However, the thickness of the color filters 112 may be different from the thickness of the infrared transmitting filters 113.

In addition, in the embodiment shown in FIG. 1, the color filters 112 are provided on the incidence ray hv side compared to the infrared absorbing filters 111. The lamination order of the infrared absorbing filters 111 and the color filters 112 may be reversed, and the infrared absorbing filters 111 may be provided on the incidence ray hv side compared to the color filters 112.

In addition, in the embodiment shown in FIG. 1, the infrared absorbing filters 111 and the color filters 112 are laminated adjacent to each other. However, the infrared absorbing filters 111 and the color filters 112 are not necessarily provided adjacent to each other, and another layer may be provided therebetween.

According to this infrared sensor, image information can be acquired in real time. Therefore, the infrared sensor can be used for motion sensing in a case where a motion detecting target is recognized. Further, since distance information can be acquired, for example, an image including 3D information can be obtained.

Next, an imaging device will be described as an example to which the infrared sensor according to the present invention is applied. Examples of the imaging device include a camera module.

Figure 2:
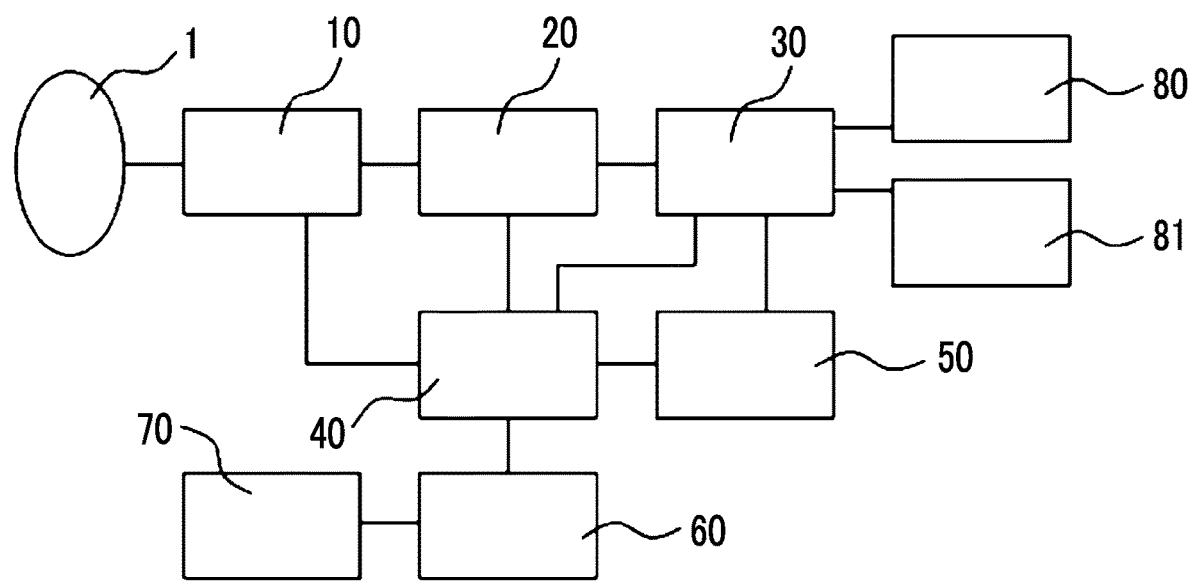
FIG. 2 is a functional block diagram showing an imaging device to which the infrared sensor according to the present invention is applied.

FIG. 2 is a functional block diagram showing the imaging device. The imaging device includes a lens optical system 1, a solid image pickup element 10, a signal processing unit 20, a signal switching unit 30, a control unit 40, a signal storage unit 50, a light emission control unit 60, an infrared light emitting diode (LED) 70 of a light emitting element which emits infrared light, and image output units 80 and 81. As the solid image pickup element 10, the above-described infrared sensor 100 can be used. In addition, a part or all of other components of the imaging device excluding the solid image pickup element 10 and the lens optical system 1 may be formed on the same semiconductor substrate. The respective configurations of the imaging device can be found in paragraphs "0032" to "0036" of JP2011-233983A, the content of which is incorporated herein by reference.

<Image Display Device>

A filter which is prepared using the coloring composition according to the present invention can also be used in an image display device such as a liquid crystal display device or an organic electroluminescence (organic EL) display device. For example, by using the filter in combination with respective colored pixels (for example, red, green, blue), the filter can be used in order to form an infrared pixel in addition to the respective color display pixels.

The definition of a display device and the details of each display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd., 1989)". In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices descried in "Next-Generation Liquid Crystal Display Techniques".

The image display device may include a white organic EL element as a display element. It is preferable that the white organic EL element has a tandem structure. The tandem structure of the organic EL element is described in, for example, JP2003-45676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

EXAMPLES

Hereinafter, the present invention will be described in more detail using examples. However, the present invention is not limited to the following examples as long as it does not depart from the scope of the present invention. Unless specified otherwise, "part(s)" and "%" represent "part(s) by mass" and "mass %".

Test Example 1

[Preparation of Pigment Dispersions 1-1 to 1-9]

A mixed solution having a composition shown in the table below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. As a result, a pigment dispersion was prepared. In addition, each of pigment dispersions 1-1 to 1-3 and 1-6 to 1-9 was prepared by mixing and dispersing the components until an average particle size of an infrared absorber was as shown in the table below. The table below shows the amounts (unit: part(s) by mass) of the corresponding components.

The volume average particle size of a pigment in the pigment dispersion was measured using MICROTRAC UPA 150 (manufactured by Nikkiso Co., Ltd.). The measurement results are shown in the table below.

[Preparation of Pigment Dispersions 2-1 to 2-12, 3-1, and 3-2]

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared. The table below shows the amounts (unit: part(s) by mass) of the corresponding components.

TABLE 13

| | Infrared Absorber | | | | | |
|---|---|---|---|---|---|---|
| | Kind | Average Particle Size (nm) | Coloring Material that Shields Light in Visible Range | Others | Resin | Organic Solvent |
| Pigment Dispersion 1-1 | Pyrrolopyrrole Pigment 1 (13.5) | 75 | | | Dispersion Resin 1 (4.0) | PGMEA (82.5) |
| Pigment Dispersion 1-2 | Pyrrolopyrrole Pigment 1 (13.5) | 150 | | | Dispersion Resin 1 (4.0) | PGMEA (82.5) |
| Pigment Dispersion 1-3 | Pyrrolopyrrole Pigment 2 (13.5) | 200 | | | Dispersion Resin 1 (4.0) | PGMEA (82.5) |
| Pigment Dispersion 1-4 | Infrared Absorber (13.5) | — | | | Dispersion Resin 1 (4.0) | PGMEA (82.5) |
| Pigment Dispersion 1-5 | Infrared Absorber (13.5) | — | | | Dispersion Resin 1 (4.0) | PGMEA (82.5) |
| Pigment Dispersion 1-6 | TiOPc (12.9) | 100 | | | Dispersion Resin 3 (5.1) | PGMEA (82) |
| Pigment Dispersion 1-7 | TiOPc (12.9) | 100 | | | Dispersion Resin 5 (5.1) | PGMEA (82) |
| Pigment Dispersion 1-8 | Cyanine Pigment (13.5) | 100 | | | Dispersion Resin 4 (4.0) | PGMEA (82.5) |
| Pigment Dispersion 1-9 | Squarylium Pigment (13.5) | 100 | | | Dispersion Resin 4 (4.0) | PGMEA (82.5) |

TABLE 13-continued

| Kind | Infrared Absorber Average Particle Size (nm) | Coloring Material that Shields Light in Visible Range | Others | Resin | Organic Solvent |
|---|---|---|---|---|---|
| Pigment Dispersion 2-1 | — | PR254 (13.5) | | Dispersion Resin 2 (2.0) Alkali-Soluble Resin 1 (2.0) | PGMEA (82.5) |
| Pigment Dispersion 2-2 | — | PB15:6 (13.5) | | Dispersion Resin 3 (4.0) | PGMEA (82.5) |
| Pigment Dispersion 2-3 | — | PY139 (14.8) | | Dispersion Resin 1 (3.0) Alkali-Soluble Resin 1 (2.2) | PGMEA (80.0) |
| Pigment Dispersion 2-4 | — | PV23 (14.8) | | Dispersion Resin 1 (3.0) Alkali-Soluble Resin 1 (2.2) | PGMEA (80.0) |
| Pigment Dispersion 2-5 | — | Black Material 1 (14.8) | | Dispersion Resin 1 (5.2) | PGMEA (80.0) |
| Pigment Dispersion 2-6 | — | PG36 (14.8) | | Dispersion Resin 4 (5.2) | PGMEA (80.0) |
| Pigment Dispersion 2-7 | — | PR224 (13.5) | | Dispersion Resin 2 (2.0) Alkali-Soluble Resin 1 (2.0) | PGMEA (82.5) |
| Pigment Dispersion 2-8 | — | PO71 (13.5) | | Dispersion Resin 2 (2.0) Alkali-Soluble Resin 1 (2.0) | PGMEA (82.5) |
| Pigment Dispersion 2-9 | — | Black Material 2 (14.8) | | Dispersion Resin 4 (5.2) | PGMEA (80.0) |
| Pigment Dispersion 2-10 | — | Black Material 3 (14.8) | | Dispersion Resin 4 (5.2) | PGMEA (80.0) |
| Pigment Dispersion 2-11 | — | PG7 (14.8) | | Dispersion Resin 4 (5.2) | PGMEA (80.0) |
| Pigment Dispersion 2-12 | — | PY185 (14.8) | | Dispersion Resin 4 (5.2) | PGMEA (80.0) |
| Pigment Dispersion 3-1 | — | | Carbon Black (20.0) | Dispersion Resin 1 (3.3) | PGMEA (76.7) |
| Pigment Dispersion 3-2 | — | | Titanium Black (23.3) | Dispersion Resin 1 (2.3) | PGMEA (74.4) |

In the table, an abbreviation of each component is as follows.

Pyrrolopyrrole Pigment 1: the following structure (which was synthesized using a method described in JP2009-263614A) (an infrared absorber having an absorption maximum in a wavelength range of 800 to 900 nm)

Pyrrolopyrrole Pigment 2: the following structure (which was synthesized using a method described in JP2009-263614A) (an infrared absorber having an absorption maximum in a wavelength range of 800 to 900 nm)

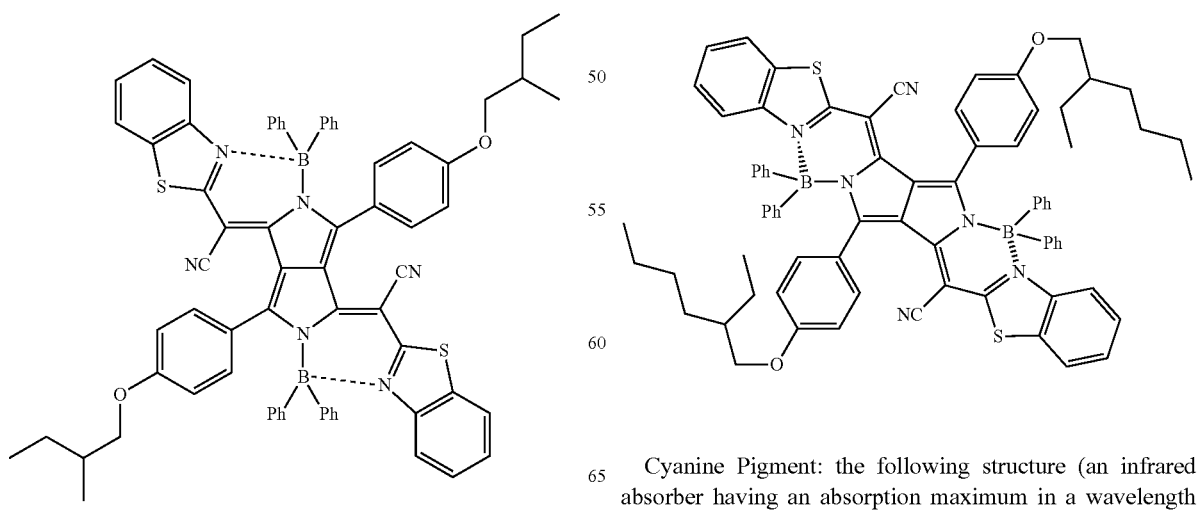

Cyanine Pigment: the following structure (an infrared absorber having an absorption maximum in a wavelength range of 800 to 900 nm)

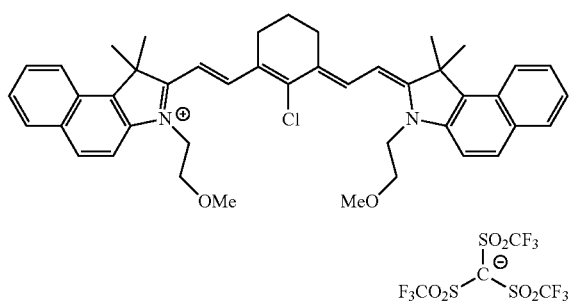

Squarylium Pigment: the following structure (an infrared absorber having an absorption maximum in a wavelength range of 800 to 900 nm)

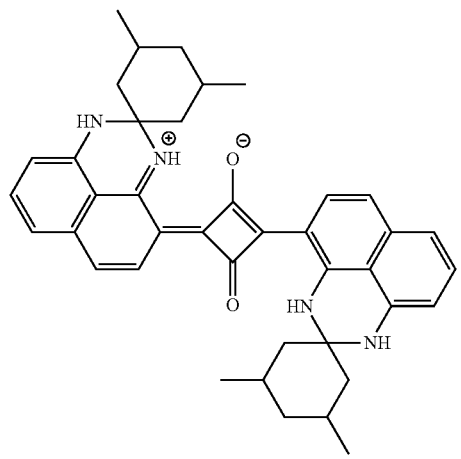 [SMILES: CC1CC(C)CC2(C1)Nc1cccc3ccc(C4=C([O-])/C(=c5/ccc6cccc7c6c5=[NH+]C5(CC(C)CC(C)C5)N7)C4=O)c(c13)N2]

Infrared Absorber 1: IRA842 (a naphthalocyanine compound, manufactured by Exiton, Inc.)

Infrared Absorber 2: FD-25 (manufactured by Yamada Chemical Co., Ltd.)

TiOPc: oxotitanyl phthalocyanine

VONPc: oxovanadyl naphthalocyanine

[Coloring Material that Shields Light in Visible Range]

PR254: Pigment Red 254

PR224: Pigment Red 224

PB15:6: Pigment Blue 15:6

PY139: Pigment Yellow 139

PY185: Pigment Yellow 185

PV23: Pigment Violet 23

PG36: Pigment Green 36

PG7: Pigment Green 7

PO71: Pigment Orange 71

Black Material 1: Irgaphor Black (manufactured by BASF SE)

Black Material 2: Pigment Black 31

Black Material 3: Pigment Black 32

[Others]

Carbon Black: Pigment Black 7

Titanium Black: manufactured by Mitsubishi Materials Corporation

[Resin]

Dipersion Resin 1: Disperbyk-111 (manufactured by BYK Chemie)

Dispersion Resin 2: the following structure (Mw: 7950)

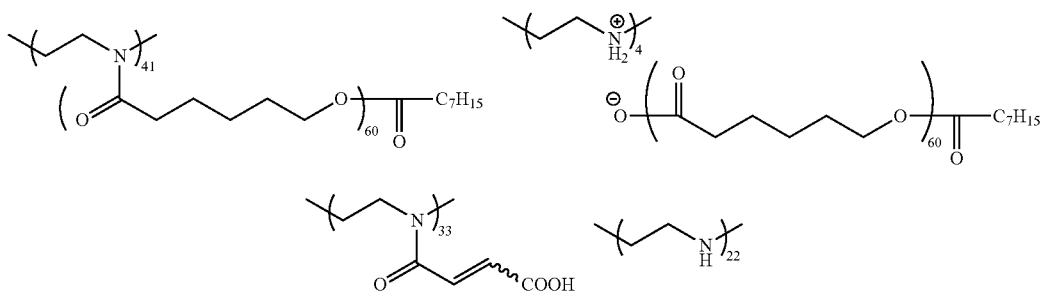

Dispersion Resin 3: the following structure (Mw: 30000)

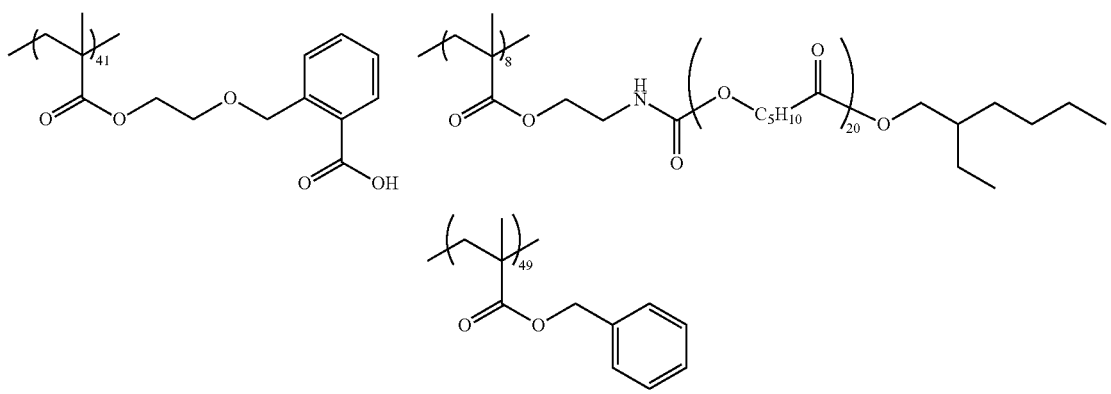

Dispersion Resin 4: the following structure (Mw: 24000)

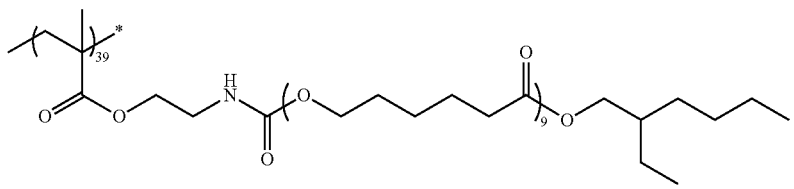

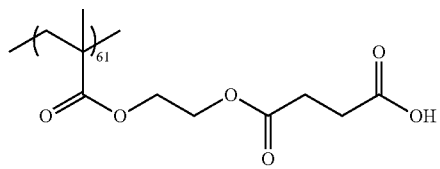

Dispersion Resin 5: the following structure (Mw: 38900)

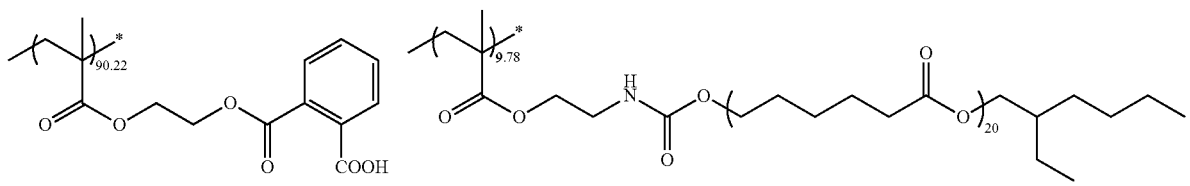

Alkali-Soluble Resin 1: the following structure (Mw:12000)

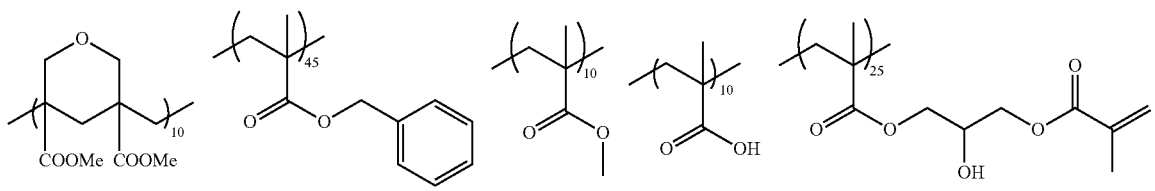

[Organic Solvent]
PGMEA: propylene glycol methyl ether acetate
[Preparation of Coloring Composition]
Components shown in the table below were mixed with each other at a ratio shown in the table below to prepare a coloring composition. The table below shows the amounts (unit: part(s) by mass) of the corresponding components.

TABLE 14

| | Example 1 | Example 2 | Example 3 | Example 4 | Example 5 | Example 6 | Example 7 | Example 8 | Example 9 |
|---|---|---|---|---|---|---|---|---|---|
| Pigment Dispersion 1-1 | 22.67 | | | | | | | | 22.67 |
| Pigment Dispersion 1-2 | | 22.67 | | 28.96 | | | | | |
| Pigment Dispersion 1-3 | | | 22.67 | | | | | | |
| Pigment Dispersion 1-4 | | | | | | | 22.67 | | |
| Pigment Dispersion 1-5 | | | | | | | | 22.67 | |
| Pigment Dispersion 3-1 | | | | | | | | | |
| Pigment Dispersion 3-2 | | | | | | | | | |
| Pigment Dispersion 1-6 | | | | | | | | | |
| Pigment Dispersion 1-7 | | | | | | | | | |
| Pigment Dispersion 1-8 | | | | | | | | | |
| Pigment Dispersion 1-9 | | | | | | | | | |
| Pyrrolopyrrole Dye 1 | | | | | 3.91 | | | | |
| Pyrrolopyrrole Dye 2 | | | | | | 3.91 | | | |
| Pigment Dispersion 2-1 | 11.33 | 11.33 | 11.33 | | 13.22 | 13.22 | 11.33 | 11.33 | |
| Pigment Dispersion 2-2 | 22.67 | 22.67 | 22.67 | 19.14 | 19.14 | 19.14 | 22.67 | 22.67 | 22.67 |

TABLE 14-continued

|  | | | | | | | | | |
|---|---|---|---|---|---|---|---|---|---|
| Pigment Dispersion 2-3 | 10.34 | 10.34 | 10.34 |  | 5.17 | 5.17 | 10.34 | 10.34 | 17.23 |
| Pigment Dispersion 2-4 | 6.89 | 6.89 | 6.89 |  | 4.36 | 4.36 | 6.89 | 6.89 | 10.34 |
| Pigment Dispersion 2-5 |  |  |  | 22.75 |  |  |  |  |  |
| Pigment Dispersion 2-6 |  |  |  |  |  |  |  |  |  |
| Pigment Dispersion 2-7 |  |  |  |  |  |  |  |  |  |
| Pigment Dispersion 2-8 |  |  |  |  |  |  |  |  |  |
| Pigment Dispersion 2-9 |  |  |  |  |  |  |  |  |  |
| Pigment Dispersion 2-10 |  |  |  |  |  |  |  |  |  |
| Pigment Dispersion 2-11 |  |  |  |  |  |  |  |  |  |
| Pigment Dispersion 2-12 |  |  |  |  |  |  |  |  |  |
| Polymerizable Compound 1 | 1.37 | 1.37 | 1.37 | 1.5 | 1.48 | 1.48 | 1.37 | 1.37 | 1.37 |
| Polymerizable Compound 2 |  |  |  |  |  |  |  |  |  |
| Alkali-Soluble Resin 1 | 3.52 | 3.52 | 3.52 | 4.9 | 7.81 | 7.81 | 3.52 | 3.52 | 3.31 |
| Photopolymerization Initiator 1 | 0.86 | 0.86 | 0.86 | 0.92 | 0.92 | 0.92 | 0.86 | 0.86 | 0.86 |
| Photopolymerization Initiator 2 |  |  |  |  |  |  |  |  |  |
| Substrate Adhesive 1 |  |  |  |  |  |  |  |  |  |
| Surfactant 1 | 0.42 | 0.42 | 0.42 | 0.42 | 0.42 | 0.42 | 0.42 | 0.42 | 0.42 |
| Polymerization Inhibitor 1 | 0.001 | 0.001 | 0.001 | 0.001 | 0.001 | 0.001 | 0.001 | 0.001 | 0.001 |
| Organic Solvent 1 | 19.93 | 19.93 | 19.93 | 21.41 | 43.57 | 43.57 | 19.93 | 19.93 | 21.13 |
| Organic Solvent 2 |  |  |  |  |  |  |  |  |  |

|  | Example 10 | Example 11 | Example 12 | Example 13 | Comparative Example 1 | Comparative Example 2 | Comparative Example 3 |
|---|---|---|---|---|---|---|---|
| Pigment Dispersion 1-1 | 22.67 | 22.67 | 22.67 | 22.67 |  |  |  |
| Pigment Dispersion 1-2 |  |  |  |  |  |  |  |
| Pigment Dispersion 1-3 |  |  |  |  |  |  |  |
| Pigment Dispersion 1-4 |  |  |  |  |  |  |  |
| Pigment Dispersion 1-5 |  |  |  |  |  |  |  |
| Pigment Dispersion 3-1 |  |  |  |  |  | 17 |  |
| Pigment Dispersion 3-2 |  |  |  |  |  |  | 14.59 |
| Pigment Dispersion 1-6 |  |  |  |  |  |  |  |
| Pigment Dispersion 1-7 |  |  |  |  |  |  |  |
| Pigment Dispersion 1-8 |  |  |  |  |  |  |  |
| Pigment Dispersion 1-9 |  |  |  |  |  |  |  |
| Pyrrolopyrrole Dye 1 |  |  |  |  |  |  |  |
| Pyrrolopyrrole Dye 2 |  |  |  |  |  |  |  |
| Pigment Dispersion 2-1 | 22.67 |  | 11.33 | 11.33 | 9.17 |  |  |
| Pigment Dispersion 2-2 | 22.67 | 11.33 | 22.67 | 22.67 | 18.35 |  |  |
| Pigment Dispersion 2-3 | 6.89 | 10.34 | 10.34 | 10.34 | 8.37 |  |  |
| Pigment Dispersion 2-4 |  | 13.78 | 6.89 | 6.89 | 5.58 |  |  |
| Pigment Dispersion 2-5 |  |  |  |  |  |  |  |
| Pigment Dispersion 2-6 |  | 15.11 |  |  |  |  |  |
| Pigment Dispersion 2-7 |  |  |  |  |  |  |  |
| Pigment Dispersion 2-8 |  |  |  |  |  |  |  |
| Pigment Dispersion 2-9 |  |  |  |  |  |  |  |
| Pigment Dispersion 2-10 |  |  |  |  |  |  |  |
| Pigment Dispersion 2-11 |  |  |  |  |  |  |  |
| Pigment Dispersion 2-12 |  |  |  |  |  |  |  |
| Polymerizable Compound 1 | 1.37 | 1.37 |  | 1.37 | 2.26 | 2.74 | 2.74 |
| Polymerizable Compound 2 |  |  | 1.37 |  |  |  |  |
| Alkali-Soluble Resin 1 | 3.73 | 3.38 | 3.52 | 3.52 | 14.3 | 21.46 | 22.02 |
| Photopolymerization Initiator 1 | 0.86 | 0.86 | 0.86 |  | 1.41 | 1.71 | 1.71 |
| Photopolymerization Initiator 2 |  |  |  | 0.86 |  |  |  |
| Substrate Adhesive 1 |  |  |  |  |  |  |  |
| Surfactant 1 | 0.42 | 0.42 | 0.42 | 0.42 | 0.42 | 0.42 | 0.42 |
| Polymerization Inhibitor 1 | 0.001 | 0.001 | 0.001 | 0.001 | 0.001 | 0.001 | 0.001 |
| Organic Solvent 1 | 18.72 | 20.74 | 19.93 | 10.93 | 40.14 | 56.67 | 58.52 |
| Organic Solvent 2 |  |  |  | 9.00 |  |  |  |

TABLE 15

|  | Example 14 | Example 15 | Example 16 | Example 17 | Example 18 | Example 19 | Example 20 | Example 21 |
|---|---|---|---|---|---|---|---|---|
| Pigment Dispersion 1-1 |  | 27.78 | 27.78 |  |  | 27.78 | 27.78 |  |
| Pigment Dispersion 1-2 |  |  |  |  |  |  |  |  |
| Pigment Dispersion 1-3 |  |  |  |  |  |  |  |  |
| Pigment Dispersion 1-4 |  |  |  |  |  |  |  |  |
| Pigment Dispersion 1-5 |  |  |  |  |  |  |  |  |
| Pigment Dispersion 3-1 |  |  |  |  |  |  |  |  |
| Pigment Dispersion 3-2 |  |  |  |  |  |  |  |  |
| Pigment Dispersion 1-6 | 19.38 |  |  |  | 21.32 |  |  | 21.32 |
| Pigment Dispersion 1-7 |  |  |  | 21.32 |  |  |  |  |
| Pigment Dispersion 1-8 |  |  |  |  |  |  |  |  |
| Pigment Dispersion 1-9 |  |  |  |  |  |  |  |  |

TABLE 15-continued

|  | | | | | | | |
|---|---|---|---|---|---|---|---|
| Pyrrolopyrrole Dye 1 | | | | | | | |
| Pyrrolopyrrole Dye 2 | | | | | | | |
| Pigment Dispersion 2-1 | 14.81 | 6.48 | | 10.19 | | 9.26 | 9.26 | 9.26 |
| Pigment Dispersion 2-2 | 5.56 | 5.56 | | | | 8.33 | 8.33 | |
| Pigment Dispersion 2-3 | 5.07 | | | | | | | |
| Pigment Dispersion 2-4 | | | | | | | | 6.42 |
| Pigment Dispersion 2-5 | | 17.74 | 28.72 | 11.82 | 28.72 | | | |
| Pigment Dispersion 2-6 | | | | | | | | |
| Pigment Dispersion 2-7 | | | | | | | | |
| Pigment Dispersion 2-8 | | | | | | | | |
| Pigment Dispersion 2-9 | | | | | | 20.27 | | |
| Pigment Dispersion 2-10 | | | | | | | 20.27 | |
| Pigment Dispersion 2-11 | | | | | | | | |
| Pigment Dispersion 2-12 | | | | | | | | 6.42 |
| Polymerizable Compound 1 | 5.25 | 4.67 | 4.67 | 5.28 | 4.96 | 4.35 | 4.35 | 5.12 |
| Polymerizable Compound 2 | | | | | | | | |
| Alkali-Soluble Resin 1 | 8.43 | 6.83 | 6.74 | 8.46 | 7.34 | 5.83 | 5.83 | 7.92 |
| Photopolymerization Initiator 1 | 2.52 | 2.24 | 2.24 | 2.54 | 2.38 | 2.09 | 2.09 | 2.46 |
| Photopolymerization Initiator 2 | | | | | | | | |
| Substrate Adhesive 1 | 0.73 | 0.73 | 0.73 | 0.73 | 0.73 | 0.73 | 0.73 | 0.73 |
| Surfactant 1 | 0.42 | 0.42 | 0.42 | 0.42 | 0.42 | 0.42 | 0.42 | 0.42 |
| Polymerization Inhibitor 1 | 0.001 | 0.001 | 0.001 | 0.001 | 0.001 | 0.001 | 0.001 | 0.001 |
| Organic Solvent 1 | 37.83 | 27.55 | 28.7 | 39.239 | 34.13 | 20.94 | 20.94 | 39.93 |
| Organic Solvent 2 | | | | | | | | |

| | Example 22 | Example 23 | Example 24 | Example 25 | Example 26 | Example 27 | Example 28 |
|---|---|---|---|---|---|---|---|
| Pigment Dispersion 1-1 | 27.78 | | | 27.78 | | | |
| Pigment Dispersion 1-2 | | | | | | | |
| Pigment Dispersion 1-3 | | | | | | | |
| Pigment Dispersion 1-4 | | | | 17.74 | | | |
| Pigment Dispersion 1-5 | | | | | | | |
| Pigment Dispersion 3-1 | | | | | | | |
| Pigment Dispersion 3-2 | | | | | | | |
| Pigment Dispersion 1-6 | | 21.32 | 21.32 | | | | |
| Pigment Dispersion 1-7 | | | | | | | 38.76 |
| Pigment Dispersion 1-8 | | | | | 27.78 | | |
| Pigment Dispersion 1-9 | | | | | | 27.78 | |
| Pyrrolopyrrole Dye 1 | | | | | | | |
| Pyrrolopyrrole Dye 2 | | | | | | | |
| Pigment Dispersion 2-1 | 16.67 | | | | 14.81 | 14.81 | 29.63 |
| Pigment Dispersion 2-2 | 3.7 | | | | 12.96 | 12.96 | 11.11 |
| Pigment Dispersion 2-3 | | | 15.2 | | 3.89 | 3.89 | 10.14 |
| Pigment Dispersion 2-4 | 845 | 10.14 | 10.14 | | | | |
| Pigment Dispersion 2-5 | | | | | | | |
| Pigment Dispersion 2-6 | | | | 7 | | | |
| Pigment Dispersion 2-7 | | | | 11.11 | | | |
| Pigment Dispersion 2-8 | | 18.52 | | | | | |
| Pigment Dispersion 2-9 | | | | | | | |
| Pigment Dispersion 2-10 | | | | | | | |
| Pigment Dispersion 2-11 | 11.49 | | | | | | |
| Pigment Dispersion 2-12 | | | | | | | |
| Polymerizable Compound 1 | 4.26 | 5.03 | 5.11 | 4.21 | 4.65 | 4.65 | 3.53 |
| Polymerizable Compound 2 | | | | | | | |
| Alkali-Soluble Resin 1 | 5.55 | 7.71 | 7.81 | 5.32 | 6.88 | 6.88 | 2.92 |
| Photopolymerization Initiator 1 | 2.04 | 2.42 | 2.45 | 2.02 | 2.23 | 2.23 | 1.7 |
| Photopolymerization Initiator 2 | | | | | | | |
| Substrate Adhesive 1 | 0.73 | 0.73 | 0.73 | 0.73 | 0.73 | 0.73 | 0.73 |
| Surfactant 1 | 0.42 | 0.42 | 0.42 | 0.42 | 0.42 | 0.42 | 0.42 |
| Polymerization Inhibitor 1 | 0.001 | 0.001 | 0.001 | 0.001 | 0.001 | 0.001 | 0.001 |
| Organic Solvent 1 | 18.91 | 33.71 | 36.82 | 23.67 | 25.65 | 25.65 | 1.06 |
| Organic Solvent 2 | | | | | | | |

In the table, an abbreviation of each component is as follows.

Pyrrolopyrrole Dye 1: the following structure (which was synthesized using a method described in JP2009-263614A) (an infrared absorber having an absorption maximum in a wavelength range of 800 to 900 nm)

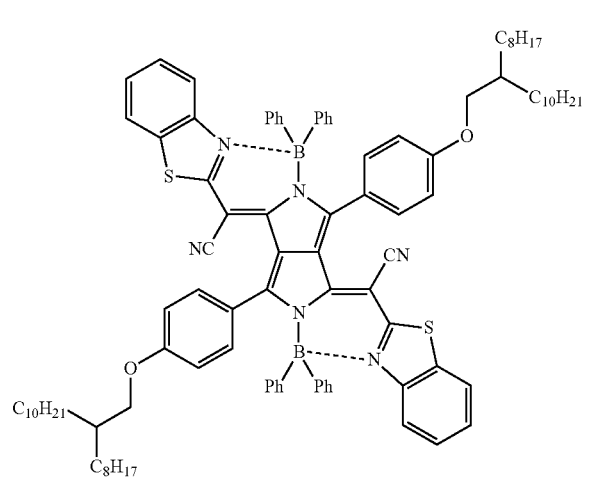

Pyrrolopyrrole Dye 2: the following structure (which was synthesized using a method described in JP2009-263614A) (an infrared absorber having an absorption maximum in a wavelength range of 800 to 900 nm)

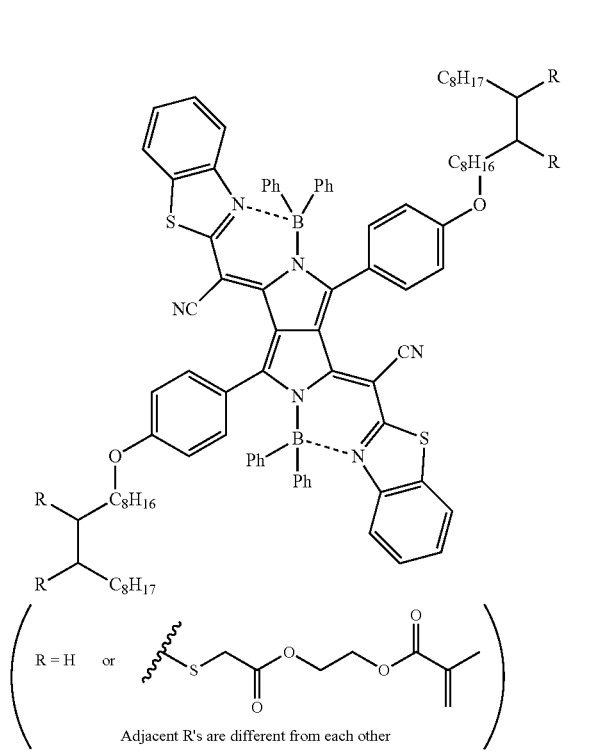

Polymerizable Compound 1: M-305 (including 55 to 63 mass % of triacrylate; manufactured by Toagosei Co., Ltd.), a mixture of the following compounds

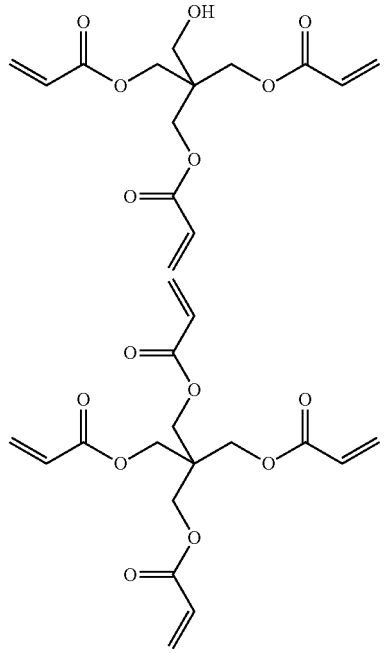

Polymerizable Compound 2: dipentaerythritol hexaacrylate (manufactured by Shin-Nakamura Chemical Co., Ltd., A-DPH)

Photopolymerization Initiator 1: IRGACURE OXE-01 (manufactured by BASF SE, the following structure)

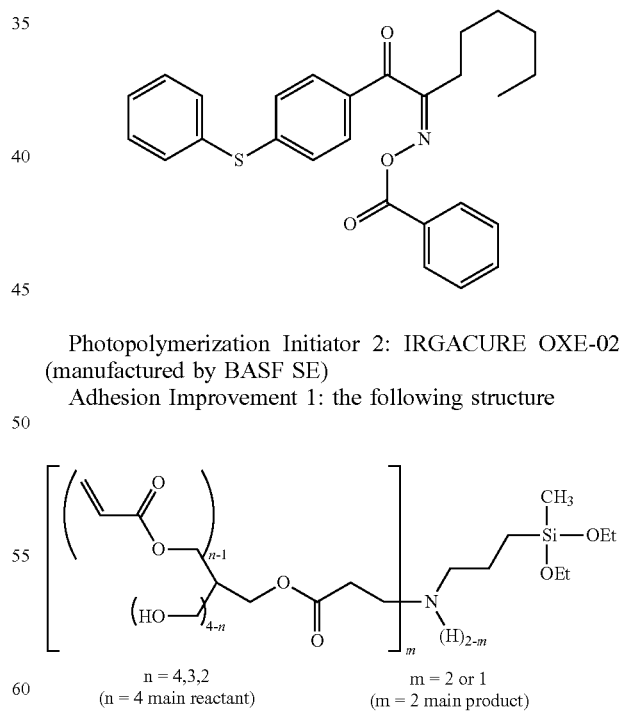

Photopolymerization Initiator 2: IRGACURE OXE-02 (manufactured by BASF SE)

Adhesion Improvement 1: the following structure

Surfactant 1: MEGAFACE F-781F (a fluorine-containing polymeric surfactant, manufactured by DIC Corporation)
Polymerization Inhibitor 1: p-methoxyphenol
Organic Solvent 1: propylene glycol methyl ether acetate
Organic Solvent 2: cyclohexanone

[Absorbance and Spectral Characteristics]

Specifically, the coloring composition was applied to a glass substrate using a spin coating method such that the thickness after post-baking was 3.0 µm (Examples 1 to 27 and Comparative Examples 1 to 3) or 1.5 µm (Example 28), was dried using a hot plate at 100° C. for 120 seconds, and then was further heated (post-baked) using a hot plate at 200° C. for 300 seconds.

Regarding the substrate including the colored layer, the light transmittance in a wavelength range of 300 to 1300 nm, the minimum value A of the absorbance in a wavelength range of 400 to 830 nm, and the maximum value B of the absorbance in a wavelength range of 1000 to 1300 nm were measured using an ultraviolet-visible-near infrared spectrophotometer U-4100 (manufactured by Hitachi High-Technologies Corporation).

[Preparation of Color Filter]

Each of the coloring compositions was applied to a silicon wafer using a spin coater such that the thickness of a dried film was 3.0 µm (Examples 1 to 27 and Comparative Examples 1 to 3) or 1.5 µm (Example 28), and was heated (pre-baked) using a hot plate at 100° C. for 120 seconds.

Next, using an i-ray stepper exposure device FPA-3000 i5+ (manufactured by Canon Corporation), the coloring composition was exposed at an optimum exposure dose through a photomask on which a square pixel pattern having a size of 1.4×1.4 µm was formed. The optimum exposure dose was determined based on an exposure dose at which the square pixel pattern was resolved while increasing the exposure dose from 50 to 750 mJ/cm$^2$ at an interval of 50 mJ/cm$^2$.

Next, the silicon wafer on which the exposed coating film was formed was placed on a horizontal rotary table of a spin-shower developing machine (DW-30, manufactured by Chemitronics Co., Ltd.) and underwent paddle development at 23° C. for 60 seconds using CD-2060 (a tetramethylammonium hydroxide aqueous solution, manufactured by Fujifilm Electronic Materials Co., Ltd.) to form a colored pattern on the silicon wafer.

The silicon wafer on which the colored pattern was formed was rinsed with pure water and was dried by spraying.

Further, the silicon wafer was heated (post-baked) using a hot plate at 200° C. for 300 seconds. This way, silicon wafers having the colored pattern were obtained as color filters.

<Evaluation>

[Heat Resistance]

Each of the color filters was heated using a hot plate at 260° C. for 300 seconds. The light transmittance (unit: %) of the color filter in a wavelength range of 400 to 830 nm was measured before and after heating to evaluate a change in transmittance.

Change in transmittance=|(Transmittance (%) after Heating-Transmittance (%) before Heating|

<Evaluation Criteria>

3: The change between the transmittances before and after heating is lower than 3%

2: The change between the transmittances before and after heating is 3% or higher and lower than 5%

1: The change between the transmittances before and after heating is 5% or higher [Spectral Identification] Each of the obtained color filters was incorporated into a solid image pickup element using a well-known method. Using the obtained solid image pickup element, an object was irradiated with a near infrared LED light source having an emission wavelength of 940 nm in a low-illuminance environment (0.001 Lux) to acquire images. Next, the image performances of the solid image pickup elements were compared to each other for evaluation. Evaluation criteria are as described below.

<Evaluation Standards>

3: Satisfactory (an object was able to be clearly recognized on the image)

2: Less satisfactory (an object was able to be recognized on the image)

1: Unsatisfactory (an object was not able to be recognized on the image)

TABLE 16

| | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 1 | 3 | 3 | 0.80% | 92% | 2.10 | 0.04 | 57.9 |
| Example 2 | 3 | 3 | 4.7% | 85% | 1.33 | 0.07 | 18.8 |
| Example 3 | 3 | 3 | 2.8% | 72% | 1.55 | 0.14 | 10.9 |
| Example 4 | 3 | 3 | 9.6% | 73% | 1.02 | 0.14 | 7.4 |
| Example 5 | 3 | 2 | 15% | 86% | 0.82 | 0.07 | 12.5 |
| Example 6 | 3 | 2 | 8.9% | 72% | 1.05 | 0.14 | 7.4 |
| Example 7 | 2 | 1 | 17% | 81% | 0.76 | 0.09 | 8.3 |
| Example 8 | 2 | 1 | 18% | 72% | 0.74 | 0.14 | 5.2 |
| Example 9 | 2 | 3 | 0.85% | 92% | 2.07 | 0.04 | 57.2 |
| Example 10 | 2 | 3 | 0.89% | 92% | 2.05 | 0.04 | 56.6 |
| Example 11 | 2 | 3 | 1.07% | 92% | 1.97 | 0.04 | 54.4 |
| Example 12 | 3 | 3 | 0.80% | 92% | 2.10 | 0.04 | 57.9 |
| Example 13 | 3 | 3 | 0.80% | 92% | 2.10 | 0.04 | 57.9 |
| Comparative Example 1 | 1 | 3 | 83% | 96% | 0.08 | 0.02 | 3.2 |
| Comparative Example 2 | 1 | 3 | 18% | 22% | 0.74 | 0.66 | 1.1 |
| Comparative Example 3 | 1 | 3 | 19% | 20% | 0.72 | 0.70 | 1.0 |
| Example 14 | 3 | 3 | 3% | 84% | 1.52 | 0.08 | 20.1 |
| Example 15 | 3 | 3 | 2.77% | 85.5% | 1.56 | 0.07 | 22.9 |
| Example 16 | 3 | 3 | 3% | 84.4% | 1.52 | 0.07 | 20.7 |
| Example 17 | 3 | 3 | 2.9% | 84% | 1.54 | 0.08 | 20.3 |
| Example 18 | 3 | 3 | 2.84% | 84% | 1.55 | 0.08 | 20.4 |
| Example 19 | 3 | 3 | 3.6% | 90% | 1.44 | 0.05 | 31.6 |

TABLE 16-continued

|  | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 20 | 3 | 3 | 3.6% | 90% | 1.44 | 0.05 | 31.6 |
| Example 21 | 3 | 3 | 3.1% | 84% | 1.51 | 0.08 | 19.9 |
| Example 22 | 3 | 3 | 2.55% | 89% | 1.59 | 0.05 | 31.5 |
| Example 23 | 3 | 3 | 3% | 84% | 1.52 | 0.08 | 20.1 |
| Example 24 | 3 | 3 | 3.3% | 84% | 1.48 | 0.08 | 19.6 |
| Example 25 | 3 | 3 | 4.2% | 88% | 1.38 | 0.06 | 24.8 |
| Example 26 | 3 | 1 | 3.2% | 82% | 1.49 | 0.09 | 17.3 |
| Example 27 | 3 | 3 | 3.1% | 82% | 1.51 | 0.09 | 17.5 |
| Example 28 | 3 | 3 | 3% | 84% | 1.52 | 0.08 | 20.1 |

In all the Examples in which the coloring composition according to the present invention was used, in a state where noise generated from visible light was small, the transmission of infrared light having an emission wavelength of 940 nm was allowed, and the spectral identification was satisfactory. On the other hand, in Comparative Examples 1 to 3, noise generated from visible light was large, and the spectral identification was unsatisfactory.

Test Example 2

[Preparation of Pigment Dispersions 4-1 to 4-9] A mixed solution having a composition shown in the table below was mixed and dispersed using a beads mill (a high-pressure dispersing machine with a pressure reducing mechanism, NANO-3000-10 (manufactured by Nippon BEE Chemical Co., Ltd.)), with zirconia beads having a diameter of 0.3 mm, until an average particle size of an infrared absorber was as shown in the table below. As a result, a pigment dispersion was prepared. The table below shows the amounts (unit: part(s) by mass) of the corresponding components.

The volume average particle size of a pigment in the pigment dispersion was measured using MICROTRAC UPA 150 (manufactured by Nikkiso Co., Ltd.). The results are shown in the table below.

TABLE 17

|  | Infrared Absorber | | | | | |
|---|---|---|---|---|---|---|
|  | Kind | Average Particle Size (nm) | Coloring Material that Shields Light in Visible Range | Colorant Derivative | Resin | Organic Solvent |
| Pigment Dispersion 4-1 | Pyrrolopyrrole Pigment 1 (3) | 100 | PR254 (4.5) | Colorant Derivative 1 (2.2) | Dispersion Resin 10 (7.3) | PGMEA (83) |
| Pigment Dispersion 4-2 | Pyrrolopyrrole Pigment 1 (3) | 100 | PR254 (4.5) | Colorant Derivative 1 (2.2) | Dispersion Resin 11 (7.3) | PGMEA (83) |
| Pigment Dispersion 4-3 | Pyrrolopyrrole Pigment 1 (3) | 100 | PR254 (4.5) | Colorant Derivative 1 (2.2) | Dispersion Resin 12 (7.3) | PGMEA (83) |
| Pigment Dispersion 4-4 | Pyrrolopyrrole Pigment 1 (3.3) | 100 | PB15:6 (5) |  | Dispersion Resin 10 (8.7) | PGMEA (83) |
| Pigment Dispersion 4-5 | Pyrrolopyrrole Pigment 1 (3.3) | 100 | PB15:6 (5) |  | Dispersion Resin 11 (8.7) | PGMEA (83) |
| Pigment Dispersion 4-6 | Pyrrolopyrrole Pigment 1 (3.3) | 100 | PB15:6 (5) |  | Dispersion Resin 12 (8.7) | PGMEA (83) |
| Pigment Dispersion 4-7 | Pyrrolopyrrole Pigment 1 (2.1) | 100 | PR254 (2.1) PB15:6 (2.1) | Colorant Derivative 1 (1.9) | Dispersion Resin 10 (6.8) | PGMEA (85) |
| Pigment Dispersion 4-8 | VONPc (8.5) | 100 |  | Colorant Derivative 1 (1.1) | Dispersion Resin 11 (5.4) | PGMEA (85) |
| Pigment Dispersion 4-9 | VONPc (8.5) | 100 |  | Colorant Derivative 1 (1.1) | Dispersion Resin 12 (5.4) | PGMEA (85) |

In the table, an abbreviation of each component is as follows.

Pyrrolopyrrole Pigment 1: Pyrrolopyrrole Pigment 1 used in Test Example 1

TiOPc: oxotitanyl phthalocyanine

VONPc: oxovanadyl naphthalocyanine

PR254: Pigment Red 254

PB15:6: Pigment Blue 15:6

PGMEA: propylene glycol methyl ether acetate

Dipersion Resin 10: the following structure (Mw: 8500)

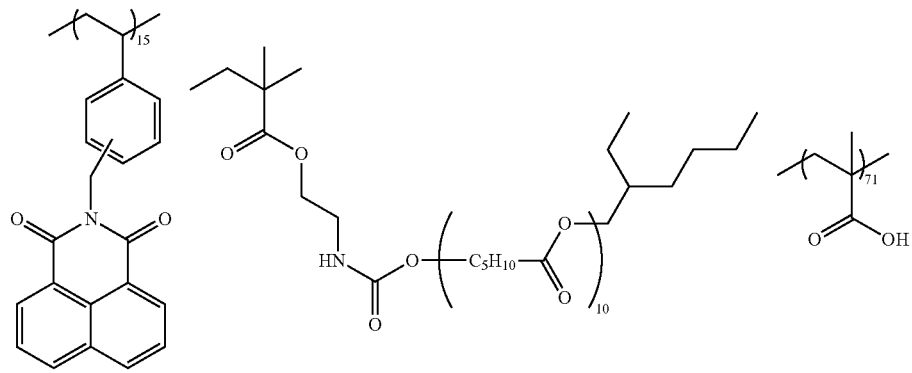

Dipersion Resin 11: the following structure (Mw: 9200)

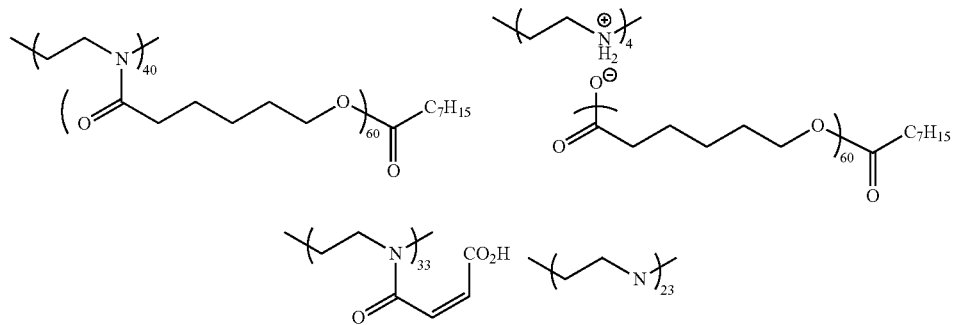

Dipersion Resin 12: the following structure (Mw: 20000)

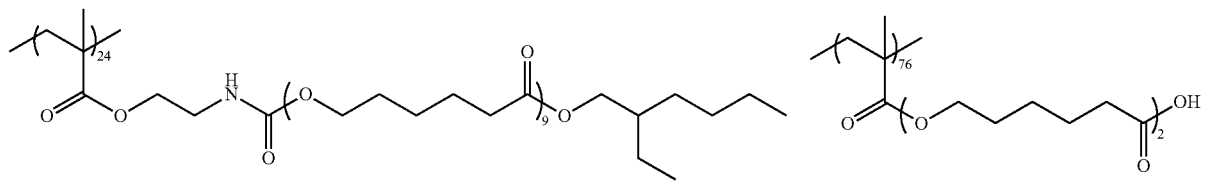

Colorant Derivative 1: the following structure

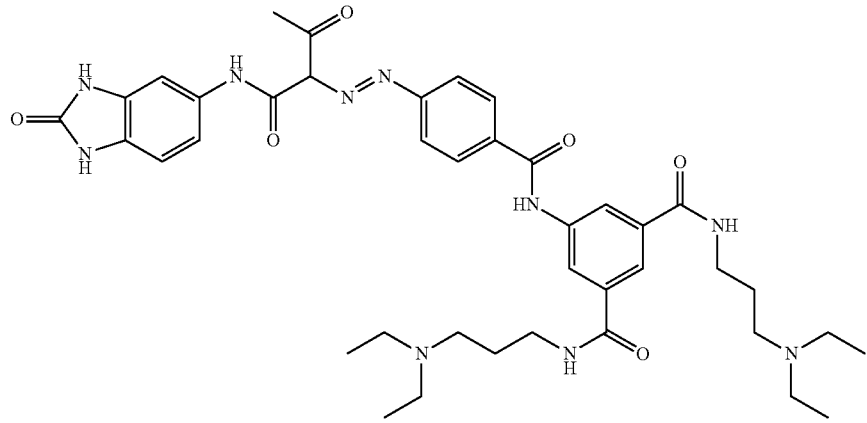

[Preparation of Coloring Composition]

Components shown in the table below were mixed with each other at a ratio shown in the table below to obtain a coloring composition. The table below shows the amounts (unit: part(s) by mass) of the corresponding components.

[Absorbance and Spectral Characteristics]

Specifically, the coloring composition was applied to a glass substrate using a spin coating method such that the thickness after post-baking was 3.0 μm, was dried using a hot plate at 100° C. for 120 seconds, and then was further

TABLE 18

|  | Example 101 | Example 102 | Example 103 | Example 104 | Example 105 | Example 106 |
|---|---|---|---|---|---|---|
| Pigment Dispersion 4-1 | 40.97 | | | | | |
| Pigment Dispersion 4-2 | | 40.97 | | | | |
| Pigment Dispersion 4-3 | | | 40.97 | | | |
| Pigment Dispersion 4-4 | 33.61 | | | | | |
| Pigment Dispersion 4-5 | | 33.61 | | | | |
| Pigment Dispersion 4-6 | | | 33.61 | | | |
| Pigment Dispersion 4-7 | | | | 95.04 | | |
| Pigment Dispersion 4-8 | | | | | 14.56 | |
| Pigment Dispersion 4-9 | | | | | | 14.56 |
| Pigment Dispersion 2-1 | | | | | 13.31 | 13.31 |
| Pigment Dispersion 2-2 | | | | | 17.47 | 17.47 |
| Pigment Dispersion 2-3 | 4.97 | 4.97 | 4.97 | | 5.4 | 5.4 |
| Pigment Dispersion 2-4 | | | | | 4.05 | 4.05 |
| Polymerizable Compound 1 | 4.14 | 4.14 | 4.14 | 1.84 | 5.32 | 5.32 |
| Alkali-Soluble Resin 1 | 0.19 | 0.19 | 0.19 | 1.02 | 2.81 | 2.81 |
| Photopolymerization Initiator 1 | | 1.4 | 1.4 | 0.883 | | 1.803 |
| Photopolymerization Initiator 3 | 1.4 | | | | 1.803 | |
| Surfactant 1 | 0.04 | 0.04 | 0.04 | 0.04 | 0.04 | 0.04 |
| Substrate Adhesive 1 | 0.6 | 0.6 | 0.6 | | 0.6 | 0.6 |
| Polymerization Inhibitor 1 | 0.001 | 0.001 | 0.001 | 0.001 | 0.001 | 0.001 |
| Organic Solvent 1 | 14.08 | 14.08 | 14.08 | 1.18 | 34.64 | 34.64 |

In the table, an abbreviation of each component is as follows.

The pigment dispersions 2-1 to 2-4, the polymerizable compound 1, the alkali-soluble resin 1, the photopolymerization initiator 1, the surfactant 1, the polymerization inhibitor 1, the substrate adhesive 1, and the organic solvent 1 are the same as the components described in Tables 13 and 14.

Photopolymerization Initiator 3: the following structure

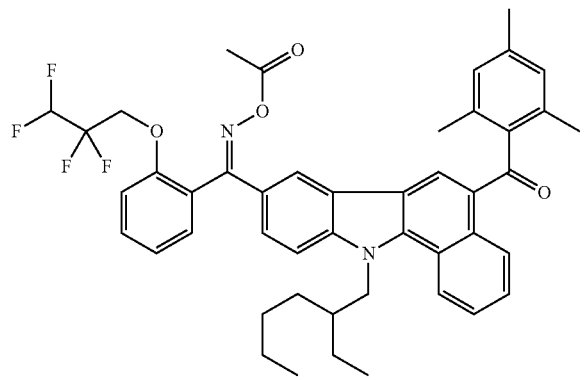 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

heated (post-baked) using a hot plate at 200° C. for 300 seconds.

Regarding the substrate including the colored layer, the light transmittance in a wavelength range of 300 to 1300 nm, the minimum value A of the absorbance in a wavelength range of 400 to 830 nm, and the maximum value B of the absorbance in a wavelength range of 1000 to 1300 nm were measured using an ultraviolet-visible-near infrared spectrophotometer U-4100 (manufactured by Hitachi High-Technologies Corporation; ref. glass substrate).

[Preparation of Color Filter]

Color filters were prepared using the same method as in Test Example 1, except that each of the coloring compositions was applied to a silicon wafer using a coater such that the thickness of a dried film was 3.0 μm, and was heated (pre-baked) using a hot plate at 100° C. for 120 seconds.

<Evaluation>

Using the same method as in Test Example 1, the heat resistance and the spectral identification were evaluated.

TABLE 19

|  | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 101 | 3 | 3 | 2.9% | 92% | 1.54 | 0.04 | 38.5 |
| Example 102 | 3 | 3 | 2.9% | 92% | 1.54 | 0.04 | 38.5 |
| Example 103 | 3 | 3 | 2.9% | 92% | 1.54 | 0.04 | 38.5 |
| Example 104 | 3 | 3 | 4.1% | 91% | 1.39 | 0.04 | 34.8 |

TABLE 19-continued

| | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 105 | 3 | 3 | 1.7% | 81% | 1.77 | 0.09 | 19.7 |
| Example 106 | 3 | 3 | 1.7% | 81% | 1.77 | 0.09 | 19.7 |

In all the Examples in which the coloring composition according to the present invention was used, in a state where noise generated from visible light was small, the transmission of infrared light having an emission wavelength of 940 nm was allowed, and the spectral identification was satisfactory.

Test Example 3

[Preparation of Pigment Dispersion 5-1]

9.2 parts by mass of oxotitanyl phthalocyanine (TiOPc), 3.2 parts by mass of C.I. Pigment Blue 15:6, and 5.6 parts by mass of the dispersion resin 2, and 82.0 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm such that an average particle size of the TiOPc pigment was 100 nm or less. As a result a pigment dispersion 5-1 was prepared. The volume average particle size of a pigment in the pigment dispersion was measured using MICROTRAC UPA 150 (manufactured by Nikkiso Co., Ltd.).

[Preparation of Coloring Composition]

Components shown in the table below were mixed with each other at a ratio shown in the table below to prepare a coloring composition. The table below shows the amounts (unit: part(s) by mass) of the corresponding components.

Materials shown in the table are as follows.

Pigment Dispersion 5-1: the above-described pigment dispersion

Pigment Dispersions 2-1 and 2-2, Polymerizable Compound 1 and 2, Alkali-Soluble Resin 1, Photopolymerization Initiator 3, Substrate Adhesive 1, Surfactant 1, Polymerization Inhibitor 1, Organic Solvent 1: the same as materials used in Test Examples 1 and 2

Polymerizable Compound 3: ARONIX M-315 (isocyanuric acid ethylene oxide-modified diacrylate and isocyanuric acid ethylene oxide-modified triacrylate; including 3 to 13 mass % of diacrylate), a mixture of the following compounds

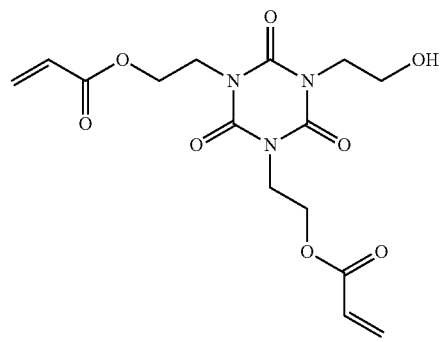

TABLE 20

| | Example 201 | Example 202 | Example 203 | Example 204 | Example 205 | Example 206 | Example 207 | Example 208 | Example 209 | Example 210 | Example 211 |
|---|---|---|---|---|---|---|---|---|---|---|---|
| Pigment Dispersion 5-1 | 48.24 | 48.24 | 48.24 | 48.24 | 48.24 | 48.24 | 48.24 | 48.24 | 48.24 | 48.24 | 48.24 |
| Pigment Dispersion 2-1 | 17.2 | 17.2 | 17.2 | 17.2 | 17.2 | 17.2 | 17.2 | 17.2 | 17.2 | 17.2 | 17.2 |
| Pigment Dispersion 2-3 | 5.79 | 5.79 | 5.79 | 5.79 | 5.79 | 5.79 | 5.79 | 5.79 | 5.79 | 5.79 | 5.79 |
| Polymerizable Compound 1 | | | 3.45 | 3.45 | 3.45 | 2.45 | 2.45 | 3.45 | 2.45 | | |
| Polymerizable Compound 2 | 3.45 | 3.45 | | | | 1.00 | 1.00 | | 1.00 | | |
| Polymerizable Compound 3 | | | | | | | | | | 3.45 | |
| Polymerizable Compound 4 | | | | | | | | | | | 3.45 |
| Alkali-Soluble Resin 1 | 0.91 | 0.91 | 0.91 | 0.91 | 0.51 | 0.51 | 0.51 | 0.51 | 0.51 | 0.51 | 0.51 |
| Photopolymerization Initiator 3 | | | | 1.177 | 1.177 | 1.177 | | | 0.677 | | |
| Photopolymerization Initiator 4 | 1.177 | | | | | | | 0.677 | | | 0.677 |
| Photopolymerization Initiator 5 | | 1.177 | | | | | 0.677 | | | 0.677 | |
| Photopolymerization Initiator 6 | | | 1.177 | | | | 0.500 | | | | |
| Photopolymerization Initiator 7 | | | | | | | | 0.500 | | | |
| Photopolymerization Initiator 8 | | | | | | | | | 0.500 | 0.500 | 0.500 |
| Substrate Adhesive 1 | 1 | 1 | 1 | 1 | 1 | 1 | 1 | 1 | 1 | 1 | 1 |
| Epoxy Compound 1 | 0.6 | 0.6 | | | 1 | 1 | 1 | 0.5 | 0.5 | 0.5 | 0.5 |
| Epoxy Compound 2 | | | 0.6 | | | | | 0.5 | | | |
| Epoxy Compound 3 | | | | 0.6 | | | | | 0.5 | 0.5 | 0.5 |
| Surfactant 1 | 0.04 | | | 0.04 | 0.04 | 0.04 | 0.04 | 0.04 | | | |
| Surfactant 2 | | 0.04 | 0.04 | | | | | | 0.04 | 0.04 | 0.04 |
| Polymerization Inhibitor 1 | 0.001 | 0.001 | 0.001 | 0.001 | 0.001 | 0.001 | 0.001 | 0.001 | 0.001 | 0.001 | 0.001 |
| Organic Solvent 1 | 21.57 | 21.57 | 21.57 | 21.57 | 21.57 | 21.57 | 21.57 | 21.57 | 21.57 | 21.57 | 21.57 |

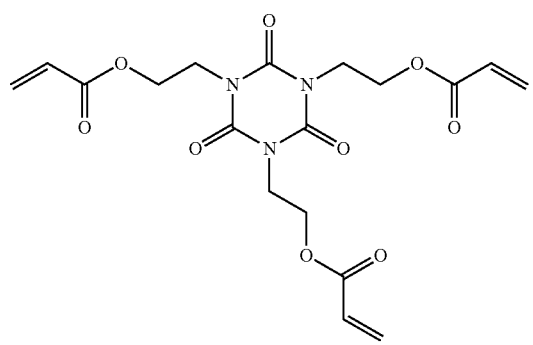

Polymerizable Compound 4: A-TMMT (pentaerythritol tetraacrylate, manufactured by Shin-Nakamura Chemical Co., Ltd.)

Photopolymerization Initiator 4: ADEKA ARKLS NCI-831 (manufactured by Adeka Corporation)

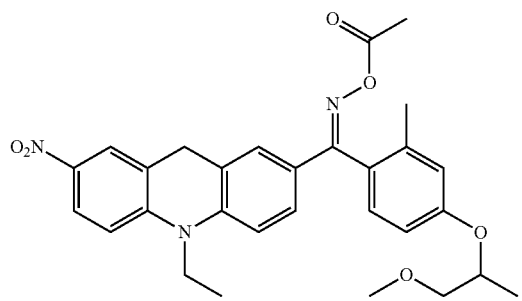 [SMILES: CCN1c2ccc(/C(=N/OC(C)=O)c3ccc(OC(C)COC)cc3C)cc2Cc2cc([N+](=O)[O-])ccc21]

Photopolymerization initiator 5: the following structure

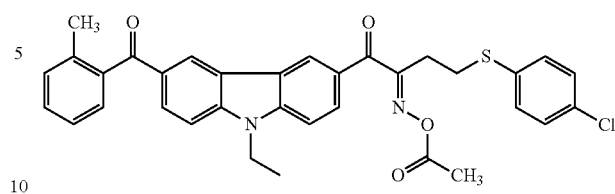

Photopolymerization Initiator 6: IRGACURE-369 (manufactured by BASF SE)

Photopolymerization Initiator 7: IRGACURE-2959 (manufactured by BASF SE)

Photopolymerization Initiator 8: IRGACURE-819 (manufactured by BASF SE)

Surfactant 2: KF6001 (manufactured by Shin-Etsu Chemical Co., Ltd.)

Epoxy Group Compound 1: EPICLON N-695 (manufactured by DIC Corporation)

Epoxy Group Compound 2: jER1031S (manufactured by Mitsubishi Chemical Corporation)

Epoxy Group Compound 3: EHPE 3150 (manufactured by Daicel Corporation)

Epoxy Group Compound 3: EHPE 3150 (manufactured by Daicel Corporation)

[Evaluation of Absorbance and Spectral Characteristics]

Using each of the coloring compositions, a cured film was prepared using the same method as in Test Example 1 such that the thickness after post-baking was 2.0 μm, and the spectral characteristics of the obtained cured film were evaluated.

[Preparation of Color Filter and Evaluation of Heat Resistance]

A color filter was prepared using the same method as in Test Example 1, except that each of the coloring compositions was applied such that the thickness after drying was 2.0 μm, and the heat resistance of the prepared color filter was evaluated using the same method as in Test Example 1.

TABLE 21

| | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 201 | 3 | 3 | 3.7% | 87% | 1.43 | 0.06 | 23.6 |
| Example 202 | 3 | 3 | 3.7% | 87% | 1.43 | 0.06 | 23.6 |
| Example 203 | 3 | 3 | 3.7% | 87% | 1.43 | 0.06 | 23.6 |
| Example 204 | 3 | 3 | 3.7% | 87% | 1.43 | 0.06 | 23.6 |
| Example 205 | 3 | 3 | 3.7% | 87% | 1.43 | 0.06 | 23.6 |
| Example 206 | 3 | 3 | 3.7% | 87% | 1.43 | 0.06 | 23.6 |
| Example 207 | 3 | 3 | 3.7% | 87% | 1.43 | 0.06 | 23.6 |
| Example 208 | 3 | 3 | 3.7% | 87% | 1.43 | 0.06 | 23.6 |
| Example 209 | 3 | 3 | 3.7% | 87% | 1.43 | 0.06 | 23.6 |
| Example 210 | 3 | 3 | 3.7% | 87% | 1.43 | 0.06 | 23.6 |
| Example 211 | 3 | 3 | 3.7% | 87% | 1.43 | 0.06 | 23.6 |

In all the Examples in which the coloring composition according to the present invention was used, in a state where noise generated from visible light was small, the transmission of infrared light having an emission wavelength of 940 nm was allowed, and the spectral identification was satisfactory.

Test Example 4

[Preparation of Pigment Dispersion 6-1]

9.2 parts by mass of vanadium phthalocyanine (VOPc), 3.2 parts by mass of C.I. Pigment Blue 15:6, and 5.6 parts by mass of the dispersion resin 2, and 82.0 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm such that an average particle size of the VOPc pigment was 100 nm or less. As a result a pigment dispersion 6-1 was prepared. The volume average particle size of a pigment in the pigment dispersion was measured using MICROTRAC UPA 150 (manufactured by Nikkiso Co., Ltd.).

[Preparation of Pigment Dispersion 6-2]

13.5 parts by mass of the following cyanine compound 1-13, 4 parts by mass of the dispersion resin 1 (Disperbyk-111 (manufactured by BYK Chemie)), and 82.5 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. As a result, a pigment dispersion 6-2 was prepared.

[Preparation of Pigment Dispersion 6-3]

13.5 parts by mass of the following cyanine compound 1-14, 4 parts by mass of the dispersion resin 1 (Disperbyk-111 (manufactured by BYK Chemie)), and 82.5 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. As a result, a pigment dispersion 6-3 was prepared.

[Preparation of Pigment Dispersion 6-4]

13.5 parts by mass of the following cyanine compound 1-15, 4 parts by mass of the dispersion resin 1 (Disperbyk-111 (manufactured by BYK Chemie)), and 82.5 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. As a result, a pigment dispersion 6-4 was prepared.

Cyanine Compounds 1-13 to 1-15: the following structures

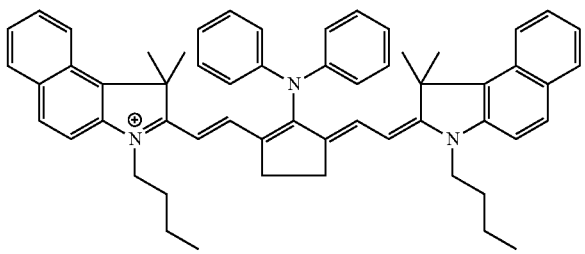

(I-13)

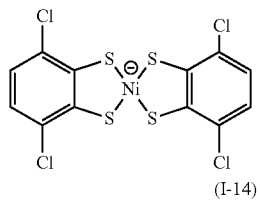

(I-14)

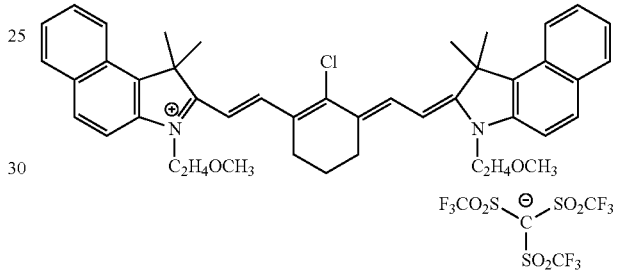

(I-15)

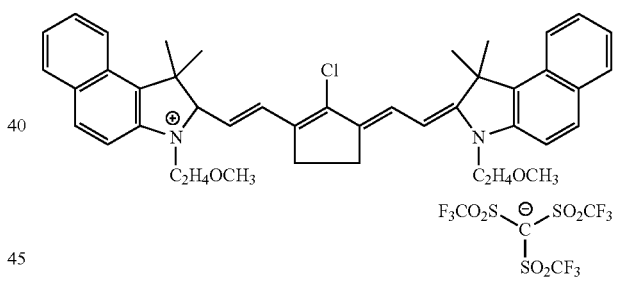

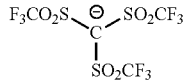

[Preparation of Coloring Composition]

Components shown in the table below were mixed with each other at a ratio shown in the table below to prepare a coloring composition. The table below shows the amounts (unit: part(s) by mass) of the corresponding components.

TABLE 22

| | Example 301 | Example 302 | Example 303 | Example 304 | Example 305 | Example 306 | Example 307 | Example 308 | Example 309 | Example 310 | Example 311 | Example 312 |
|---|---|---|---|---|---|---|---|---|---|---|---|---|
| Pigment Dispersion 6-1 | 48.24 | | | | | | | | | | | |
| Pigment Dispersion 6-2 | | 27.77 | 27.78 | | | | | | | | | |
| Pigment Dispersion 6-3 | | | | 27.77 | | | | | | | | |
| Pigment Dispersion 6-4 | | | | | 27.78 | | | | | | | |
| Pigment Dispersion 5-1 | | | | | | | | | 40.32 | 34.52 | 35.9 | 39.11 |
| Pigment Dispersion 2-1 | 17.2 | 6.48 | 9.26 | 6.48 | 9.26 | 13.22 | 13.22 | 13.22 | 28.89 | 24.74 | 25.73 | 28.04 |
| Pigment Dispersion 2-2 | | 5.56 | 8.33 | 5.56 | 8.33 | 19.14 | 19.14 | 19.14 | | | | |
| Pigment Dispersion 2-3 | 5.79 | | | | | 5.17 | 5.17 | 5.17 | 7.94 | 6.8 | 7.07 | 7.7 |
| Pigment Dispersion 2-4 | | | | | | 4.36 | 4.36 | 4.36 | | | | |

TABLE 22-continued

| | Example 301 | Example 302 | Example 303 | Example 304 | Example 305 | Example 306 | Example 307 | Example 308 | Example 309 | Example 310 | Example 311 | Example 312 |
|---|---|---|---|---|---|---|---|---|---|---|---|---|
| Pigment Dispersion 2-5 | | 17.74 | | 17.74 | | | | | | | | |
| Pigment Dispersion 2-9 | | | 20.27 | | 20.27 | | | | | | | |
| Cyanine Compound 1-13 | | | | | | 3.91 | | | | | | |
| Cyanine Compound 1-14 | | | | | | | 3.91 | | | | | |
| Cyanine Compound 1-15 | | | | | | | | 3.91 | | | | |
| Polymerization Compound 1 | | | 4.35 | | 4.35 | | 1.48 | | | | | |
| Polymerization Compound 2 | | 4.67 | | 4.67 | | | | | | | | |
| Polymerization Compound 3 | 3.45 | | | | | 1.48 | | | | 7.54 | | |
| Polymerization Compound 4 | | | | | | | | 1.48 | | | | |
| Polymerization Compound 5 | | | | | | | | | 6.74 | | 7.52 | 7.09 |
| Alkali-Soluble Resin 1 | 0.91 | 6.83 | 5.83 | 6.83 | 5.83 | 7.81 | 7.81 | 7.81 | 1.36 | 2.53 | | |
| Alkali-Soluble Resin 2 | | | | | | | | | | | 6.02 | 4.75 |
| Photopolymerization Initiator 3 | | | | | | 0.92 | | | | | | |
| Photopolymerization Initiator 4 | 1.18 | | | | | | | | | 1.47 | | |
| Photopolymerization Initiator 5 | | 2.24 | | 2.24 | | | | | 1.31 | | 1.3 | 1.22 |
| Photopolymerization Initiator 6 | | | 2.09 | | 2.09 | | | | 0.44 | | 0.433 | 0.409 |
| Photopolymerization Initiator 7 | | | | | | | 0.92 | | | | | |
| Photopolymerization Initiator 8 | | | | | | | | 0.92 | | | | |
| Photopolymerization Initiator 9 | | | | | | | | | | 0.49 | | |
| Substrate Adhesive 1 | 1 | 0.73 | 0.73 | 0.73 | 0.73 | | | | | | | |
| Epoxy Compound 1 | 0.6 | | | | | | | | | | | |
| Surfactant 1 | 0.04 | 0.04 | | 0.04 | | 0.04 | 0.04 | 0.04 | | | | |
| Surfactant 2 | | | 0.04 | | 0.04 | | | | 0.04 | 0.04 | 0.04 | 0.04 |
| Polymerization Inhibitor 1 | 0.001 | 0.001 | 0.001 | 0.001 | 0.001 | 0.001 | 0.001 | 0.001 | 0.001 | 0.001 | 0.001 | 0.001 |
| Organic Solvent 1 | 21.59 | 27.94 | 21.32 | 27.94 | 21.32 | | | | 12.96 | 21.87 | | 11.64 |
| Organic Solvent 2 | | | | | | 43.95 | 43.95 | 43.95 | | | 16.00 | |

Materials shown in the table are as follows.

Pigment Dispersions 5-1, 2-1 to 2-5, and 2-9, Polymerizable Compounds 1 to 4, Alkali-Soluble Resin 1, Photopolymerization Initiators 3 to 8, Substrate Adhesive 1, Epoxy Compound 1, Surfactants 1 and 2, Polymerization Inhibitor 1, Organic Solvents 1 and 2: the same as materials used in Test Examples 1 and 2

Pigment Dispersions 6-1 to 6-4: the above-described pigment dispersions

Cyanine Compounds 1-13 to 1-14: the above-described compounds

Polymerizable Compound 5: ARONIX M-313 (isocyanuric acid ethylene oxide-modified diacrylate and isocyanuric acid ethylene oxide-modified triacrylate, manufactured by Toagosei Co., Ltd.)

Photopolymerization Initiator 9: IRGACURE-379 (manufactured by BASF SE)

Alkali-Soluble Resin 2: CYCLOMER P(ACA)230AA (manufactured by Daicel Corporation)

[Evaluation of Absorbance and Spectral Characteristics]

Test Example 4-1-1

Using each of the coloring compositions according to Examples 301 to 309, a cured film was prepared using the same method as in Test Example 1 such that the thickness after post-baking was 2.0 and the spectral characteristics of the obtained cured film were evaluated.

Test Example 4-1-2

Using each of the coloring compositions according to Examples 310 to 312, a cured film was prepared using the same method as in Test Example 1 such that the thickness after post-baking was 2.4 μm, and the spectral characteristics of the obtained cured film were evaluated.

[Preparation of Color Filter and Evaluation of Heat Resistance]

Test Example 4-2-1

A color filter was prepared using the same method as in Test Example 1, except that each of the coloring compositions according to Examples 301 to 309 was applied such that the thickness after drying was 2.0 μm, and the heat resistance of the prepared color filter was evaluated using the same method as in Test Example 1.

Test Example 4-2-1

A color filter was prepared using the same method as in Test Example 1, except that each of the coloring compositions according to Examples 310 to 312 was applied such that the thickness after drying was 2.4 μm, and the heat resistance of the prepared color filter was evaluated using the same method as in Test Example 1.

TABLE 23

| | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 301 | 3 | 3 | 3.7% | 87% | 1.43 | 0.06 | 23.8 |
| Example 302 | 3 | 3 | 4.5% | 83% | 1.35 | 0.08 | 16.9 |

TABLE 23-continued

| | Spectral Identification | Heat Resistance | Maximum Transmittance 400 to 830 nm | Minimum Transmittance 1000 to 1300 nm | Minimum Absorbance A: 400 to 830 nm | Maximum Absorbance B: 1000 to 1300 nm | Absorbance Ratio A/B |
|---|---|---|---|---|---|---|---|
| Example 303 | 3 | 3 | 3.4% | 81% | 1.47 | 0.09 | 16.3 |
| Example 304 | 3 | 3 | 8.5% | 84% | 1.07 | 0.08 | 13.4 |
| Example 305 | 3 | 3 | 5.0% | 85% | 1.3 | 0.07 | 18.6 |
| Example 306 | 3 | 2 | 3.7% | 88% | 1.43 | 0.06 | 23.8 |
| Example 307 | 3 | 2 | 7.8% | 89% | 1.11 | 0.05 | 22.2 |
| Example 308 | 3 | 2 | 5.6% | 91% | 1.25 | 0.04 | 31.3 |
| Example 309 | 3 | 3 | 1.9% | 87% | 1.72 | 0.06 | 28.7 |
| Example 310 | 3 | 3 | 1.7% | 86% | 1.77 | 0.07 | 25.3 |
| Example 311 | 3 | 3 | 1.7% | 86% | 1.77 | 0.07 | 25.3 |
| Example 312 | 3 | 3 | 0.9% | 85% | 2.04 | 0.07 | 29.1 |

In all the Examples in which the coloring composition according to the present invention was used, in a state where noise generated from visible light was small, the transmission of infrared light having an emission wavelength of 940 nm was allowed, and the spectral identification was satisfactory.

EXPLANATION OF REFERENCES

1: lens optical system
10: solid image pickup element
20: signal processing unit
30: signal switching unit
40: control unit
50: signal storage unit
60: light emission control unit
70: infrared LED
80, 81: image output unit
100: infrared sensor
110: solid image pickup element
111: infrared absorbing filter
112: color filter
113: infrared transmitting filter
114: region
115: microlens
116: planarizing layer
hv: incidence ray

What is claimed is:
1. A coloring composition comprising:
a coloring material that shields light in a visible range,
wherein the coloring material that shields light in the visible range includes two or more chromatic colorants, and
a combination of the two or more chromatic colorants forms black,
wherein the combination of the two or more chromatic colorants is any of (1) a yellow colorant, a blue colorant, a violet colorant, and a red colorant, (2) a yellow colorant, a blue colorant, and a red colorant, (3) a yellow colorant, a violet colorant, and a red colorant, (4) a yellow colorant and a violet colorant, (5) a green colorant, a blue colorant, a violet colorant, and a red colorant, (6) a violet colorant and an orange colorant, (7) a green colorant, a violet colorant, and a red colorant;
an infrared absorber,
wherein the infrared absorber comprises a pyrrolopyrrole compound;
an alkali-soluble resin having an acid value of 30 to 500mgKOH/g;
a polymerizable compound which contains a (meth)acrylate compound having 3 to 15 functional groups; and
a photopolymerization initiator having photosensitivity to light in a range from the ultraviolet range to the visible range; and
a content of the infrared absorber is 10 to 200 parts by mass with respect to 100 parts by mass of the coloring material that shields light in the visible range,
a total content of the infrared absorber and the coloring material that shields light in the visible range is 30 to 70 mass % with respect to a total solid content of the coloring composition, and
a content of the alkali-soluble resin is 3 to 20 mass % with respect to a total solid content of the coloring composition.

2. The coloring composition according to claim 1, wherein the coloring material that shields light in the visible range includes an organic black colorant.

3. The coloring composition according to claim 2, wherein the organic black colorant is at least one selected from the group consisting of a perylene compound and a bisbenzofuranone compound.

4. The coloring composition according to claim 1, wherein the pyrrolopyrrole compound is a pigment.

5. The coloring composition according to claim 1, wherein the pyrrolopyrrole compound is represented by the following Formula (1),

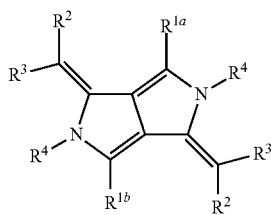

(1)

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$ or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

6. The coloring composition according to claim 1 which is used for manufacturing a color filter.

7. A film formed by curing the coloring composition according to claim 1.

8. A color filter comprising:
the film according to claim 7.

9. A solid image pickup element comprising:
the color filter according to claim 8.

10. An infrared sensor comprising:
the color filter according to claim 8.

11. A pattern forming method comprising:
forming a coloring composition layer on a support using the coloring composition according to claim 1;
exposing the coloring composition layer in a pattern shape; and
forming a colored pattern by removing a non-exposed portion by development.

12. A method for manufacturing a color filter comprising:
the pattern forming method according to claim 11.

13. The coloring composition according to claim 1,
wherein in the combination of two or more chromatic colorants of (1), the mass ratio thereof is the yellow colorant:the blue colorant:the violet colorant:the red colorant=0.1 to 0.4:0.1 to 0.6:0.01 to 0.3:0.1 to 0.6,
in the combination of two or more chromatic colorants of (2), the mass ratio thereof is the yellow colorant:the blue colorant:the red colorant=0.1 to 0.4:0.1 to 0.6:0.2 to 0.7,
in the combination of two or more chromatic colorants of (3), the mass ratio thereof is the yellow colorant:the violet colorant:the red colorant=0.1 to 0.6:0.1 to 0.6:0.1 to 0.6,
in the combination of two or more chromatic colorants of (4), the mass ratio thereof is the yellow colorant:the violet colorant=0.2 to 0.8:0.2 to 0.8,
in the combination of two or more chromatic colorants of (5), the mass ratio thereof is the green colorant:the blue colorant: the violet colorant:the red colorant=0.1 to 0.4:0.1 to 0.4:0.1 to 0.4:0.1 to 0.4,
in the combination of two or more chromatic colorants of (6), the mass ratio thereof is the violet colorant:the orange colorant=0.2 to 0.6:0.4 to 0.8,
in the combination of two or more chromatic colorants of (7), the mass ratio thereof is the green colorant:the violet colorant:the red colorant=0.1 to 0.5:0.2 to 0.7:0.1 to 0.4.

14. The coloring composition according to claim 1,
wherein the combination of the two or more chromatic colorants is any of (1) a yellow colorant, a blue colorant, a violet colorant, and a red colorant, (3) a yellow colorant, a violet colorant, and a red colorant, (5) a green colorant, a blue colorant, a violet colorant, and a red colorant, (6) a violet colorant and an orange colorant, and (7) a green colorant, a violet colorant, and a red colorant.

15. The coloring composition according to claim 1,
wherein the photopolymerization initiator contains an oxime compound.

16. The coloring composition according to claim 1,
wherein the acid value of the alkali-soluble resin is 30 to 150mgKOH/g.

17. The coloring composition according to claim 1,
wherein the coloring composition contains two or more kinds photopolymerization initiator.

18. The coloring composition according to claim 1,
wherein the photopolymerization initiator contains an aminoacetophenone compound and an oxime compound.

19. The coloring composition according to claim 1,
wherein the infrared absorber is a pigment having an average particle size of 20 nm or more and 100 nm or less.

20. A coloring composition comprising:
a coloring material that shields light in a visible range,
wherein the coloring material that shields light in the visible range includes two or more chromatic colorants, and
a combination of the two or more chromatic colorants forms black,
wherein the combination of the two or more chromatic colorants is any of (1) a yellow colorant, a blue colorant, a violet colorant, and a red colorant, (3) a yellow colorant, a violet colorant, and a red colorant, (4) a yellow colorant and a violet colorant, (5) a green colorant, a blue colorant, a violet colorant, and a red colorant, (6) a violet colorant and an orange colorant, and (7) a green colorant, a violet colorant, and a red colorant;
an infrared absorber;
an alkali-soluble resin having an acid value of 30 to 500mgKOH/g;
a polymerizable compound which contains a (meth)acrylate compound having 3 to 15 functional groups; and
a photopolymerization initiator having photosensitivity to light in a range from the ultraviolet range to the visible range; and
a content of the infrared absorber is 10 to 200 parts by mass with respect to 100 parts by mass of the coloring material that shields light in the visible range,
a total content of the infrared absorber and the coloring material that shields light in the visible range is 30 to 70 mass % with respect to a total solid content of the coloring composition, and
a content of the alkali-soluble resin is 3 to 20 mass % with respect to a total solid content of the coloring composition.

21. The coloring composition according to claim 20,
wherein the infrared absorber is at least one selected from the group consisting of a pyrrolopyrrole compound, a phthalocyanine compound, a naphthalocyanine compound, and a polymethine compound.

22. The coloring composition according to claim 20,
wherein in the combination of two or more chromatic colorants of (1), the mass ratio thereof is the yellow colorant:the blue colorant:the violet colorant:the red colorant=0.1 to 0.4:0.1 to 0.6:0.01 to 0.3:0.1 to 0.6,
in the combination of two or more chromatic colorants of (3), the mass ratio thereof is the yellow colorant:the violet colorant:the red colorant=0.1 to 0.6:0.1 to 0.6:0.1 to 0.6,
in the combination of two or more chromatic colorants of (4), the mass ratio thereof is the yellow colorant:the violet colorant=0.2 to 0.8:0.2 to 0.8,
in the combination of two or more chromatic colorants of (5), the mass ratio thereof is the green colorant:the blue colorant:the violet colorant:the red colorant=0.1 to 0.4: 0.1 to 0.4:0.1 to 0.4:0.1 to 0.4,
in the combination of two or more chromatic colorants of (6), the mass ratio thereof is the violet colorant:the orange colorant=0.2 to 0.6:0.4 to 0.8,
in the combination of two or more chromatic colorants of (7), the mass ratio thereof is the green colorant:the violet colorant:the red colorant=0.1 to 0.5:0.2 to 0.7:0.1 to 0.4.

\* \* \* \* \*